(12) United States Patent
Yan et al.

(10) Patent No.: US 7,405,034 B2
(45) Date of Patent: Jul. 29, 2008

(54) POLYMERIC STRUCTURES, PARTICULARLY MICROSTRUCTURES, AND METHODS FOR MAKING SAME

(75) Inventors: Mingdi Yan, Lake Oswego, OR (US); Michele A. Bartlett, Buxton, OR (US)

(73) Assignee: State of Oregon acting by and through the State Board of Higher Education on behalf of Portland State University, Portland, OR (US)

( * ) Notice: Subject to any disclaimer, the term of this patent is extended or adjusted under 35 U.S.C. 154(b) by 0 days.

(21) Appl. No.: 10/769,423

(22) Filed: Jan. 30, 2004

(65) Prior Publication Data

US 2004/0242023 A1 Dec. 2, 2004

Related U.S. Application Data

(63) Continuation-in-part of application No. PCT/US02/24675, filed on Aug. 1, 2002.

(60) Provisional application No. 60/309,387, filed on Aug. 1, 2001, now abandoned.

(51) Int. Cl.
*G03F 7/00* (2006.01)
*B05D 3/00* (2006.01)

(52) U.S. Cl. .................. 430/312; 430/270.1; 430/311; 430/313; 427/331; 427/532; 427/558

(58) Field of Classification Search ............ 430/270.1, 430/311, 312, 313; 427/331, 532, 558
See application file for complete search history.

(56) References Cited

U.S. PATENT DOCUMENTS

| | | | |
|---|---|---|---|
| 4,973,493 A | 11/1990 | Guire | |
| 4,979,959 A | 12/1990 | Guire | |
| 5,002,582 A | 3/1991 | Guire et al. | |
| 5,217,492 A | 6/1993 | Guire et al. | |

(Continued)

FOREIGN PATENT DOCUMENTS

WO WO 98/22541 5/1998

OTHER PUBLICATIONS

Yan et al., "Photochemical and Thermal Reactions of $C_{60}$ with N-Succinimidyl 4-Azido-2,3,5,6-tetrafluorobenzoate: A New Method for Functionalization of $C_{60}$," J. Org. Chem., 59(20):5951-5954 (1994).

(Continued)

*Primary Examiner*—Amanda C. Walke
(74) *Attorney, Agent, or Firm*—Klarquist Sparkman LLP

(57) ABSTRACT

Methods of adhering polymeric materials to a substrate, either directly or through linker molecules, are disclosed. Structures, for example, microstructures, including microwells and arrays of microwells, may be readily formed using the methods. In some embodiments, microstructures formed completely from polymeric materials are provided, making it possible to tailor the chemical and physical properties of the microstructures. For example, microwells having a bottom comprising a polar polymeric material and well sides/top comprising a non-polar polymeric material are provided. Biochemical reagents may be easily delivered to such "smart wells" because the intrinsic attraction of the well bottom for the reagents and the intrinsic repulsion between the well sides/top combine to direct the reagents to the wells.

48 Claims, 36 Drawing Sheets

U.S. PATENT DOCUMENTS

| | | | |
|---|---|---|---|
| 5,258,041 | A | 11/1993 | Guire et al. |
| 5,263,992 | A | 11/1993 | Guire |
| 5,342,737 | A | 8/1994 | Georger, Jr. et al. |
| 5,512,329 | A | 4/1996 | Guire et al. |
| 5,580,697 | A | 12/1996 | Keana et al. |
| 5,582,955 | A * | 12/1996 | Keana et al. ............... 430/296 |
| 5,587,273 | A | 12/1996 | Yan et al. |
| 5,741,551 | A | 4/1998 | Guire et al. |
| 5,830,539 | A | 11/1998 | Yan et al. |
| 6,022,597 | A * | 2/2000 | Yan et al. ................. 427/558 |
| 6,197,881 | B1 | 3/2001 | Cosnier |
| 6,200,737 | B1 | 3/2001 | Walt et al. |
| 6,245,249 | B1 | 6/2001 | Yamada et al. |
| 6,251,343 | B1 | 6/2001 | Dubrow et al. |
| 6,251,567 | B1 | 6/2001 | Reinecke et al. |
| 6,699,527 | B1 * | 3/2004 | Moloney et al. ......... 427/407.1 |
| 2003/0092034 | A1 * | 5/2003 | Cooper et al. ................. 435/6 |
| 2004/0191703 | A1 * | 9/2004 | Soper et al. ............... 430/324 |

OTHER PUBLICATIONS

Yan et al., "UV Induced Attachment of Ultrathin Polymer Films on Silicon Wafers," 8th IEEE Inter. Symp. Adv. Packaging Mater., pp. 311-316 (2002).

Baker et al., "Dendrimer-Mediated Adhesion Between Vapor-Deposited Au and Glass or Si Wafers," Anal. Chem., 71(19):4403-4406 (1999).

Bartlett et al., "Fabrication of Polymer Thin FIlms and Arrays with Spatial and Topopgraphical Controls," Adv. Mater., 13(19):1449-1451 (2001).

Bruening et al., "Synthesis and Characterization of Surface-Grafted, Hyperbranched Polymer Films Containing Fluorescent, Hydrophobic, Ion-Binding, Biocompatible, and Electroactive Groups," Langmuir, 13(4):770-778 (1997).

Clark et al., "Electrochemical Analysis in Picoliter Microvials," Anal. Chem. 69(2):259-263 (1997).

Elender et al., "Functionalisation of Si/SiO$_2$ and Glass Surfaces with Ultrathin Dextran Films and Deposition of Lipid Bilayers," Biosensors & Bioelectronics, 6(7):565-577 (1996).

Inglis et al., "A Simple Method for Biocompatible Polymer Based Spatially Controlled Adsorption of Blood Plasma Proteins to a Surface," Langmuir, 17(23):7402-7405 (2001).

Jackman et al., "Fabricating Large Arrays of Microwells with Arbitrary Dimensions and Filling Them Using Discontinuous Dewetting," Anal. Chem., 70(11):2280-2287 (1998).

Keana et al., "New Reagents for Photoaffinity Labeling: Synthesis and Photolysis of Functionalizaed Perfluorophenyl Azides," J. Org. Chem., 55(11):3640-3647 (1990).

Lahann et al., "Reactive Polymer Coatings: A First Step Toward Surface Engineering of Microfluidic Devices," Anal. Chem., 75(9):2117-2122 (2003).

Ostuni et al., "Selective Deposition of Proteins and Cells in Arrays of Microwells," Langmuir, 17(9):2828-2834 (2001).

Pantano et al., "Ordered Nanowell Arrays," Chem. Mater., 8(12):2832-2835 (1996).

Prucker et al., "Photochemical Attachment of Polymer Films to Solid Surfaces via Monolayers of Benzophenone Derivatives," J. Am. Chem. Soc., 121(38):8766-8770 (1999).

Smith, "Aryl and Heteroaryl Azides and Nitrenes," In Azides and Nitrenes Reactivity and Utility, ed. Scriven, E.F.V., Academic Press Inc., New York, pp. 95-204 (1984).

Yan et al., "Micro/Nanowell Arrays Fabricated from Covalently Immobilized Polymer Thin Films on a Flat Substrate," Nano Lett., 2(4):275-278 (2002).

Yan, "Photoactive Reagents for the Covalent Immobilization of Polymer Thin Films," Polymer News, 27(1):6-12 (2002).

S. L. Clark et al., "Ionic Effects of Sodium Chloride on the Templated Deposition of Polyelectrolytes Using Layer-by-Layer Ionic Assembly," Macromolecules, 30, 7237-44 (1997) 8 pages.

H. Go et al., "Effects of Mobile Phase Composition and Temperature on the Selectivity of Poly(N-Isopropylacrylamide)-Bonded Silica Gel in Reversed-Phase Liquid Chromatography," Anal. Chem., 70, 4086-93 (1998) 8 pages.

M. Husemann et al., "Manipulation of Surface Properties by Patterning of Covalently Bound Polymer Brushes," J. Am. Chem. Soc., 122, 1844-45 (2000) 2 pages.

O. Prucker et al., "Photochemical Attachment of Polymer Films to Solid Surfaces via Monolayers of Benzophenone Derivatives," J. Am. Chem. Soc., 121, 8766-70 (1999) 5 pages.

Y. V. Pan et al., "Plasma Polymerized N-Isopropylacryamide: Synthesis and Characterization of a Smart Thermally Responsive Coating," Biomacromolecules, 2, 32-36 (2001) 5 pages.

D. Zhang et al., "Effects of UV Radiation and Plasma Treatment on a Polystyrene Surface Studied by IR-Visible Sum Frequency Generation Spectroscopy," Langmuir, 16, 4528-32 (2000) 5 pages.

Written Opinion, PCT/US02/24675, 4 pp., May 31, 2006.

* cited by examiner

POLYMERIC STRUCTURES, PARTICULARLY MICROSTRUCTURES, AND METHODS FOR MAKING SAME

CROSS REFERENCE TO RELATED APPLICATION

This application is a continuation-in-part of pending international application No. PCT/US02/24675, filed Aug. 1, 2002, which claims the benefit of U.S. provisional application No. 60/309,387, filed Aug. 1, 2001, which is now abandoned. International application No. PCT/US02/24675 and U.S. provisional application No. 60/309,387 incorporated herein by reference.

FIELD

The present disclosure concerns structures, especially microstructures, comprising polymer(s) and embodiments of methods for preparing such structures on a variety of substrates.

BACKGROUND

Micrometer- and nanometer-scale structures (collectively, "microstructures") are useful for making micro-sensors, micro-actuators, micro-instruments, micro-optics, microfluidic devices, and micro-reactors. Previous methods for making such structures have focussed on their production within solid substrates through, for example, the use of photoresists and chemical etching techniques. Since there are a limited number of solid substrates that can be used to produce microstructures, the range of chemical and physical properties exhibited by known structures also is limited.

One approach to altering the chemical and physical properties of the surfaces of microstructures is to apply a thin film of a polymeric material to the surface of a microstructure etched into a substrate. For example, Yan et al. (U.S. Pat. No. 5,830,539) describes applying a polymeric material coating to the interior of a micro-well etched in a silicon wafer.

Another approach is to construct microstructures entirely from polymeric materials. Husemann et al. (J. Am. Chem. Soc., 122: 1844-45, 2000) recently reported the generation of polymer array brushes using a combination of surface-initiated polymerization and photoacid-based chemical transformation of the polymer chains. However, because this technique is based upon a tert-butyl acrylate polymer, the range of chemical and physical properties of the resulting microstructures is limited.

Chip-based microwell arrays have greatly increased the capability to perform analytical and biochemical reactions and assays. These microwell arrays allow a large number of reactions to be carried out simultaneously, at much higher speed and more efficiently than conventional analyses. The small volume of the microwells dramatically reduces the amount of reagents needed, resulting in reduced waste and lower costs. Most of the microwells are silica-based microwells that are fabricated in silicon wafers or glass slides using photolithography and etching. See, for example, Mensinger et al., in *Micro Total Analysis Systems*; van den Berg and Bergveld Eds., Kluwer Academic Publishers, London,; p. 237 (1995); Kricka and Wilding, "Micromechanics and Nanotechnology" in *Handbook of Clinical Automation, Robotics, and Optimization*, Kost and Welsh Eds., John Wiley and Sons: New York, p 45 (1996); and Kovacs et al., "Silicon Micromachining: Sensors to Systems," *Anal. Chem.*, 68: 407A (1996).

Conventional methods for manufacturing microwells are relatively expensive and the necessary facilities are not routinely accessible to most chemists. Furthermore, as the surface-to-volume ratio increases dramatically for the microfabricated wells as compared to conventional reaction tubes, it is important that the devices are chemically compatible with the reactions taking place inside them. However, silicon chip-based devices may not be compatible with biochemical assays or reactions. For example, native silicon is an inhibitor of polymerase chain reaction (PCR) and amplification. Thus, PCR reactions performed in silicon chip-based nanowells show poor reproducibility.

Therefore, recent investigations have focused on polymer-based microwells. For example, microwells have been generated in ordered arrays by etching with a bundle of optical fibers (Pantano and Walt, "Ordered Nanowell Arrays," *Chem. Mater.*, 8: 2832, 1996). Ewing and co-workers fabricated picoliter microvials in PS by an embossing technique using structures formed by a photolithographic patterning technique (Clark, et al., "Electrochemical Analysis in Picoliter Microvials," *Anal. Chem.* 69: 259 (1997)). Recent work by Whitesides and Chilkoti demonstrated large arrays of microwells in poly(dimethylsiloxane) (PDMS) (Jackman et al., "Fabricating Large Arrays of Nanowells with Arbitrary Dimensions and Filling Them Using Discontinuous Dewetting," *Anal. Chem.*, 70: 2280 (1998). These microwell arrays were fabricated by casting PDMS elastomer against a master that was prepared by conventional photolithography.

Equally important for the successful implementation of microwell arrays for analytical and biochemical applications is the delivery system that controls the precise placement of the reagents into the wells. Systems and processes that deliver reagents in an array format include a pin tool that loads the reagents mechanically, ink jet printing that dispatches microscopic drops of liquids on active surfaces, and electrically polarizing the array sites. An attractive alternative is to create functional microwells that can perform surface-induced placement of reagents into the wells. In a recent report, Whitesides et al. selectively deposited proteins into microwells made of PDMS by first trapping air bubbles in the well bottoms and then coating the well-top with one protein (Ostuni et al., "Selective Deposition of Proteins and Cells in Arrays of Nanowells," *Langmuir* 17: 2828 (2001)). The air bubbles were then removed and a second protein was delivered into the wells.

SUMMARY

Versatile methods for preparing microstructures from polymeric materials are provided. The flexible methods enable production of microstructures of varying shapes and varying chemical and physical properties. For example, surface properties such as wettability, adhesion, tackiness, and biocompatibility can be modified. The disclosed methods also permit fabrication of microstructures on flat substrates, and may be readily integrated with other microfabrication techniques.

Microstructures, including micro-wells and micro-towers, comprised entirely of polymeric materials also are disclosed. In one embodiment, "smart wells" that selectively adsorb reagents into the wells are provided. The well bottoms may be formed from a polymeric material that attracts reagent molecules. For example, the well bottom may be formed from a polar polymeric material that attracts PCR templates and primers. Furthermore, the well top material may be selected so that it repels and confines the reagent molecules to the wells. For example, a non-polar polymeric material may be used to repel PCR templates and primers toward the wells.

DETAILED DESCRIPTION

I. Abbreviations

Figure 1A:
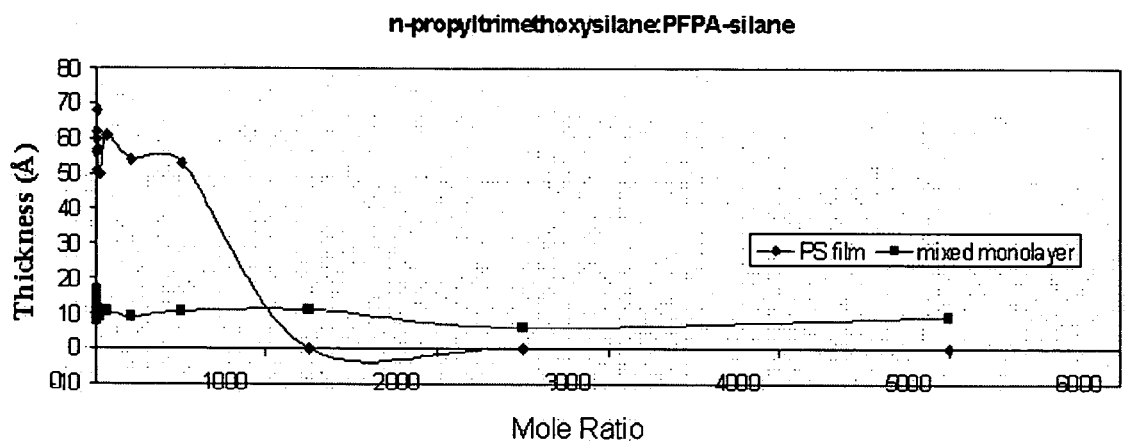
FIGS. 1A and 1B are, respectively, a graph of polymer film thickness (Å) versus the ratio of n-propyltrimethoxysilane to PFPA-silane in the functionalizing reagent and a graph of polymer film thickness (Å) versus the ratio of n-octadecyltrimethoxysilane to PFPA-silane in the functionalizing reagent.

The disclosed embodiments are best understood with reference to the following abbreviations:
PHPA-perhalophenylazide
PFPA-perfluorophenylazide
PS-polystyrene
PEOX-poly(2-ethyl-2-oxazoline)
PVP-polyvinylpyrrolidone
PVC-polyvinylchloride
P4VP-poly(4-vinylpyridine)
PEG-poly(ethylene glycol)
AFM-atomic force microscopy
UV-ultraviolet

II. Definitions

The following terms are used herein to aid the reader, but are not intended to limit the defined terms to a scope less than would be understood by a person of ordinary skill in the art:

An "azide functionalized substrate" is a substrate to which one or more nitrenogenic groups (defined below) are adhered, covalently or otherwise.

A "bis-azide" is a functionalizing reagent that comprises at least two nitrenogenic groups.

A "functional group" is a group of one or more atoms bonded together in an organized way so as to have particular chemical and/or physical properties.

The term "functionalized polymer" can concern either a functionalized polymeric substrate or a functionalized polymer molecule. Functionalized polymer molecules comprise one or more functional groups covalently bonded to the polymer molecules.

A "functionalizing reaction" is a reaction in which a substrate surface is functionalized with functional groups other than those naturally present on the substrate surface. For example, a surface may be functionalized with nitrenogenic groups to provide an azide-functionalized substrate. A functionalizing reaction can consist of one or more stages. At least one stage involves the reaction of a functional group of the functionalizing reagent with the surface atoms of the substrate.

A "functionalizing reagent" is a reagent adapted for functionalizing a substrate.

Molecules of functionalizing reagents have at least one nitrenogenic group (as a first functional group) coupled, either directly or indirectly, to at least a second functional group. In certain disclosed embodiments the nitrenogenic group is not directly coupled to the second functional group, but preferably is constrained by the molecular structure of the functionalizing reagent between the nitrenogenic group and the second functional group. The second functional group of the functionalizing reagent, which also can be a nitrenogenic group, serves to adhere the functionalizing reagent to the substrate. Other functional groups that may be used to adhere the functionalizing reagent to a substrate include, without limitation, thiols, amines, and silanes. Additional functional groups may be present on the functionalizing reagent and may serve to alter the properties of the functionalized substrate or to permit attachment of additional molecules to the substrate. Additional examples, without limitation, of functional groups, constrained structurally from reacting with the nitrene moiety after the nitrene moiety is generated, also may be present on the functionalizing reagent:

(a) carboxyl groups and various derivatives thereof such as (but not necessarily limited to): N-hydroxysuccinimide esters; N-hydroxybenzotriazole esters; acid halides corresponding to the carboxyl group; acyl imidazoles; thioesters; p-nitrophenyl esters; alkyl, alkenyl, alkynyl and aromatic esters, including esters of biologically active (and optically active) alcohols such as cholesterol and glucose; various amide derivatives such as amides derived from ammonia, primary, and secondary amines and including biologically active (and optically active) amines such as epinephrine, dopa, enzymes, antibodies, and fluorescent molecules;

(b) alcohol groups, and sulfur analogs thereof, either free or esterified to a suitable carboxylic acid which could be, for example, a fatty acid, a steroid acid, or a drug such as naprosin or aspirin;

(c) haloalkyl groups wherein the halide can be later displaced with a nucleophilic group such as a carboxylate anion, thiol anion, carbanion, or alkoxide ion, thereby resulting in the covalent attachment of a new group at the site of the halogen atom;

(d) maleimido groups or other dienophilic groups such that the group may serve as a dienophile in a Diels-Alder cycloaddition reaction with a 1,3-diene-containing molecule such as, for example, an ergosterol;

(e) aldehyde or ketone groups, and sulfur analogs thereof, such that subsequent derivatization is possible via formation of well-known carbonyl derivatives such as hydrazones, semicarbazones, or oximes, or via such mechanisms as Grignard addition or alkyllithium addition; and (f) sulfonyl halide groups for subsequent reactions with amines, for example, to form sulfonamides.

The functionalizing reagent may be selected from the group consisting generally of: functionalized aryl azides, alkyl azides, alkenyl azides, alkynyl azides, acyl azides, and azidoacetyl derivatives. All such reagents are capable of carrying a variety of functional substituents that serve to adhere the functionalizing reagent to a substrate, provide sites where additional molecules may be coupled to the functionalizing reagent, or otherwise alter the chemical and/or physical properties of the functionalized substrate. Halogen atoms may be present to the maximum extent possible in the positions on the functionalizing reagent molecule adjacent the azide group. Improved results are achieved when fluorine and/or chlorine atoms are the halogen atoms.

Examples of nitreneogenic azides and functionalizing reagents useful for functionalizing polymeric substrates may be found in U.S. Pat. No. 5,580,697 to Keana et al., U.S. Pat. No. 5,830,539 to Yan et al., and PCT publication WO 98/22541 naming Yan et al. as inventors, all of which are incorporated by reference herein.

Particularly effective functionalizing reagents may be derived from perhalophenyl azides (PHPAs), particularly perfluorophenyl azides (PFPAs) derived from 4-azido-2,3,5,6-tetrafluorobenzoic acid. For example, Schemes 1, 2, 3, and 4 below illustrate synthetic routes to a variety of functionalizing reagents based upon 4-azido-2,3,5,6-tetrafluorobenzoic acid. One skilled in the art will recognize that the particular reactions and any reaction conditions indicated are illustrative of more general routes to functionalizing reagents from azides.

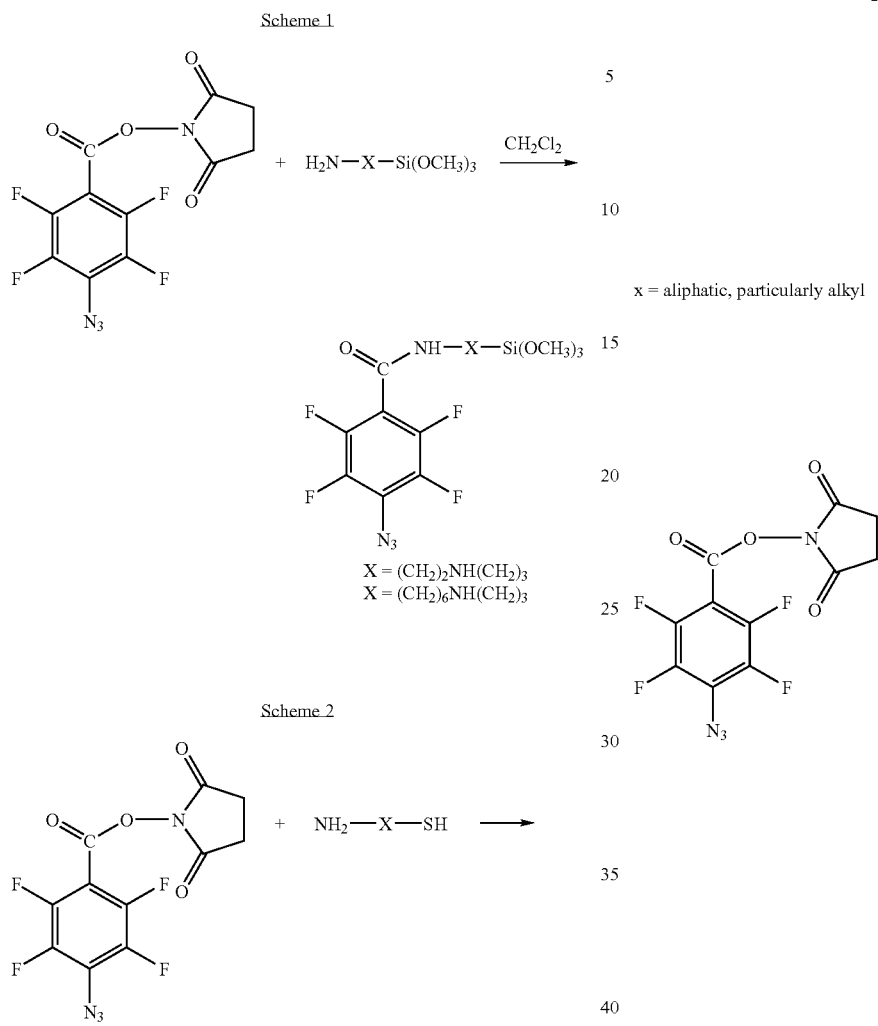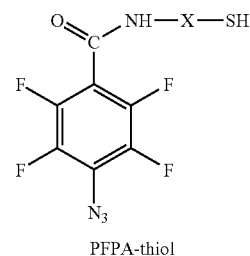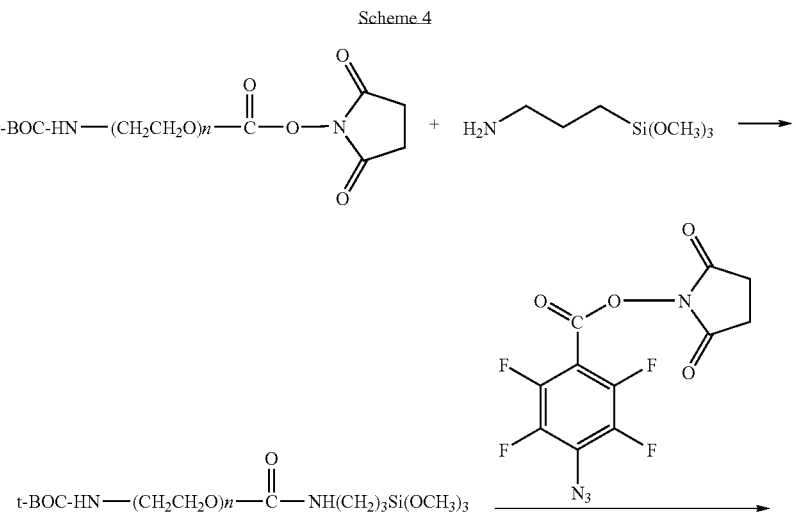

-continued

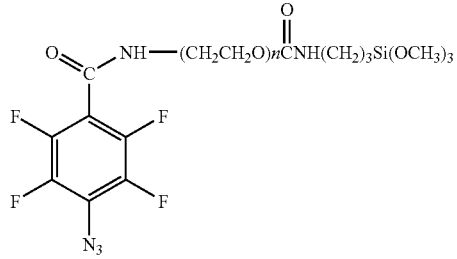

A "nitrene group" (also generally termed "nitrene" or "nitrene intermediate") is a particular form of nitrogen group regarded by persons skilled in the art as the nitrogen analogs of carbenes. Like carbenes, nitrenes are generally regarded as intermediates that are highly reactive and may not be isolatable under ordinary conditions. Important nitrene reactions include (but are not limited to) addition or insertion into C—H, N—H, O—H, and C—C bonds (single and double).

A "nitrenogenic group" is a chemical moiety that becomes a nitrene group when exposed to a reaction-energy source. An azide group is an example of a nitrenogenic group.

A "polymer molecule" is a molecule formed by covalently linking smaller molecules termed "monomers." The monomers present in a polymer molecule can be the same or different. If the monomers are different, the polymer also may be called a co-polymer. Polymer molecules can be natural, such as, but not limited to, carbohydrates, polysaccharides (such as celluloses and starches), proteins, and nucleic acids; or synthetic, such as, but not limited to, nylon and polyaliphatic materials, particularly polyalkylene materials, examples of which include polyethylene and polypropylene. In a polymeric material, polymer molecules can be associated with each other in any of several ways, including non-covalently (as a thermoplastic) or by a covalently cross-linked network (as a thermoset).

Polymeric materials include virtually any polymeric material comprising polymer molecules possessing —CH groups, and/or —NH groups, and/or —OH groups, and/or C=O groups, and/or C=N groups, and/or carbon-carbon single bonds, and/or carbon-carbon double bonds, and/or carbon-carbon triple bonds. Such polymeric materials include, but are not limited to:

(a) saturated polyolefins as exemplified by polyethylene, polyvinyl chloride, polytetrafluoroethylene, polypropylene, polybutenes, and copolymers thereof;

(b) acrylic resins such as polymers and copolymers of acrylic acid, methacrylic acid such as, poly(methylmethacrylate), poly(hexylmethacrylate), and acrylonitrile;

(c) polystyrene and its analogues such as poly(p-chlorostyrene), poly(p-hydroxystyrene), and poly(alkylstyrene);

(d) unsaturated polyolefins such as poly(isoprene) and poly(butadiene);

(e) polyimides such as polyimide(benzophenone tetracarboxylic dianhydride/tetraethylmethylenedianiline);

(f) polyesters such as poly(trimethylene adipate), poly(ethylene terephthalate), and poly(hexymethylene sebacate);

(g) conjugated and conducting polymers such as poly(3-alkylthiophene), poly(3-alkylpyrrole), and polyaniline;

(h) inorganic polymers such as poly(aryloxyphosphazene), poly>bis(trifluoroethoxy) phosphazene, polysilanes, and polycarbosilanes, siloxane polymers, and other silicon-containing polymers;

(i) organic metals (i.e., organic polymers with metallic properties) such as polycroconaines and polysquaraines, as described in Chemical and Engineering News (Aug. 31, 1992);

(j) organometallic polymers such as palladium poly-yne and ferrocene-containing polyamides;

(k) polysaccharides such as cellulose fibers, chitin, starch, glycogen, and glycosaminoglycans such as heparin, glucosamine, hyaluronic acid, chondroitin sulfate, and karatin sulfate;

(l) thermally responsive polymers such as N-isopropylacrylamide (PNIPA), and co-polymers of PNIPA and poly(acrylic acid) or polyacrylamide.

(m) polypeptides such as poly-lysine.

(n) polymers of cyclic amines such as poly(2-ethyl-2-oxazoline) (PEOX) and poly(ethylenimine).

(o) polymers of nucleic acids such as deoxyribonucleic acid (DNA) and ribonucleic acid (RNA).

(p) polyethers such as poly(ethylene glycol) and poly(ethylene oxide)

A "polymeric material or substrate" is a material or substrate comprising polymer molecules or a network of polymer molecules.

A "reaction-energy source" is an energy source that promotes adherence of a polymeric material to a substrate, for example, by converting nitrenogenic groups on functionalizing reagent molecules to nitrenes, which may then react with, for example, a polymeric material, or by directly adhering the polymeric material to a substrate. Suitable reaction-energy sources include (but are not limited to): photons (including ultraviolet (UV) photons, deep-UV photons, laser light, X-rays, microwaves, thermal energy (such as infrared radiation and conductive heating), energized electrons (such as an electron beam), and energized ions (such as an ion beam). Reaction-energy sources can be used alone or in combination. Reaction-energy sources are conventionally used for such tasks as lithography, scanning microscopy and, in the case of UV and visible photons, effecting photochemical reactions and excitation of fluorescent molecules. A reaction-energy source comprising UV light can be supplied, for example, using a mercury or xenon lamp. A medium pressure mercury lamp is a source of photons between about 220 nm and about 1,000 nm, with a maximal intensity at about 360 nm. A photomask may be used to prevent photons from reaching certain portions of a sample while allowing photons to reach other portions. This provides an example of a process for forming desired patterns.

A reaction-energy source comprising electrons can be supplied to a reaction by the following representative procedure: A sample is irradiated under vacuum by an electron or particle beam with an energy selected within the range of from about 1 kV to about 40 kV. A representative electron-beam source is a JEOL 840A electron microscope modified for electron-beam lithography. The beam may be stepped across the surface of the treated substrate to expose certain areas and not others. A dwell time at each step can be adjusted to change the exposure.

A thermal energy reaction-energy source can be supplied, for example, by heating a sample in an oven, typically ramped at a desired rate to a preselected working temperature or preheated to a designated temperature. The designated temperature can be a temperature sufficient to increase the polymer chain mobility for a given polymer being attached to a substrate. The designated temperature can vary depending on the given polymer-type. For example, working embodiments used temperatures greater than the glass transition temperatures of the polymers being attached to the substrates; these were typically temperatures between 120° C. and 190° C. The heating time can a time sufficient to impart the necessary energy to bond the polymer film to the substrate. Working embodiments used times of between 5 minutes and 40 minutes.

A "substrate" typically is a non-fluid material providing a surface that can be functionalized according to the present invention. A substrate can comprise polymer molecules (e.g. thermoplastic polymer molecules), a thermoset molecular network (e.g., cross-linked polymer molecules), metal atoms (e.g., copper, gold, aluminum, platinum, palladium, and silver), semiconductor materials (e.g., gallium arsenide, silicon nitride, titanium dioxide, and cadmium sulfide), silicon, silica, glass, mica, quartz (and other atomic or molecular associations such as found in certain glasses and crystals), and graphite (and other forms of carbon such as fullerenes, carbon electrodes, and carbon nanotubes). It also should be understood that a first material may be adhered to a first substrate to provide a second substrate to which additional materials may be adhered, and so on. The substrate may be a device comprised of multiple layers of materials, for example a microelectronic device.

A substrate is functionalized by chemistry whereby functional groups on the functionalizing reagent molecules interact with the substrate or substrate surface to adhere the functionalizing reagent to the substrate. A substrate may be functionalized by chemistry whereby a functional group on the functionalizing reagent molecule is either attracted to (e.g. by dipole-dipole interactions) or bonded (e.g. through hydrogen bonds, ionic bonds, or covalent bonds) to the substrate surface.

Examples of molecules or materials that may be attached to a substrate include, without limitation, proteins, nucleic acids, carbohydrates, organometallic catalysts, polymers, peptides, and metals.

III. Applications

In one aspect, an efficient approach to immobilization of polymer thin films on solid substrates using a functionalized nitrenogenic molecule is provided. In one embodiment, the functionalized nitrenogenic molecule is a functionalized azide, for example a functionalized perhalophenylazide (PHPA), such as a functionalized perfluorophenyl azide (PFPA). The functionalized nitrenogenic molecule comprises a functional group that serves to adhere the functionalized nitrenogenic molecule to the surface of a solid substrate and a nitrenogenic group, such as an azide group, that can be converted to a nitrene moiety that reacts with polymeric materials, generally via an insertion or addition reaction with the polymeric material.

In a particular embodiment, a polymeric material is applied (e.g. by spin-coating, adsorption from solution, or transfer of Langmuir-Blodgett films) to a surface derivatized with a functionalized PFPA (an example of an azide-functionalized substrate), followed by treatment with one or more reaction energy sources. The reaction energy source(s) convert the azide group to a highly reactive nitrene that facilitates a reaction, such as an addition or insertion reaction with the polymeric material. The result is a polymeric material adhered to the substrate surface, generally covalently. Spatial control of the reaction energy provides a polymeric film adhered to a substrate in a pre-determined pattern.

Surface modification of substrates and adherence of polymer thin films using functionalized nitrenogenic molecules may be used to attach polymer thin films to substrates. The functional group of the functionalized nitrenogenic molecule may be selected to interact or bond to a substrate in a particular manner. For example, if the substrate is siliceous (e.g. silicon, silica, glass, mica, or quartz) the functional group may be a silane because silanes react well with siliceous materials. If the substrate is a metal (e.g. copper, gold, aluminum, platinum, palladium, or silver), alloy, or a semiconductor (e.g. cadmium sulfide or gallium arsenide), the functional group may be a thiol or other group, such as a nitrogen-containing group capable of forming a bond with the substrate, for example, an amine group. If the substrate is graphite or a polymer, the functional group may be an azide.

Figure 1B:
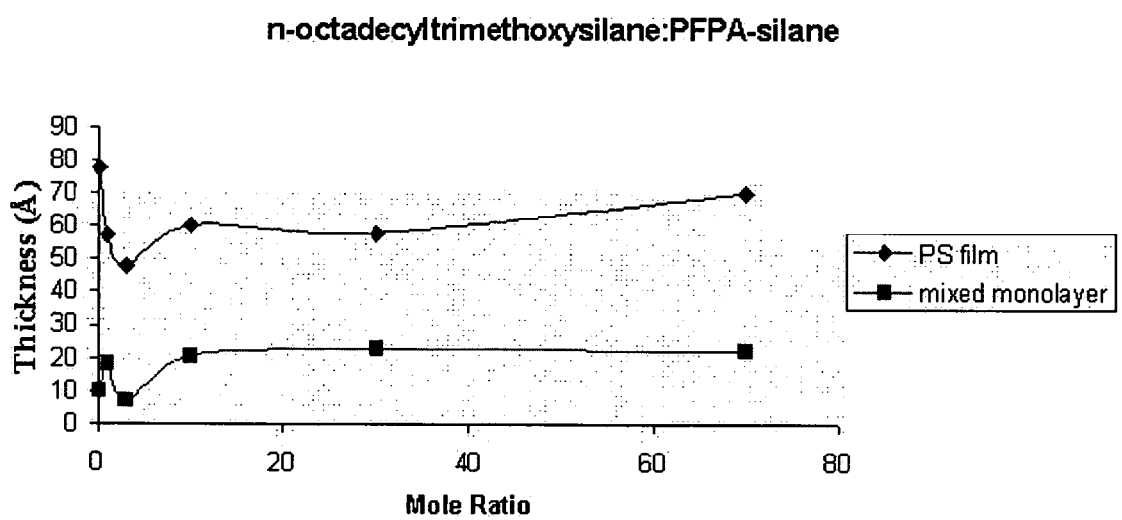

In some implementations, it is not necessary to have a high concentration of the functionalizing reagent bonded to the surface of the substrate in order to achieve efficient immobilization of the polymer film. For example, FIGS. 1A and 1B show the film thickness achieved where the density of azido groups on the surface was varied by functionalizing the substrate with a mixture of PFPA-silane and a non-photoactive molecule (either n-propyltrimethoxysilane or n-octadecyltrimethoxysilane) at the mole ratio specified. The substrate was a clean silicon wafer. PS was spin-coated on the functionalized surface and the film was irradiated, as described in Example 1.

A method for direct adhesion of a polymer to a substrate also is provided. In this method, a polymer (e.g. a vinylic polymer such as PS, P4VP, polypropylene, PVP, PVC, PS-acrylonitrile co-polymer, or ethylene vinyl acetate copolymer) is adhered to a substrate (e.g. a siliceous substrate such as silicon, silica, glass, or quartz) by direct exposure to one or more reaction energy sources (e.g. electron beam or electromagnetic radiation, including UV irradiation such as photons having a wavelength between about 190 nm and about 400 nm or photons having a wavelength from about 190 nm to about 280 nm, or thermal energy). In one embodiment, PS is applied to a silicon substrate (e.g. by spin coating, adsorption from solution, or transfer of Langmuir-Blodgett films) and adhered using one or more reaction energy sources, such as UV-illumination or thermal energy. In other embodiments PVC, P4VP or PVP is applied to a silicon substrate and adhered with one or more reaction energy sources. These thin films are surprisingly resistant to removal from the substrates to which they are bound, even under conditions that will remove thin films not exposed to a reaction energy source. For example soaking and/or sonication in solvents fail to completely remove such UV-adhered films. It is possible to spatially control the UV-illumination to provide a polymer film adhered to the underlying substrate in a predetermined pattern.

Modifying the conditions used to bond a polymeric material to a substrate is one way to control thickness. For example, PEOX thin films with a thickness from about 1.5 nm to about 3.3 nm may be prepared by varying the intensity and time of exposure to UV photons. Film thickness also may be varied by treatment following adherence. For example, in working embodiments, film thicknesses of between 2 nm and 85 nm were prepared by treating an adhered film with a solvent and/or sonication following UV exposure. In other embodiments, different film thicknesses were prepared by thermal treatment at different temperatures and for different times. Thin films (e.g. from about 3 nm to about 15 nm) may result from covalent bonding. Thicker films (e.g. from about 15 nm and about 100 nm) may result from physical adherence. Adjusting the molecular weight of the polymeric material also can control the thickness of the film, with thicker films typically resulting from polymers with greater average molecular weights.

Spatially selective treatment of applied polymeric materials with a reaction energy source (e.g. UV light or electron beam) may be used to provide polymeric materials attached to the substrate in pre-determined patterns. Disclosed embodiments of the method combine azide-mediated and/or reaction-energy-source-induced immobilization chemistry with lithography to generate patterned polymer films and hybrid arrays with unique surface topographies. These embodiments permit immobilization and formation of polymer arrays without prior chemical modification of the polymer, making the disclosed embodiments extremely versatile. Structures as small as the diffraction limit of the reaction energy source may be fabricated in this manner. For example, using an electron beam as the reaction energy source may provide structures as small as about 50 nm. UV-light treatment may provide structures as small as about 100 nm to about 200 nm (0.1 μm to 0.2 μm).

While structures as large as several inches can be made using the disclosed techniques, one advantage of the techniques is that they can provide microstructures comprised of polymeric materials. In one embodiment, micro-wells comprising polymeric materials are formed on a flat substrate. Such micro-wells may be used, for example, as micro-reactors or may be used as chemical sensors.

Besides modifying the surface properties of microstructures, a patterned layer of polymeric material also can be used as an etch resist. The presence of a patterned layer of polymeric material on the surface of a substrate allows portions of the substrate not covered by the polymeric material to be selectively etched by standard etch processes (such as plasma etch processes and wet etch processes). In this manner, the structure of the substrate can be modified to form useful features, such as micro-wells. The etch resists currently used in the microelectronics industry are expensive and often proprietary. In contrast, many of the disclosed polymeric materials are readily available and relatively inexpensive. Example 11 describes the use of polymer microstructures as resists in the selective etching of the underlying substrates.

Disclosed embodiments also include unique polymer-based micro-wells and nano-wells where the well-base and the well-top are tailored for particular applications. The unique surface properties of the disclosed micro- and nano-wells permit surface-induced delivery of reagents into the wells. For example, if the well-bottom is made of a polymer capable of absorbing or adsorbing a specific material (e.g. a particular molecule, biomolecule, or cell) and the well-top polymer has no affinity for the same material, then the material placed adjacent the well will tend to migrate to the well. Therefore, if a drop of a solution containing the material is placed on the surface of a substrate having such wells, gently shaking the substrate will move the material into the wells. This method eliminates the need for reagent delivery systems, making chip-based assays cheaper and easier to perform.

In a particular embodiment, the well-base is a hydrophilic, biocompatible polymer (e.g. PEOX) and the well-top is a hydrophobic polymer (e.g. PS). This configuration may be used for selective deposition of DNA into nano-wells. Deposition in such nano-wells may be used, for example, to provide sites for carrying out PCR reactions. Alternatively, the nano-wells may be used to construct a DNA selective sensor. Nano-wells having a hydrophilic base and a hydrophobic top may permit facile and selective deposition of DNA molecules in the wells. DNA is attracted to hydrophilic regions of the well-base whereas the hydrophobic surface of the well-tops tend to repel DNA molecules, acting as a barrier for their attachment. Therefore, when a solution of DNA is placed on the surface of a substrate bearing such nano-wells, the DNA molecules migrate into the wells, driven by the attraction to PEOX in the well-bottom and repulsion to PS on the well-top. It is also possible to covalently immobilize the DNA molecules that migrate to the wells by any known technique for forming covalent bonds between a polymer and a biological molecule, such as with a bifunctional linking reagent (See, for example, Polsky-Cynkin et al., "Use of DNA Immobilized on Plastic and Agarose Supports to Detect DNA by Sandwich Hybridization," *Clin. Chem.*, 31(9):1428-1443 (1985) and Ghosh et al., "Covalent attachment of oligonucleotides to solid supports," Nuc. Acids Res., 15(13):5353-5373 (1987)). In addition to nucleic acids (including DNA and RNA), such arrays may be useful for immobilizing and localizing other molecules including proteins and drug molecules. In one particular embodiment, a sensor is constructed by immobilizing protein molecules in nano-wells constructed on a silicon wafer according to the disclosed methods. Other molecules subsequently may be screened for their attachment to the protein molecules in the nano-wells, thereby indicating their potential as drugs that target the protein.

Polymers that are known to adsorb or resist the adsorption of proteins may be used as the well-bottom and well-top materials, respectively. Table 1 lists a few examples of polymers that bind proteins via ionic interactions (e.g. poly(styrene sulfonate), polylysine, and poly(allylamine) (at neutral pH)) and via hydrophobic interactions (e.g. PS).

TABLE 1

Examples of Polymers for Well-Bottom and Well-Top Materials

| Polymers that adsorb proteins (well-bottom material) | poly(styrene sulfonate) | polylysine poly(allylamine) | Polystyrene |
| --- | --- | --- | --- |
| Polymers that resist proteins (well-top material) | poly(ethylene glycol) | poly (vinylpyrrolindone) | Poly(vinyl alcohol) |

The unique surfaces that may be generated with the disclosed methods also may be used as the stationary phase in chromatographic and electrophoretic separations of molecules. For example, a surface having micro-wells with a hydrophobic base and a hydrophilic top may be used as a thin layer chromatographic support. A polar solvent applied to the surface will tend to wet and move across the surface, whereas less polar molecules carried in the solvent become trapped in the wells, retarding their progress. Therefore, molecules in the solvent will be separated based upon their relative hydrophobicities. A surface having micro-wells with a hydophilic base and a hydrophobic top may be used with a non-polar solvent to separate molecules based upon their relative hydrophilicities.

Another application of patterned polymeric arrays is to provide channels for fluid flow useful in micro-fluidic devices.

Additional molecules may be adhered to polymeric microstructures using techniques such as those disclosed in U.S. Pat. No. 5,580,697 to Keana et al., U.S. Pat. No. 5,830,539 to Yan et al., and PCT publication WO 98/22541 naming Yan et al. as inventors, all of which are incorporated by reference herein.

In another embodiment, a micro-well may be formed by patterned adherence of a polymeric material to a substrate, leaving the underlying substrate exposed. For example, application of a polymeric material to an azide-functionalized substrate, followed by spatially selective adherence of the polymeric material in a pattern that leaves exposed portions of the underlying substrate, may be used to provide wells that have unreacted azide groups at the bottom. Such unreacted azide groups may be used to attach other molecules, such as biomolecules, to the bottom of the well.

The physical properties of certain polymeric films change in the presence of certain compounds. For example, different compounds may affect surface tension, hydrophobicity, hydrophilicity, viscoelasticity, and/or thickness (e.g., by swelling). Example 5 shows how the thickness and the water contact angle of a P4VP film were differentially affected by contact with chloroform as opposed to dichloromethane.

Some disclosed microstructure embodiments may be used as sensors to identify analytes. For example, disclosed microstructures include microstructures comprising one or more polymeric material(s) adhered to a substrate. This configuration allows for the efficient exposure of the polymeric material(s) to an analyte. For example, plural different polymeric materials can be exposed to an analyte by contact with a fluidic channel. After exposure, the changes in the physical properties of each exposed polymeric material can be determined, such as by analytical measurement and/or by computer analysis. Where multiple polymeric materials are used, the effect of a given analyte on the polymeric materials can serve as a fingerprint for that analyte and can aid in its identification.

Varying the thickness of the polymeric films adhered to a substrate can facilitate the formation of microfluidic channels to facilitate the exposure of the polymeric material(s) to an analyte. Additional sensor features compatible with the disclosed microstructures and methods for making these features are described in U.S. Pat. No. 6,645,432 to Anderson et al. and U.S. Pat. No. 6,548,895 to Benavides et al., both of which are incorporated herein by reference.

IV. EXAMPLES

The following examples are provided to further illustrate certain features described above and are not meant to limit the invention to the particular embodiments disclosed.

Example 1

Synthesis of a Functionalized Azide, Preparation of an Azide-Functionalized Substrate and Formation of polymer Thin Films on the Substrate Materials and Methods:

Methyl pentafluorobenzoate, sodium azide (99%), N-hydroxysuccinimide (97%), dicyclohexylcarboimide (DCC, 99%), polystyrene (average MW 280,000), and silica gel (200 mesh) were purchased from Aldrich (Milwaukee, Wis.) and were used as received. Monodisperse polystyrene of MWs 115,700; 393,400; 1,015,000; and 1,815,000 were obtained from Scientific Polymer Products, Inc. 3-aminopropyl trimethoxysilane (United Chemical Technologies) was fractionally distilled and stored under nitrogen. Water used was obtained from a Millipore Milli-Q system with at least 18 MΩ resistivity. $CH_2Cl_2$ was distilled from $P_2O_5$. Silicon wafers were cut with a diamond pen and cleaned in piranha solution (7/3 v/v conc. $H_2SO_4/H_2O_2$ 35 wt. %) for 1 hour at 80-90° C., washed thoroughly with water (100° C., 1 hour), and dried under a stream of nitrogen.

Spin coating was performed using a P6204 spin-coater (Specialty Coating Systems, Indianapolis, Ind.). Photochemical reactions were executed with a medium pressure Hg lamp (450 W, Hanovia). Contact angles were determined with 2 μL of $H_2O$ and measured (~1.5 minutes after initial contact) using Contact Angle Viewer Model D1060 (3A, Kayeness, Inc., Honeybrook, Pa.). Film thickness was determined using Gaertner Model L116A ellipsometer at an incident angle of 70°. $^1H$ NMR spectra were recorded on a GE 500 multinuclear FT-NMR. Infrared spectra were obtained using a Perkin Elmer Series 2000 FT-IR. A Bausch & Lomb Abbè 3L refractometer was used to determine refractive index of 2. UV-vis analysis was conducted with a Beckman DU 530 Life Science UV-visible spectrophotometer.

Synthesis of N-(3-trimethoxysilylpropyl)-4-azido-2,3,5,6-tetrafluorobenzamide All reaction steps were carried out with protection from light due to the sensitive nature of the azido group. First, a mixture of $NaN_3$ (300 mg, 4.6 mmol) and methyl pentafluorobenzoate (0.972 g, 4.3 mmol) in acetone (8 mL) and water (3 mL) was refluxed for 8 hours. The mixture was cooled, diluted with 10 mL of water, and then extracted with diethyl ether (3×10 mL). The extract was dried (anhydrous $Na_2SO_4$) and evaporated to give methyl 4-azido-2,3,5,6-tetrafluorobenzoate (1.01 g, 94%), as off-white flakes, mp 53.6-54.3° C.

A solution of 1.009 g (4.0 mmol) of methyl 4-azido-2,3,5,6-tetrafluorobenzoate in 4 mL (10 mmol) of 10% NaOH, and 20 mL of methanol was stirred at room temperature for 12 hours. This solution was carefully acidified in an ice bath with approximately 10 mL of 1.2 M HCl to a pH<2. The acidified solution was extracted with chloroform (3×10 mL), dried over anhydrous sodium sulfate, and evaporated to afford 4-azidotetrafluorobenzoic acid (0.9181 g, 96%) as white flakes, mp 141.6-142.8° C.

N-hydroxysuccinimide (NHS) (0.450 g, 3.9 mmol) and 0.8339 g (4.0 mmol) of dicyclohexylcarbodiimide (DCC) were added to a solution of 0.9181 g (3.9 mmol) of 4-azidotetrafluorobenzoic acid in 4 mL of redistilled $CH_2Cl_2$ and stirred at room temperature for 12 hours. The mixture was filtered and the filtrate was evaporated leaving the crude product. The solid was purified by recrystallization with chloroform/hexane to yield N-succinimidyl 4-azidotetrafluorobenzoate (1) (1.2455 g, 95%) as white crystalline flakes, mp 107-108.4° C.

The formation of N-(3-trimethoxysilylpropyl)4-azido-2,3,5,6- tetrafluorobenzamide (2) from N-succinimidyl 4-azidotetrafluorobenzoate (1) is illustrated schematically in reaction 1 below.

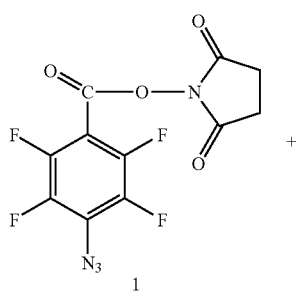

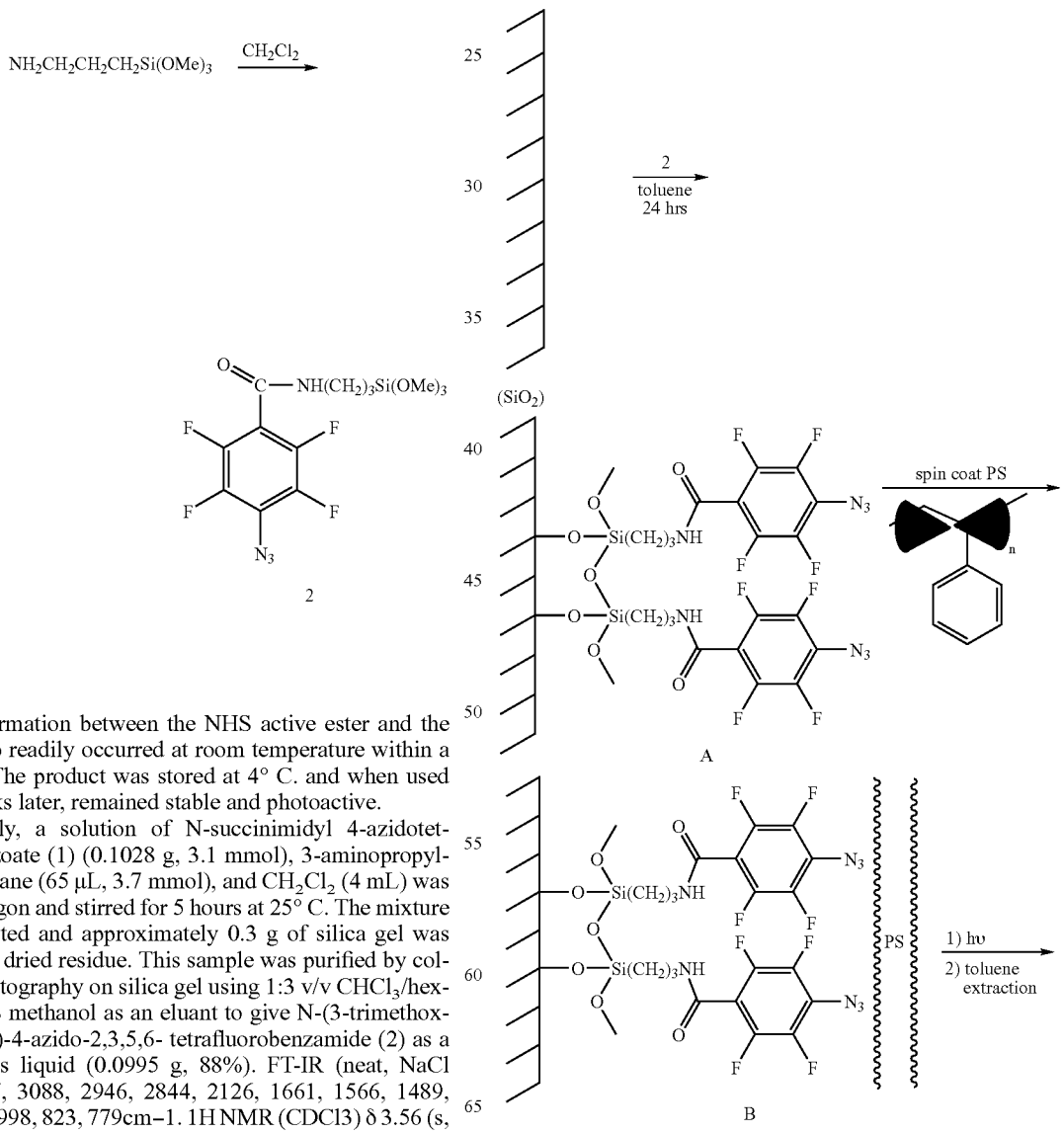

Scheme 5
Schematic representation of an illustrative thin film fabrication process Amide formation between the NHS active ester and the amino group readily occurred at room temperature within a few hours. The product was stored at 4° C. and when used several weeks later, remained stable and photoactive.

Specifically, a solution of N-succinimidyl 4-azidotetrafluorobenzoate (1) (0.1028 g, 3.1 mmol), 3-aminopropyltimethoxysilane (65 μL, 3.7 mmol), and $CH_2Cl_2$ (4 mL) was capped in argon and stirred for 5 hours at 25° C. The mixture was evaporated and approximately 0.3 g of silica gel was added to the dried residue. This sample was purified by column chromatography on silica gel using 1:3 v/v $CHCl_3$/hexane with 2% methanol as an eluant to give N-(3-trimethoxysilylpropyl)-4-azido-2,3,5,6- tetrafluorobenzamide (2) as a clear viscous liquid (0.0995 g, 88%). FT-IR (neat, NaCl plates) 3287, 3088, 2946, 2844, 2126, 1661, 1566, 1489, 1271, 1087, 998, 823, 779cm−1. 1H NMR ($CDCl_3$) δ 3.56 (s, 9H), 3.47 (q, J=12Hz, 2H), 1.76 (m, J=15 Hz, 2H), 1.61 (s, 1H), 0.72 (t, J=16 Hz, 2H). Refractive index nD23 1.503. UV-vis (in methanol): continuous broad peaks with maxima at 256 and 205 nm. Anal. Calcd for $C_{13}H_{16}N_4F_4O_4Si$; C, 39.39; H, 4.07; N, 14.13. Found: C, 39.34; H, 4.16; N, 13.81.

Funtionalization of a Substrate Surface:

Silicon wafers were cut with a diamond pen and cleaned in piranha solution (7/3 v/v conc. $H_2SO_4$/$H_2O_2$ 35 wt. %) for 1 hour at 80-90° C., washed thoroughly with water (100° C., 1 hour), and dried under a stream of nitrogen. The clean wafers were soaked in a solution of PFPA-silane 2 in toluene (90 mg/9 mL) for 24 hours, rinsed in a gentle stream of ethanol, and dried under compressed nitrogen. These wafers were then allowed to cure at room temperature for at least 24 hours.

The overall process of covalent immobilization of polymer thin films (such as PS, as illustrated) on silicon wafers using N-(3-trimethoxysilylpropyl)-4-azido-2,3,5,6-tetrafluorobenzamide is illustrated in Scheme 5 below.

-continued

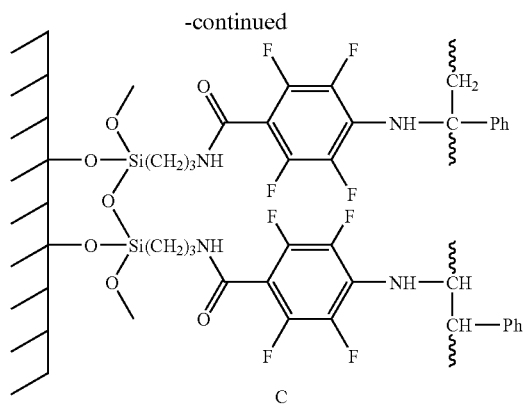

Covalent attachment of 2 to the wafers is achieved via silanization. Hydrolysis of the trimethoxysilyl groups followed by condensation with the silanol groups on the wafer surface results in covalent attachment of the perfluorophenyl azide (A).

A polymer film is then introduced to the functionalized wafer surface by spin coating a solution of the polymer in a solvent (e.g., PS in toluene or PEOX in chloroform) (B).

Photolysis (e.g., by UV irradiation) or thermolysis (e.g., by thermal energy) of the film triggers the covalent attachment of polymer chains to the wafer surface via the insertion reaction of the highly reactive perfluorophenyl nitrene intermediate to the adjacent polymer molecules (C).

Removal of the unattached polymer by solvent extraction leaves a thin film that is covalently immobilized on the wafer surface.

Example 2

Thin Film Immobilization of PS by Photolysis

A typical procedure for immobilizing a polymer thin film, such as a polystyrene thin film on an azide-functionalized silicon wafer, is as follows. A PFPA-silane functionalized wafer was spin-coated at 2,000 rpm for 60 seconds with a solution of 10 mg/mL PS in toluene. The film was then covered by a 280 mn glass filter, and irradiated for 5 minutes with UV light at an intensity of 16.6 mW/cm$^2$. Irradiation time included a 1.75-2 minute warm up for the UV lamp to reach full power. The unbound polymer was extracted by toluene for 24-48 hours, rinsed with toluene and dried under a stream of nitrogen. The film thickness was determined by ellipsometry (±3% error).The process was also monitored by contact angle measurements using water (Table 2). The freshly cleaned silicon wafer had a contact angle of 17°, consistent with the result reported by others. Introduction of a monolayer of perfluorophenylazido groups on the surface resulted in a contact angle of 42°. Remarkably, the immobilized PS had a contact angle complimentary to the spin-coated PS film, suggesting that the thin film was fairly uniform.

TABLE 2

Contact Angles of Bare and Derivatized Wafers

| SUBSTRATE LAYER | H$_2$O ANGLE (°)α |
|---|---|
| Clean Wafer | 17 |
| Sample A | 42 |

TABLE 2-continued

Contact Angles of Bare and Derivatized Wafers

| SUBSTRATE LAYER | H$_2$O ANGLE (°)α |
|---|---|
| PS (Sample B) | 89 |
| PS (Sample C) | 84 |

αStandard deviation ± 2°

The thickness of the PS films was determined by ellipsometry before and after irradiation assuming the polymer film to have a refractive index of 1.592. PS films spin coated at 2,000 rpm from 10 mg/mL toluene solution had a thickness of ~45 nm. After photochemical immobilization, the unbound film was removed by extensive soaking (intermittent shaking) in toluene. The covalently attached PS layer was found to have an average thickness of about 6 nm.

Figure 2:
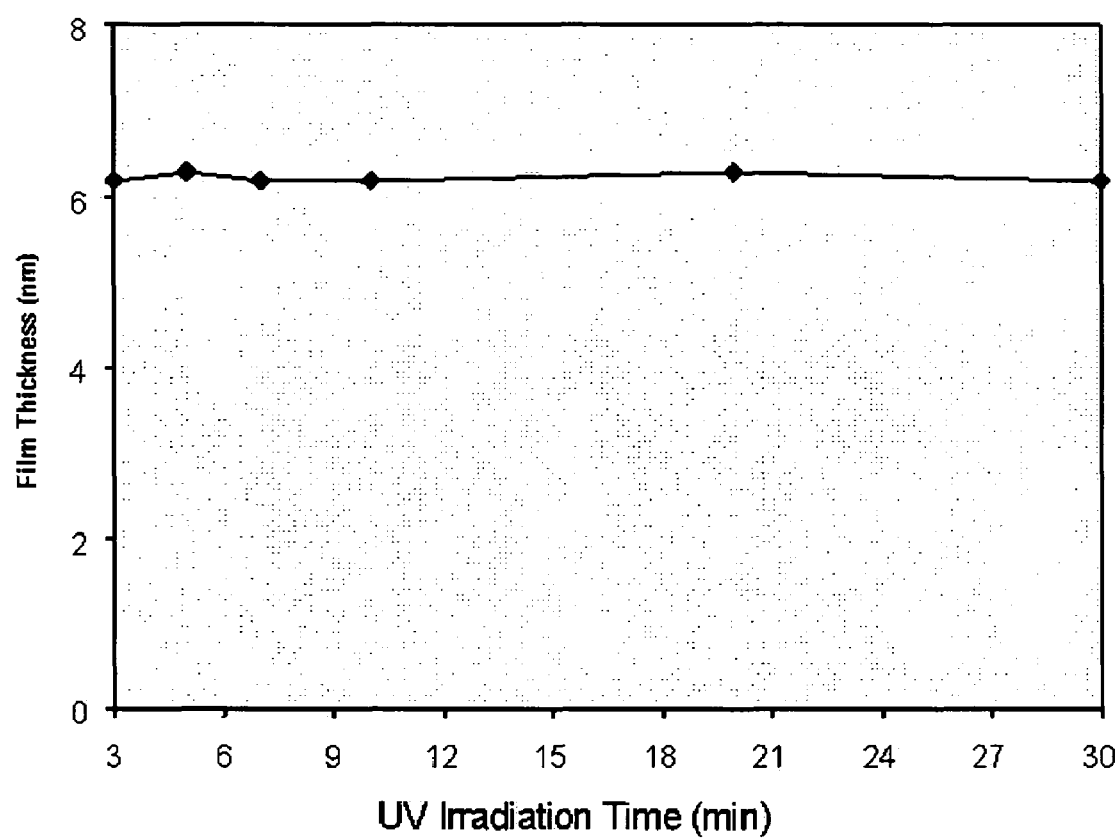
FIG. 2 is a graph of silane-functionalized, perfluorophenylazide(PFPA)-immobilized polystyrene (PS) film thickness (nm) (PS MWavg=280,000) versus ultraviolet (UV) irradiation time.

In order to ensure that the reaction was allowed to go to completion, irradiation times were adjusted. In FIG. 2, variations in the irradiation time revealed that no variation in film thickness occurred for times longer than 3 minutes, indicating that covalent bond formation between the azide and the PS is rapid.

Figure 3:
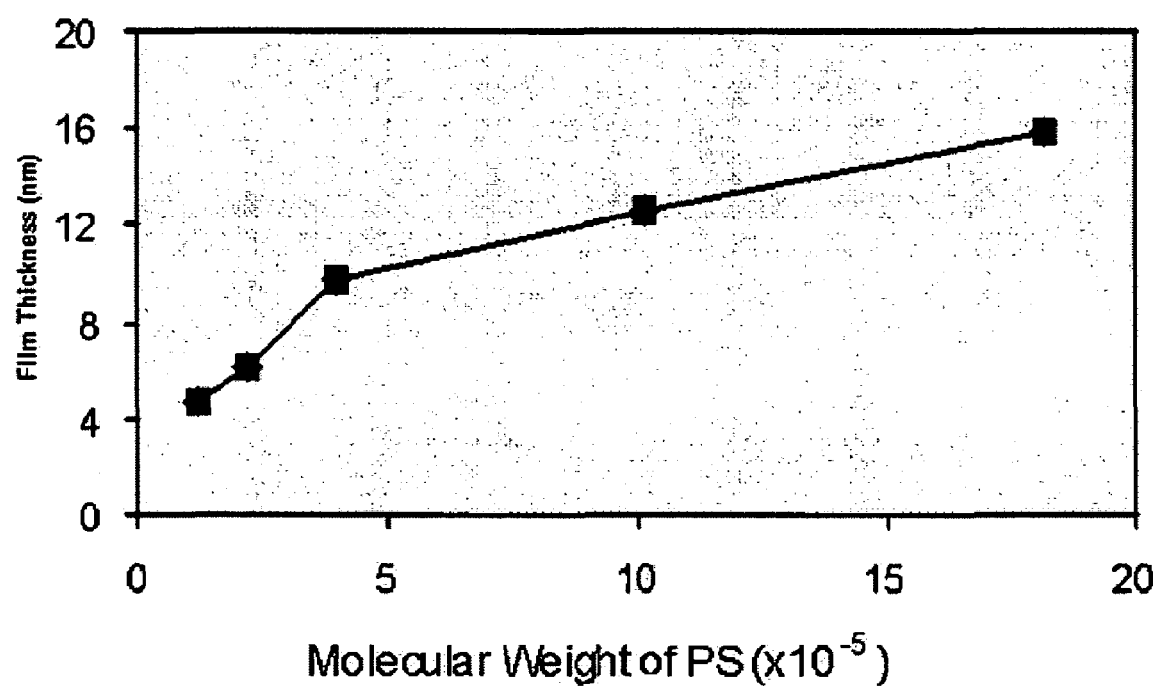
FIG. 3 is a graph of silane-functionalized, PFPA-immobilized PS film thickness (nm) versus PS molecular weight.

In another experiment, the dependence of PS film thickness on the molecular weight of the polymer was determined for monodisperse PS of molecular weight ranging from 280,000 to 1,815,000. Film thickness increased linearly from about 3 nm to about 15 nm as molecular weight increased (see FIG. 3). The slope of this line, and similar lines generated for other polymers, can be used to determine the molecular weight corresponding to a particular PS film thickness. For example, the slope of the linear portion of FIG. 3 is about 0.43 nm/Da× 10$^{-5}$. The molecular weight (MW) corresponding to a film thickness (FT) within the linear region can be approximated as MW=(FT−10)/0.43. PS with the highest molecular weight (1,815,000) yielded the thickest PS layer (15 nm). PS thin films were immobilized on silicon wafer surfaces via a UV-induced reaction of a silane-functionalized, perfluorophenyl azide. Films ranging from about 3 nm to about 15 nm were fabricated through variations in procedural conditions. In a working embodiment, the thinnest film was obtained when the PS concentration was 5 mg/mL and the molecular weight was 115,000, while the thickest film was produced when the PS concentration was 10 mg/mL and the molecular weight was 1,815,000.

This procedure is versatile due to the chemical reactivity of nitrenes, which can covalently bond to a variety of molecules and materials. For example, attachment and patterning of functional polymers and biomolecules, as well as construction of polymer arrays on solid substrates, may be applied to construction of novel chemical sensors and sensor arrays.

Example 3

Immobilization of PEOX on a Siliceous Substrate

A comprehensive study was conducted using poly(2-ethyl-2-oxazoline) (PEOX), MW 200,000 as the polymeric material. An azide-functionalized, silicon wafer substrate as described in Example 1 was prepared and coated with immobilized PEOX in the manner depicted in Scheme 1 above. The thickness of the PEOX films was examined by ellipsometry assuming the polymer film to have a refractive index of 1.520. PEOX films spin coated at 2,000 rpm for 60 seconds from 10 mg/mL chloroform solutions had a thickness of approximately 90 nm and were expected to be fairly uniform. The film was then covered by a 280 nm glass filter and irradiated for 5 minutes with UV light at an intensity of 16.6 mW/cm2 (irradiation time included a 1.75-2 minutes warm-up for the UV lamp to reach full power). The unbound polymer was removed by soaking in $CHCl_3$ for 24-48 hours, rinsed with $CHCl_3$ and dried under a stream of nitrogen. After photolysis for 5 minutes and removal of the unbound film, the covalently attached PEOX layer was found to have an average thickness of 3.2 nm.

Figure 4:
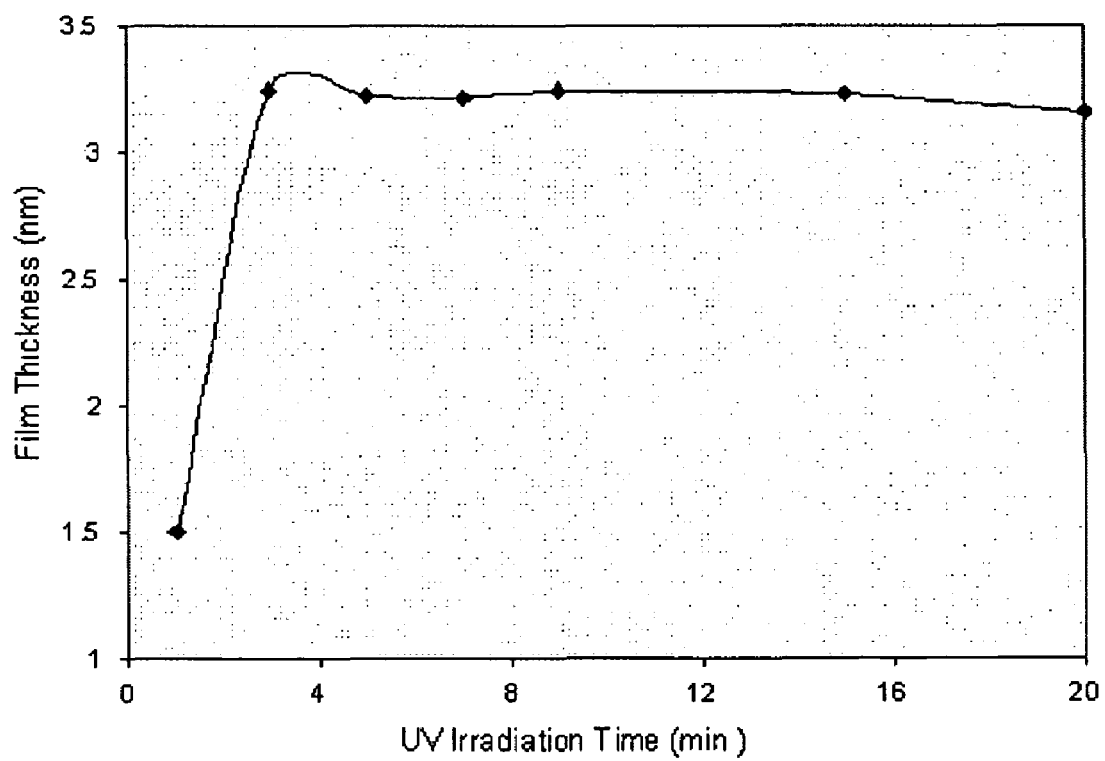
FIG. 4 is a graph of silane-functionalized, PFPA-immobilized poly(2-ethyl-2-oxazoline) (PEOX) film thickness (nm) versus UV irradiation time.

Variations in the irradiation time revealed the minimum time required to couple the azide and PEOX was about 3 minutes (including about 1.75-2 min warm-up time for the lamp to reach full power) (See FIG. 4). Since no change in polymer film thickness was observed at longer irradiation times (up to 20 minutes), 5 minutes was used.

Figure 5A:
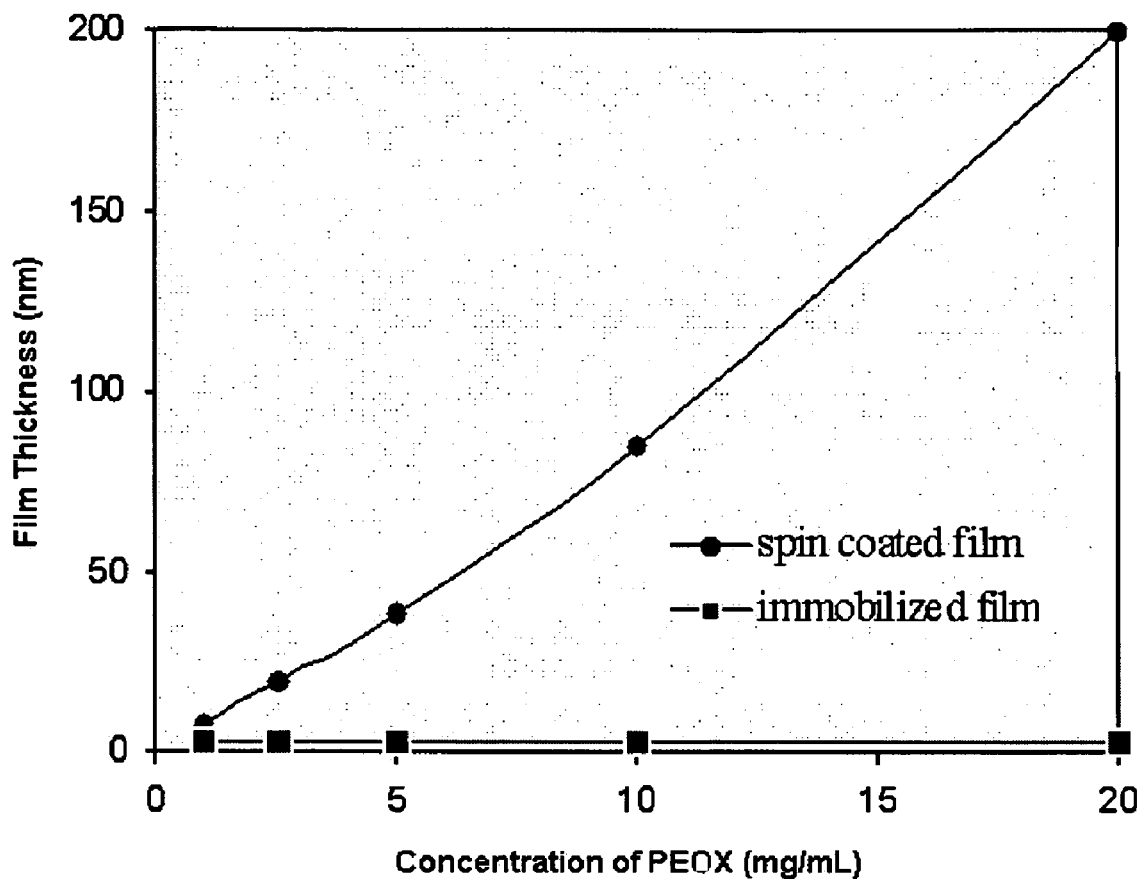
FIGS. 5A and 5B are both graphs of PEOX film thickness (nm) versus initial concentration of PEOX (MW 200,000) in chloroform for both spin-coated and silane-functionalized, PFPA-immobilized thin films.
Figure 5B:
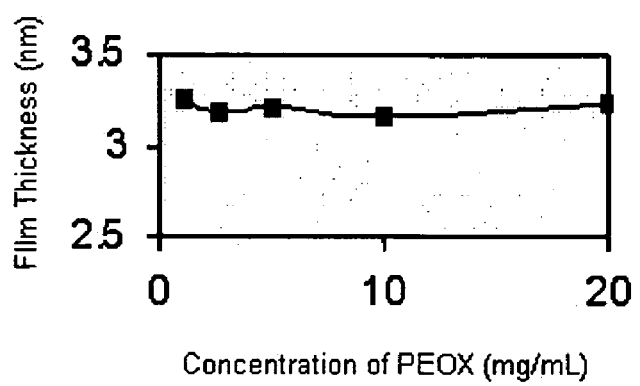

Spin coated PEOX films of various thicknesses were obtained by adjusting the polymer solution concentration (1-20 mg/mL). FIGS. 5A and 5B show that the final immobilized film thickness was between 3.1 nm and 3.2 nm for all concentrations of the spin coated polymers. This result was consistent with the mechanism proposed in Scheme 1. Since the C—H insertion reaction occurred at the interface between the nitrene intermediate and the adjacent polymer chains, thicker polymer films should have no effect on the thickness of the final immobilized polymer film. To ensure uniform coverage of the substrate, a polymer solution concentration of 10 mg/mL was used.

Figure 6:
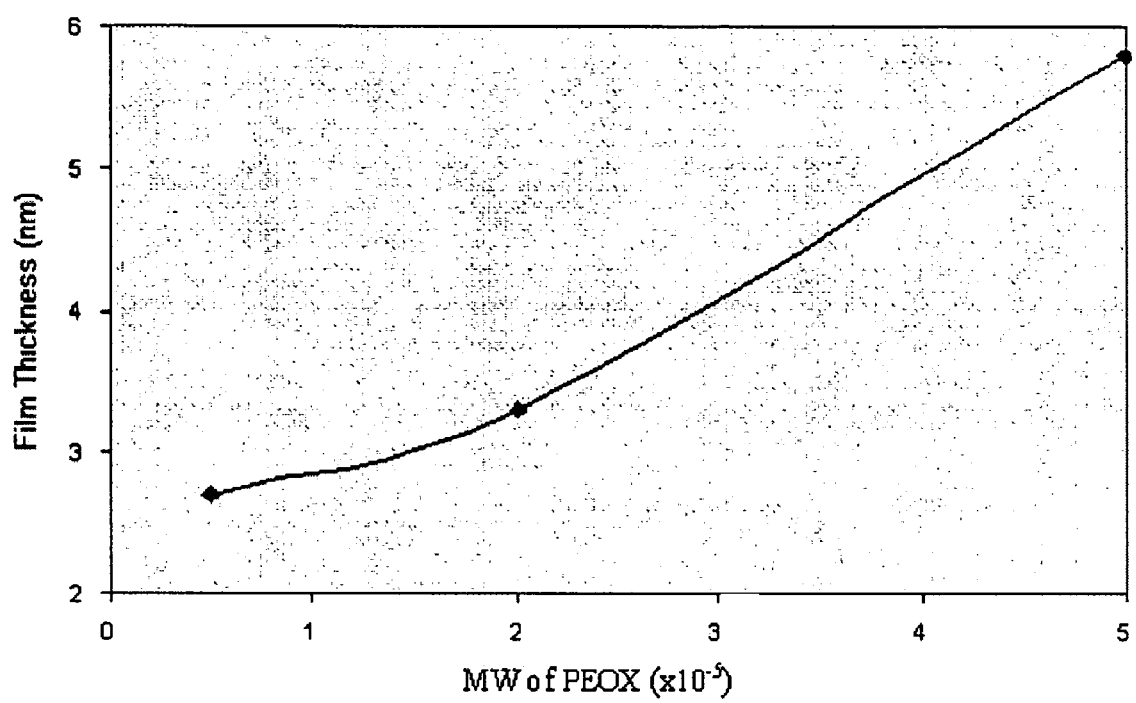
FIG. 6 is a graph of silane-functionalized, PFPA-immobilized PEOX film thickness (nm) versus PEOX molecular weight.

That photochemical immobilization occurred at the interface between the nitrene and the adjacent polymer chain suggests that the longer the polymer chain, the thicker the immobilized polymer film. To verify this, PEOX of various molecular weights were utilized and the resulting film thicknesses were measured. As expected, the film thickness increased with the molecular weight of PEOX (see FIG. 6). Thus, thicker films (about 6.0 nm) were generated using a higher molecular weight PEOX (500,000), while a lower molecular weight PEOX (50,000) produced films about 2.8 nm thick. As discussed in Example 2, the slope of the line shown in FIG. 6 can be used to determine the molecular weight corresponding to a particular PEOX film thickness.

Figure 7A:
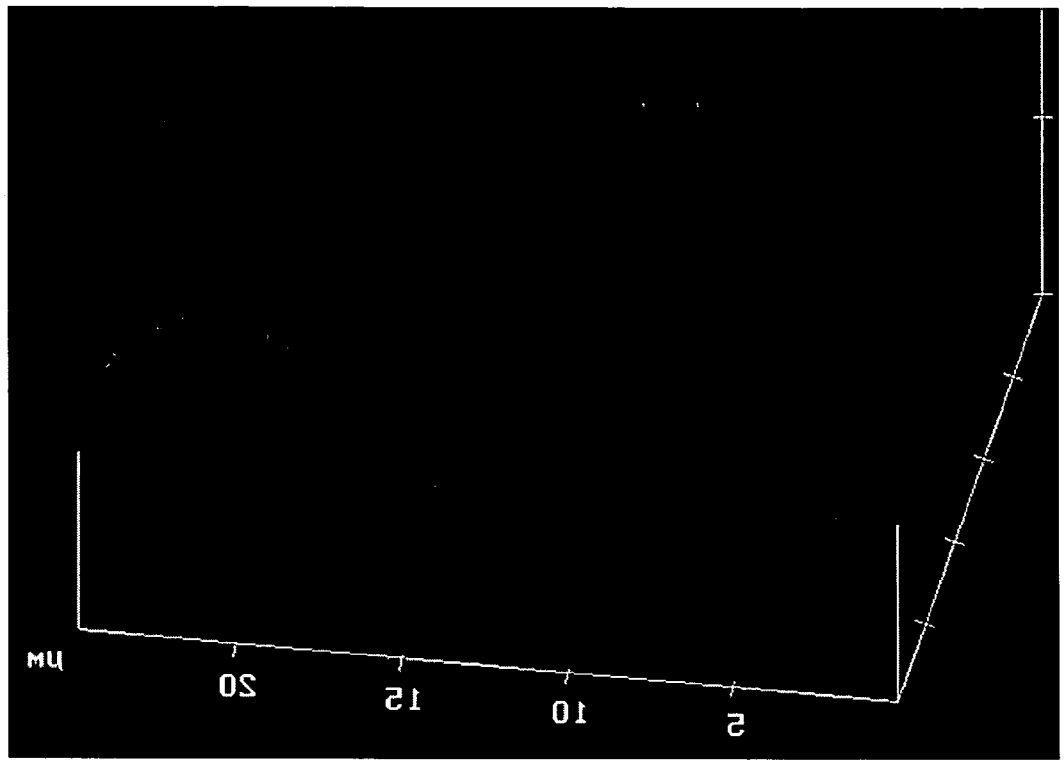
FIGS. 7A and 7B are, respectively, an atomic force microscopy (AFM) image of patterned PEOX film (MW 200,000) and a cross-sectional profile of the features shown in the AFM image of FIG. 7A.
Figure 7B:
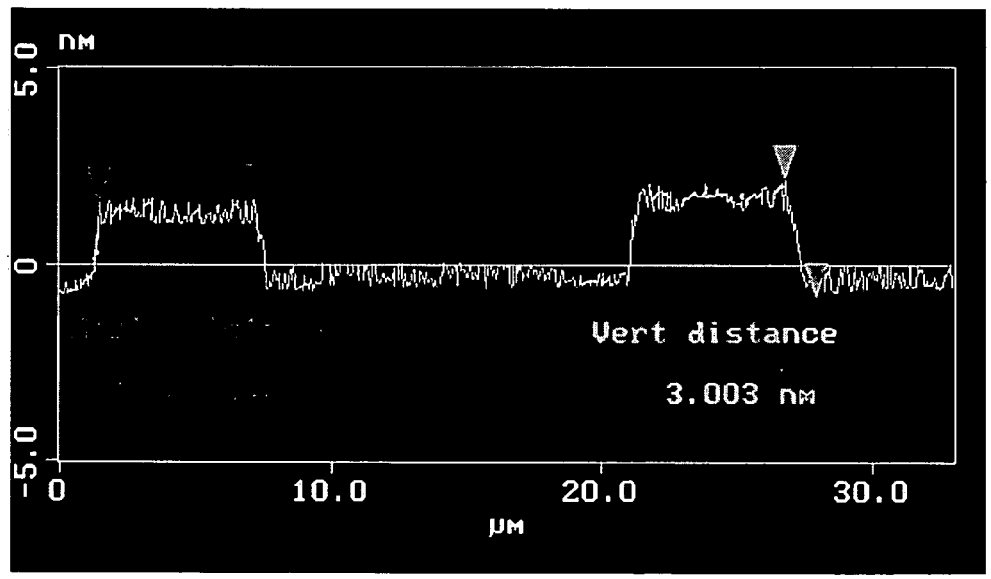

The photochemical nature of the immobilization chemistry enables the fabrication of polymer structures in a spatially defined fashion. To evaluate this procedure for use in patterning thin films, wafers spin-coated with PEOX were placed in direct contact with a quartz photomask while subjected to UV irradiation. After sonication in $CHCl_3$, PEOX films were observed only in the circular regions where UV light was permitted to pass through. FIG. 7A shows an Atomic Force Microscopy (AFM) image contrasting the adhered PEOX films and the derivitized wafer surface where the unattached polymer chains were removed. The cross-sectional profile, shown in FIG. 7B, showed a film thickness of about 3.0 nm, consistent with the ellipsometry results (about 3.1 to about 3.2 nm).

Example 4

Patterned PS and PEOX Arrays

Figure 8A:
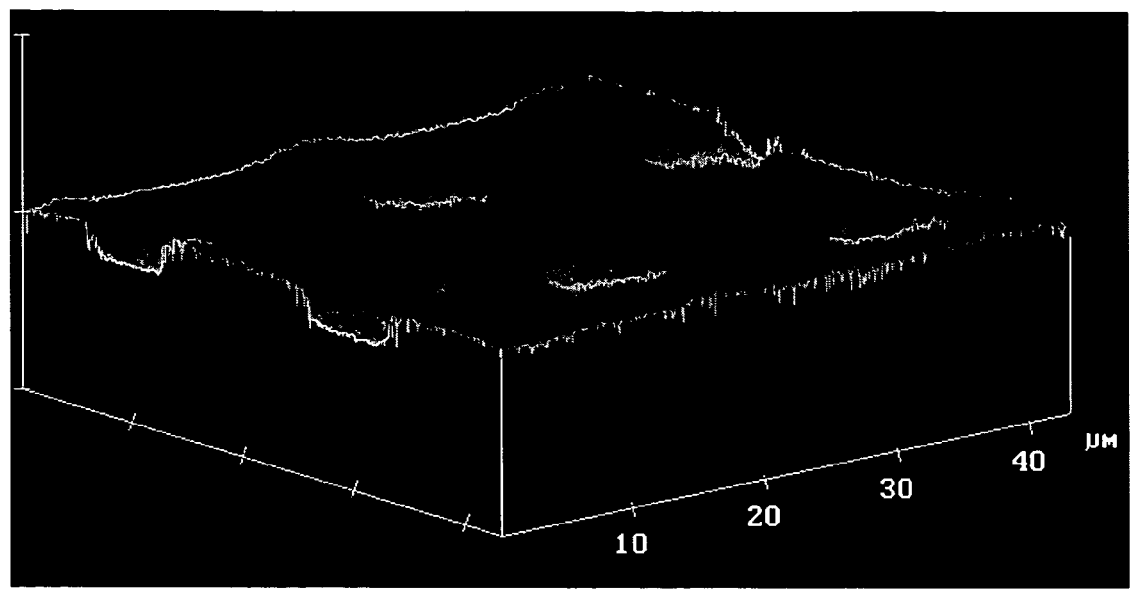
FIGS. 8A and 8B are, respectively, an AFM image of a PEOX/PS polymer array (MW 200,000 and 280,000, respectively) and a cross-sectional profile of the features shown in the AFM image of FIG. 8A.
Figure 8B:
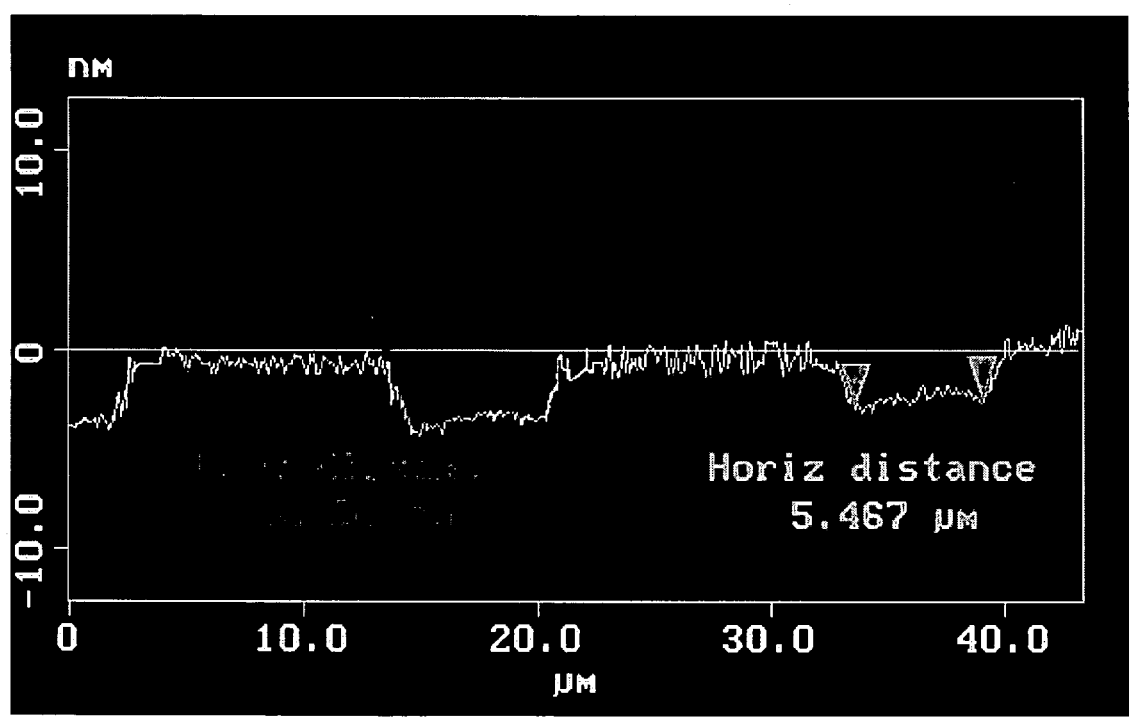

Fabrication of polymer arrays was possible after the unattached PEOX film was removed from the unexposed regions of the patterned, PEOX-coated wafer described in Example 2, leaving the unreacted azido groups on the wafer available for insertion into a second polymer film. This was accomplished by spin coating a second polymer (10 mg/ML PS in toluene) onto the surface of the PEOX patterned wafer followed by UV irradiation and solvent extraction of unattached polymer. Formation of the PEOX/PS polymer array was confirmed in an AFM image (FIG. 8A). The PEOX films (3.0 nm) resided in the circular regions while the PS film (6.4 nm) towered over the PEOX films, generating a surface with PS well walls and PEOX well bases. A cross-sectional profile (FIG. 8B) of this image confirmed that the 5.5 μm diameter PEOX films were maintained following the attachment of the PS film, indicating that the point of polymer film attachment is at the PFPA-silane derivitized wafer surface.

Figure 9A:
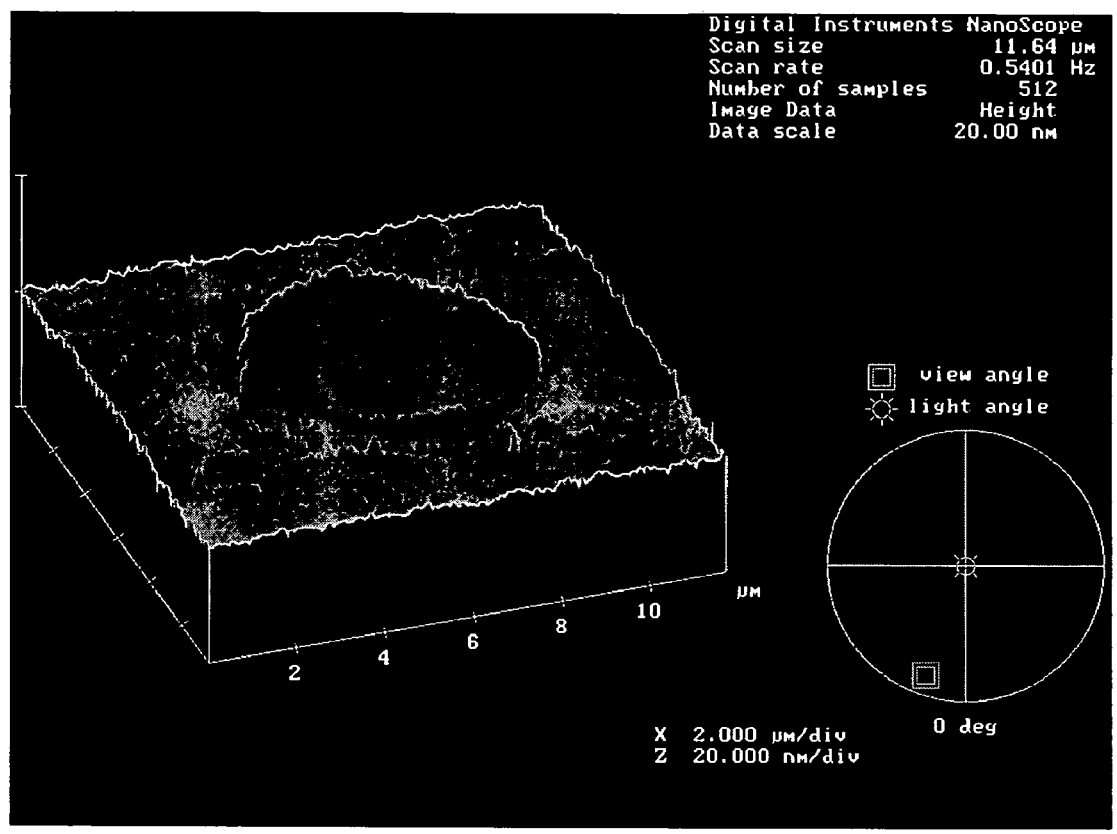
FIGS. 9A and 9B are, respectively, an AFM image of a PS/PEOX polymer array (MW 280,000 and 200,000 respectively) and a cross-sectional profile of the features shown in the AFM image of FIG. 9A.
Figure 9B:
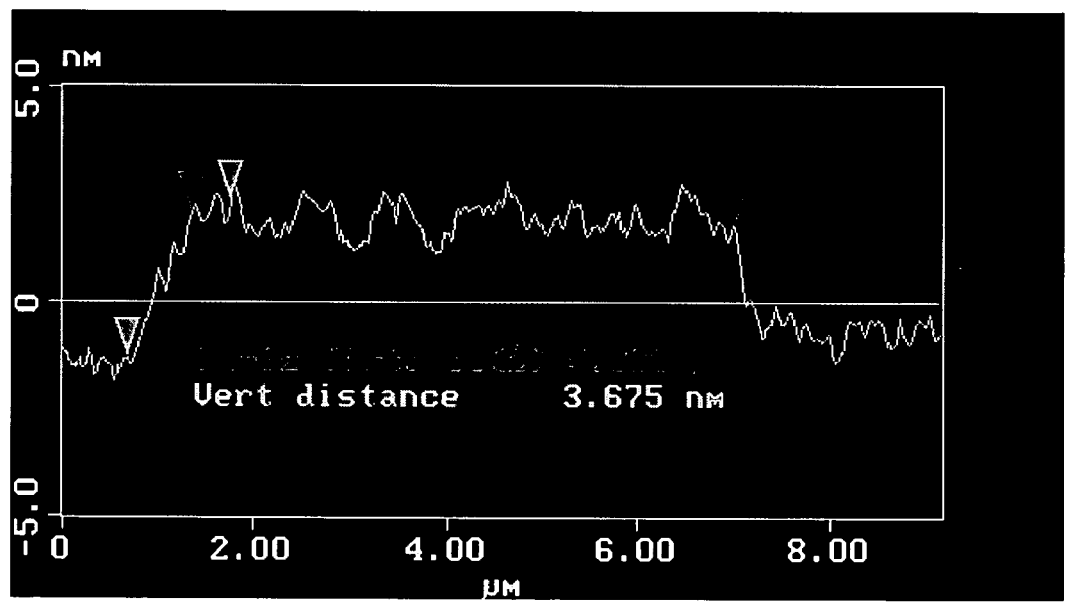

A second array structure was made by immobilizing PEOX on an azide-functionalized silicon wafer after circular PS films (6 nm) were patterned, and non-immobilized PS removed. Instead of wells, the addition of a PEOX film (3.1-3.2 nm) after immobilization of PS provides hydrophobic PS towers rising out of a plain of hydrophilic PEOX, due to the difference in film thickness for the two polymers. An AFM image of the array is shown in FIG. 9A. The AFM image and the cross-sectional profile shown in FIG. 9B illustrate the sharp PEOX and PS interface, which define each polymer film boundary. These results demonstrate the ability of this immobilization method to create not only spatially defined polymer hybrid arrays, but more importantly, arrays of polymers of differing heights resulting in surfaces with unique surface topographies.

This procedure is versatile due to the chemical reactivity of nitrenes, which can covalently bond to a myriad of molecules and materials. The functional group on the PFPA also can be tailored for attachment to a variety of substrates, allowing the generation of surfaces with specific chemical composition and/or morphologies. These thin film arrays may be applied to cell growth control and the construction of novel chemical sensors and sensor arrays, for example, after subsequent attachment of biomolecules to the polymer arrays using methods such as those found in U.S. Pat. No. 5,580,697 to Keana et al., U.S. Pat. No. 5,830,539 to Yan et al., and PCT publication WO 98/22541 naming Yan et al. as inventors, all of which are incorporated by reference herein.

Example 5

UV Immobilization of Polymer Thin Films

This example illustrates immobilization of polymeric thin films on substrates using UV-irradiation alone (i.e. without prior functionalization of the substrate). Surprisingly, thin polymeric films adhere to a substrate without prior functionalization. Even without functionalization of the substrate the thin films are resistant to removal by solvent extraction and/or sonication.

UV-Adhered Polystyrene Thin Films on a Silicon Substrate:

Silicon wafers were cut with a diamond pen and sonicated in isopropyl alcohol for 10 minutes, cleaned in piranha solution (7/3 v/v conc. $H_2SO4/H_2O_2$ 35 wt. %) for 1 hour at 80-90° C., washed thoroughly with water (100° C., 1 hour), and dried under a stream of nitrogen to provide a clean silicon wafer surface.

Figure 10:
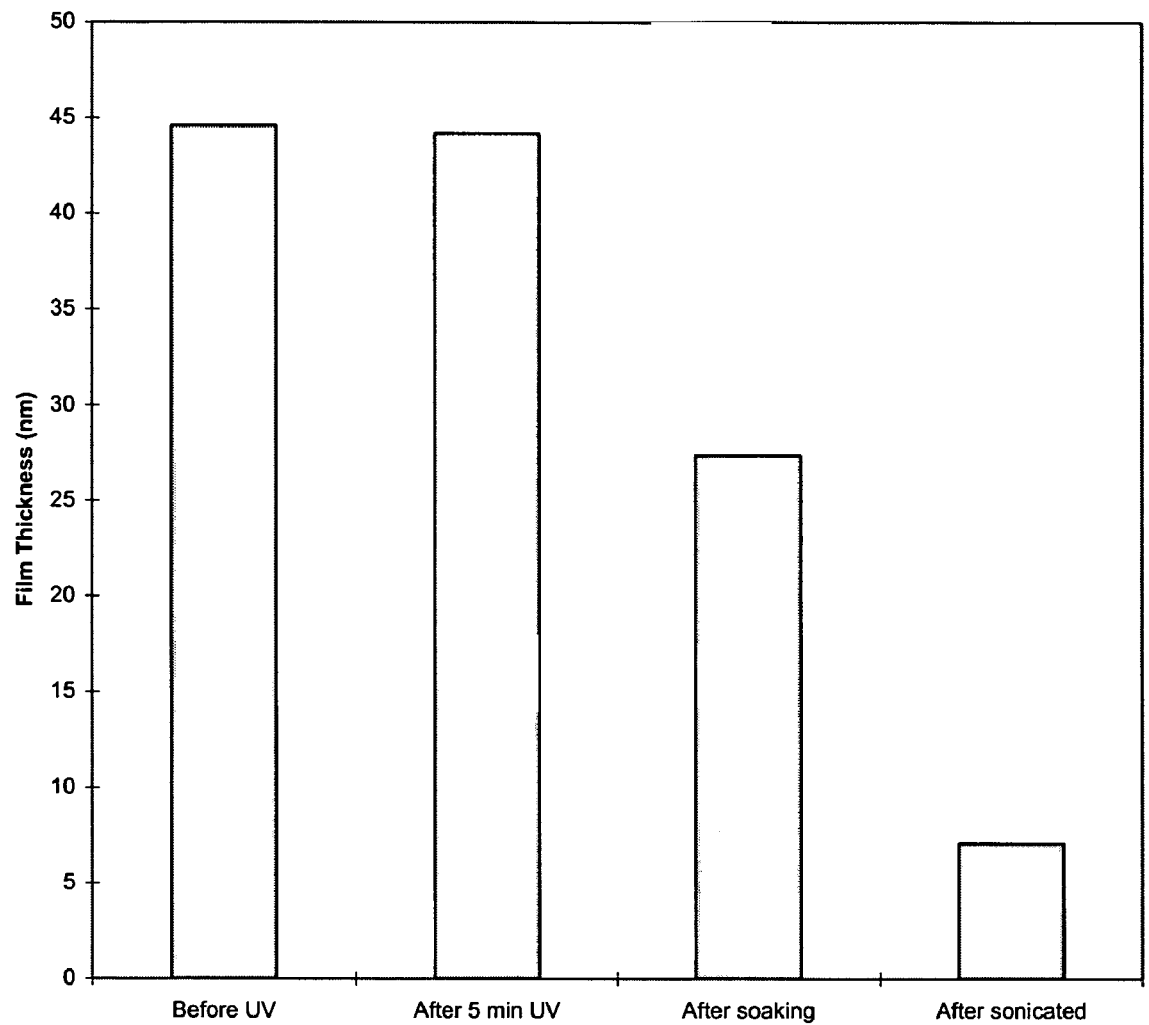
FIG. 10 is a bar-graph illustrating the thickness (nm) of an UV-immobilized PS thin film after various treatments.

A solution of polystyrene in toluene (10 mg/mL) was spin-coated onto the clean wafer surface at 2,000 rpm for 60 seconds. Photolysis of the thin film (medium pressure Hg lamp, 390 W, Hanovia) was performed for 5 minutes. The unbound polymer was extracted by toluene for 24-48 hours. To test the strength of the polystyrene adhesion, the wafers were sonicated in toluene for ten minutes. Measurements of the film thickness were taken at the following stages of the procedure using Gaertner Model L116A ellipsometer at an incident angle of 70° (±3% error): after application of polystyrene and before UV irradiation, after UV irradiation, after 24-48 hours of soaking, and after sonicating. FIG. 10 shows that the spin-coated PS thin film shrinks slightly upon UV illumination. Soaking in toluene reduces the thickness to about 28 nm and sonication surprisingly fails to remove the film completely, leaving a PS film with a thickness of about 7 nm.

Figure 11:
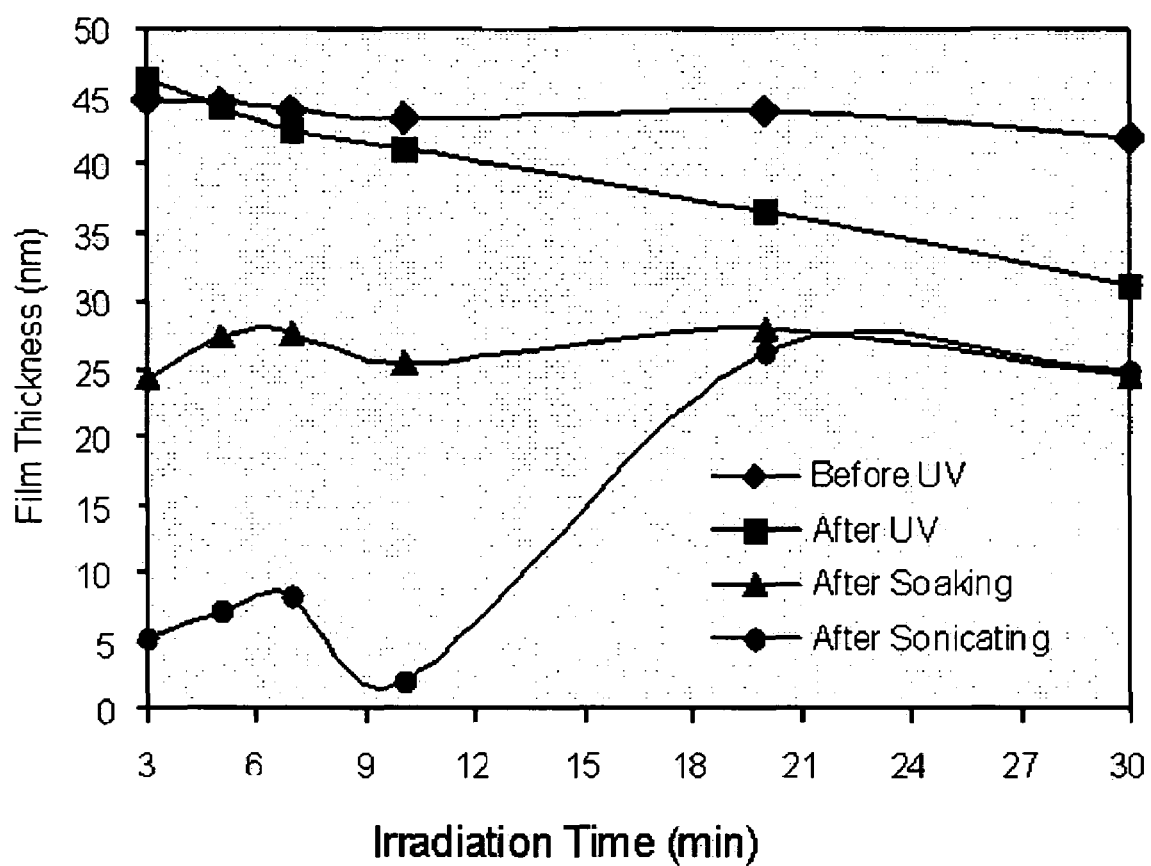
FIG. 11 is a graph illustrating the thickness (nm) of UV-immobilized PS thin films versus UV irradiation time (min.).

The thickness of UV-immobilized polystyrene thin films as a function of UV irradiation time is shown in FIG. 11. A solution of polystyrene in toluene (10 mg/mL) was spin-coated onto several clean wafers at 2,000 rpm for 60 seconds. Photolysis of the thin film (medium pressure Hg lamp, 390 W, Hanovia) was performed for various lengths of time. The samples were allowed to soak in toluene for 24-48 hours. To test the strength of the polystyrene adhesion, the wafers were sonicated in toluene for ten minutes. Ellipsometric measurements of the film thickness were taken at the following stages of the procedure: after application of polystyrene and before UV irradiation (about 45 nm), after UV irradiation (between about 35 nm and about 45 nm, depending on irradiation time), after 24-48 hours of soaking (between about 24 nm and about 28 nm, depending on irradiation time), and after sonicating (between about 2 nm and about 27 nm, depending upon irradiation time). Similar results were obtained for PS thin films irradiated under an argon blanket.

UV-Adhered Polystyrene Thin Films on Gold Substrate:

Polystyrene thin films were immobilized on a gold substrate that was prepared by evaporating gold thin films on silicon wafers. The wafers were cleaned in piranha solution (7/3 v/v conc. $H_2SO_4/H_2O_2$ 35 wt. %) for 10 seconds at 80-90° C., washed thoroughly with water (100° C., 1 hour), and dried under a stream of nitrogen to provide a clean gold surface.

A solution of polystyrene with a molecular weight of 1,815,000 in toluene (10 mg/mL) was spin-coated onto a clean gold surface at 2,000 rpm for 60 seconds. Photolysis of the thin film (medium pressure Hg lamp, 390 W, Hanovia) was performed for 5 minutes. The unbound polymer was extracted by toluene for 24 hours. Ellipsometric measurements of the film thickness were taken at the following stages of the procedure: after application of polystyrene and before UV irradiation, and after UV irradiation and after 24 hours of soaking. The non-irradiated thin film measured approximately 130 nm and decreased to about 80 nm after irradiation and solvent extraction.

Figure 12:
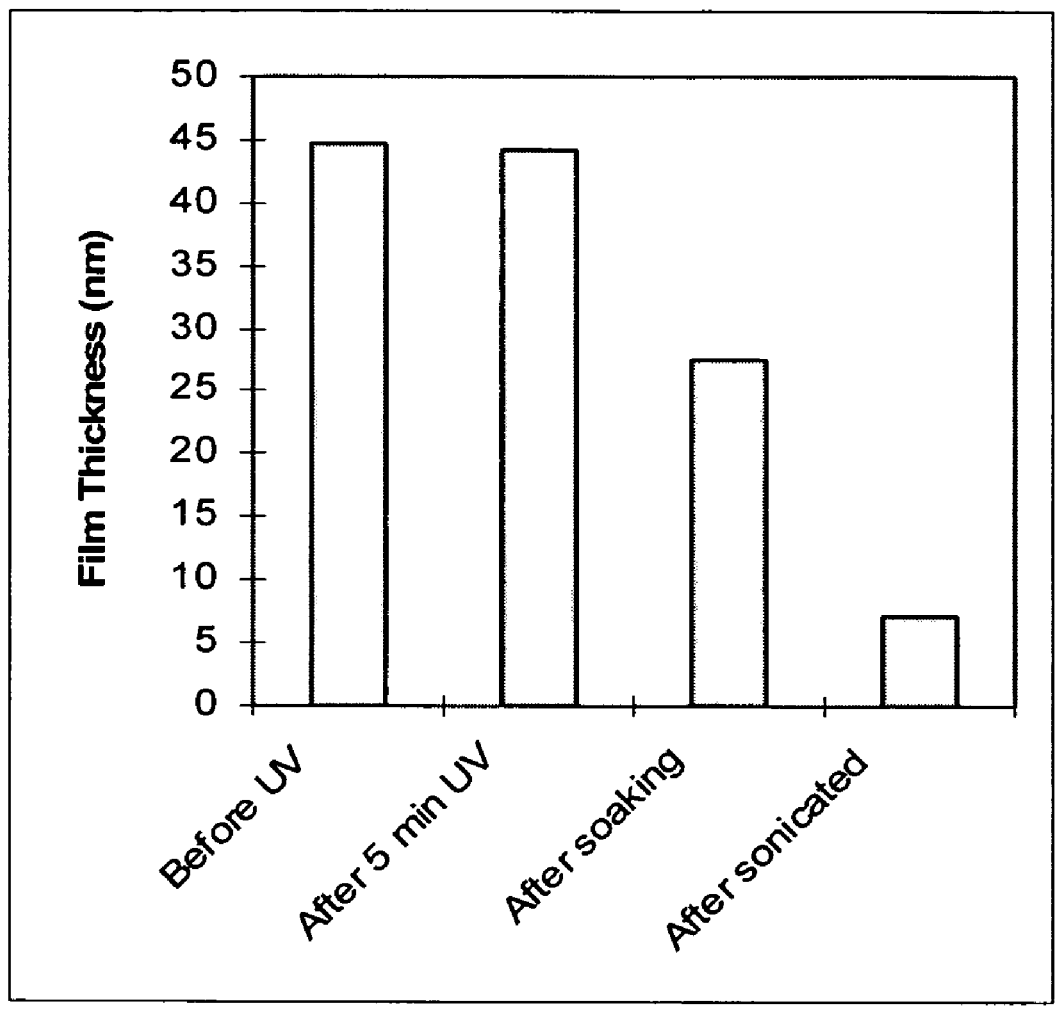
FIG. 12 is a bar-graph illustrating the thickness (nm) of UV-immobilized polyvinylpyrrolidone (PVP) thin film after various treatments.

UV-Adhered Poly(vinylpyrrolidone) Thin Films:

A solution of poly(vinylpyrrolidone) in chloroform (10 mg/mL) was spin-coated onto a clean silicon wafer surface at 2,000 rpm for 60 seconds. Photolysis of the thin film (medium pressure Hg lamp, 390 W, Hanovia) was performed for 5 minutes. The unbound polymer was extracted by chloroform for 24-48 hours. Ellipsometric measurements of the film thickness were taken at the following stages of the procedure: after application of poly(vinylpyrrolidone) and before UV irradiation, after UV irradiation, and after 24-48 hours of soaking. The film thickness following each of these treatments is shown in FIG. 12. The PVP layer appears to shrink only slightly upon UV-illumination (from about 85 nm to about 84 nm) and a layer of about 45 nm remains on the substrate after soaking.

Figure 13:
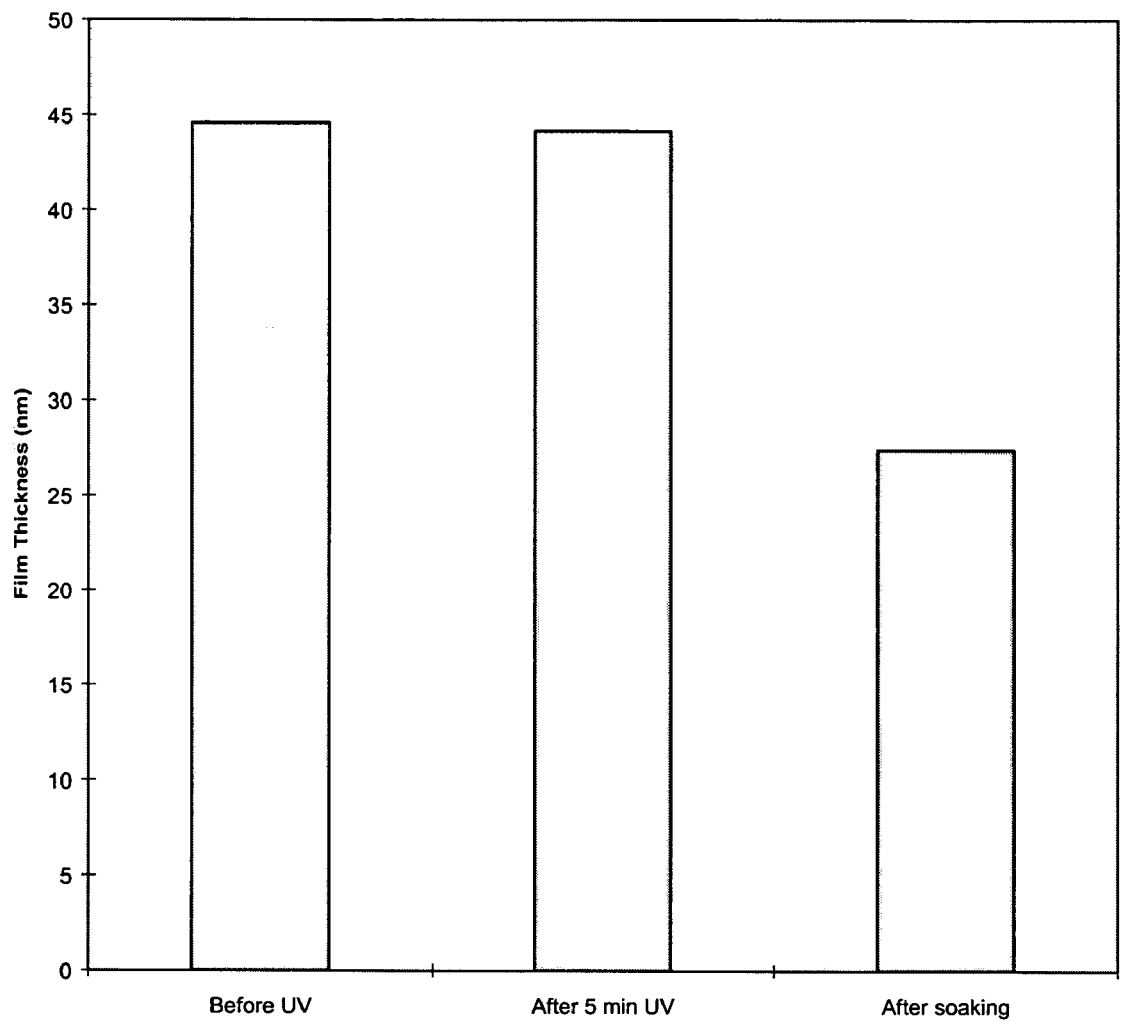
FIG. 13 is a bar-graph illustrating the thickness (nm) of UV-immoblized polyvinylchloride (PVC) thin film after various treatments.

UV-Adhered Poly(vinyl chloride) Thin Films:

A solution of poly(vinyl chloride) in THF (10 mg/mL) was spin-coated onto a clean silicon wafer surface at 2,000 rpm for 60 seconds. Photolysis of the thin film (medium pressure Hg lamp, 390 W, Hanovia) was performed for 5 minutes. The unbound polymer was extracted by THF for 24-48 hours. Ellipsometric measurements of the film thickness were taken at the following stages of the procedure: after application of poly(vinyl chloride) and before UV irradiation, after UV irradiation, and after 24-48 hours of soaking. The film thickness following each treatment is illustrated in FIG. 13. The PVC layer shrinks only slightly upon UV-illumination (from about 45 nm to about 43 nm) and a film of about 28 nm remains on the substrate after soaking.

UV-Adhered Poly(4-vinylpyridine) Thin Films on a Silicon Substrate

Solutions of P4VP ($M_w$ ca. 160,000) in either $CHCl_3$, $CH_2Cl_2$, or BuOH (10 mg/mL) were spin-coated onto clean silicon wafers at 2000 rpm for 60 seconds. The film was irradiated with a 390 W medium-pressure Hg lamp at room temperature in air for 5 minutes. The unbound polymer was removed by soaking in the corresponding solvent (either $CHC_3$, $CH_2Cl_2$, or BuOH) for approximately 24 hours. The thickness of the P4VP film was determined with a Gaertner Model L116A ellipsometer at the incident angle of 70°. Measurements were made in three different areas of the samples and averaged. A solvent extraction in the corresponding solvent was preformed for ~24 hours to remove any unbound polymer. P4VP films, which were extracted in either $CH_2Cl_2$ or BuOH, showed a slight decrease in the film thickness. This was expected due to the removal of unbound polymer. However, P4VP films that were extracted in $CHCl_3$ increased in thickness by approximately 30% (Table 3). Samples that were first prepared and extracted in $CH_2Cl_2$ followed by an additional extraction in $CHCl_3$ resulted in the same ~30% increase in thickness. The immobilized films were fairly robust. Sonication of the films in $CHCl_3$ for 60 minutes did not result in changes in the film thickness.

TABLE 3

P4VP Film Thickness after Solvent Extraction

| | Film Thickness (nm) | | |
|---|---|---|---|
| | $CHCl_3$ | $CH_2Cl_2$ | BuOH |
| Initial | 93.8 ± 0.5 | 123.6 ± 1.3 | 52.5 ± 0.3 |
| After Irradiation | 95.3 ± 0.6 | 125.0 ± 0.8 | 51.4 ± 0 |
| After solvent extraction | 123.0 ± 0.7 | 120.3 ± 0.4 | 48.3 ± 0.1 |
| % increase | 31.1% | −2.7% | −8.0% |

Contact angle corresponds directly to the hydrophobicity and/or hydrophilicity of a surface. The contact angle of P4VP films extracted in $CHCl_3$ was significantly lower than that of films extracted in $CH_2Cl_2$ (Table 4). Furthermore, treatment of CHCl3-extracted films using triethylamine (TEA) returned the films to their original contact angle. This result indicates that protonation likely occurred during extraction with $CHCl_3$. To generate the results presented in Table 4, the films were rinsed with toluene and dried thoroughly after solvent extraction and soaking in TEA. This was done to insure removal of any residual solvent. The contact angles were taken with distilled $H_2O$.

TABLE 4

P4VP Film Contact Angle after Solvent Extraction

| | $CH_2Cl_2$ | $CHCl_3$ |
|---|---|---|
| Initial spin-coated film | ~55° | ~45° |
| After UV & 24 hr extraction | ~35-40° | ~5-10° |
| After UV, extraction, and 10 min soak in TEA | ~40° | ~41° |

Figure 14:
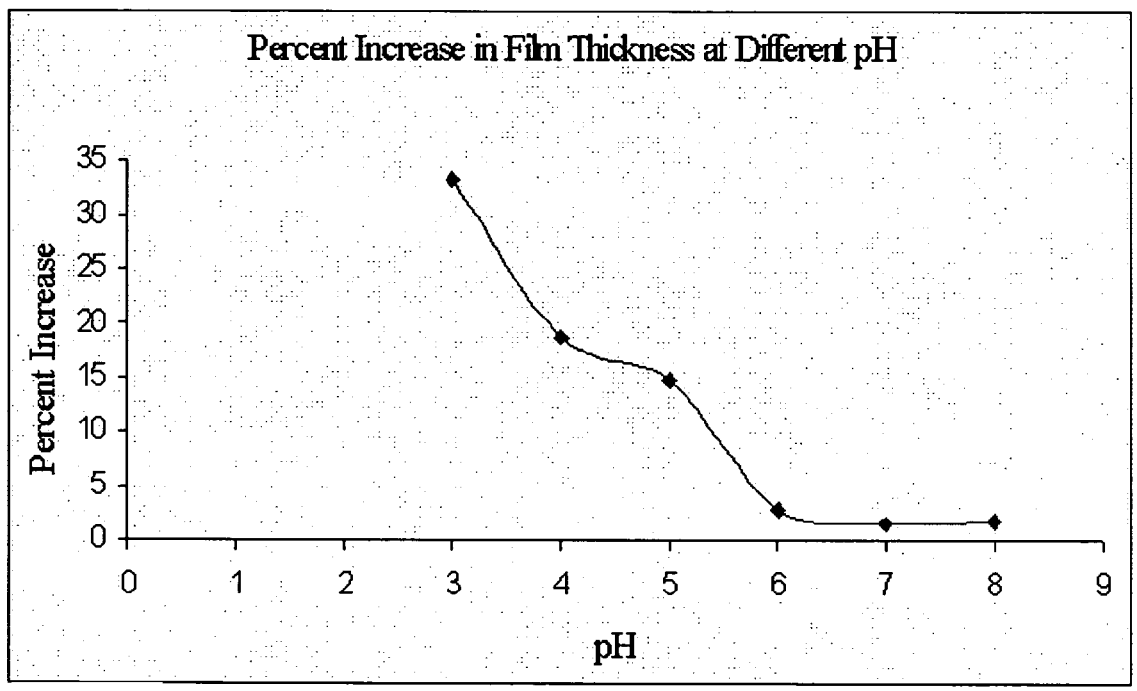
FIG. 14 is a graph of percent increase in poly(4-vinylpyridine) (P4VP) film thickness versus pH for a P4VP film extracted in chloroform and placed in $NaH_2PO_4/Na_2HPO_4$ buffered solutions at various pH for 10 min.

The increase in film thickness was pH dependent. Irradiated P4VP films extracted in $CH_2Cl_2$ were placed in NaH$_2$PO$_4$/Na$_2$HPO$_4$ buffered solutions at various pH for 10 min. Films increased in thickness at pH values less than 6 with the most significant increase (~34%) near pH 3. These results are summarized in FIG. 14.

The swelling of P4VP in the presence of chloroform, but not in the presence of certain other solvents, can serve as the basis for a sensor to identify chloroform. For example, a sensor can be constructed comprising a P4VP film attached to a substrate. Swelling of the P4VP film in the presence of an analyte would suggest that the analyte contains chloroform. The P4VP film can be combined with other polymeric films on the same substrate. The changes in physical properties seen in each polymeric film after exposure to an analyte can help identify that analyte. The combined changes on each polymeric film after exposure to an analyte can serve as a fingerprint for that analyte.

Example 6

UV-Adhered Patterned Thin Films

This example illustrates formation of patterned arrays using the UV-immobilization methods discussed in Example 4 above.

Figure 15A:
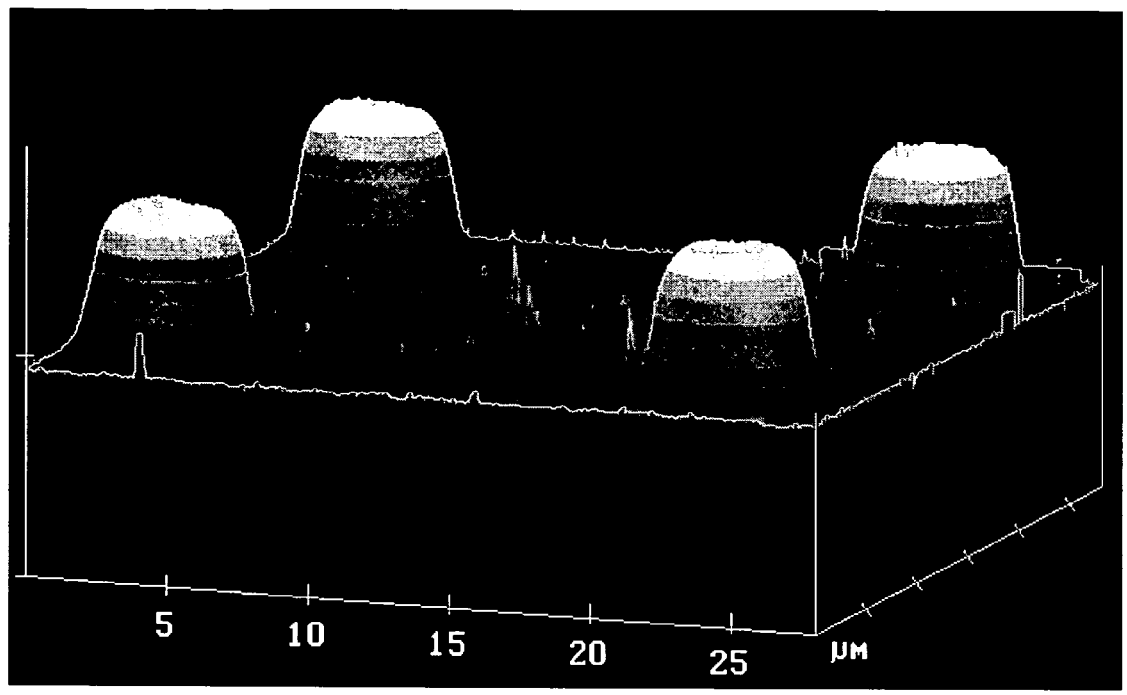
FIGS. 15A and 15B show, respectively, a 3-dimensional AFM image and a cross-sectional profile of a portion of PS UV-adhered structures on a silicon substrate.
Figure 15B:
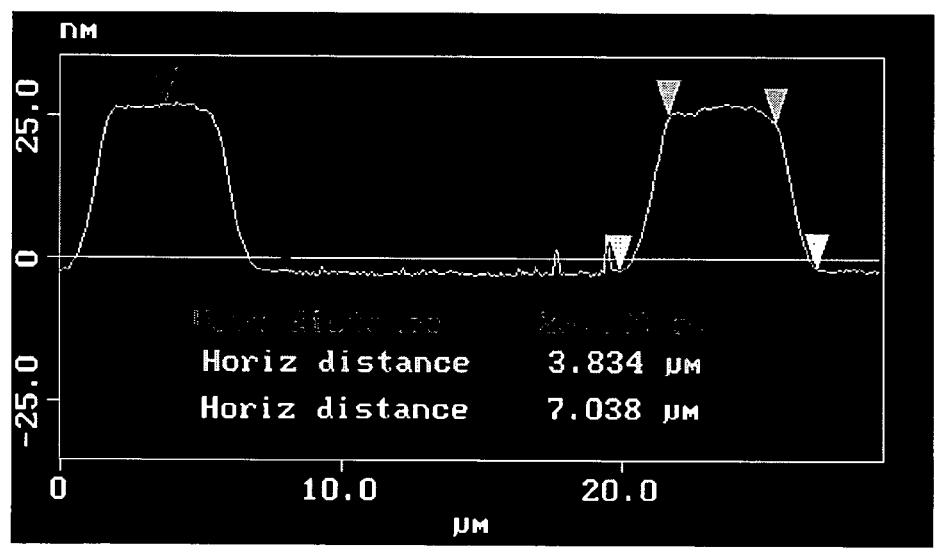

Polystyrene UV-Adhered Structures on Silicon Substrates:

A solution of polystyrene with a molecular weight of 280,000 in toluene (10 mg/mL) was spin-coated onto a clean wafer at 2,000 rpm for 60 seconds. A quartz mask containing circles with diameters approximately 5.5 µm was held in place over the wafer via vacuum. Photolysis of the thin film (medium pressure Hg lamp, 390 W, Hanovia) was performed for 15 minutes. The unbound polymer was extracted by toluene for 24-48 hours. FIGS. 15A and 15B show, respectively, the 3-dimensional AFM image and the cross-sectional profile of a portion of the sample. The image and the cross-sectional profile show raised portions ("towers") where the PS adhered.

Figure 16A:
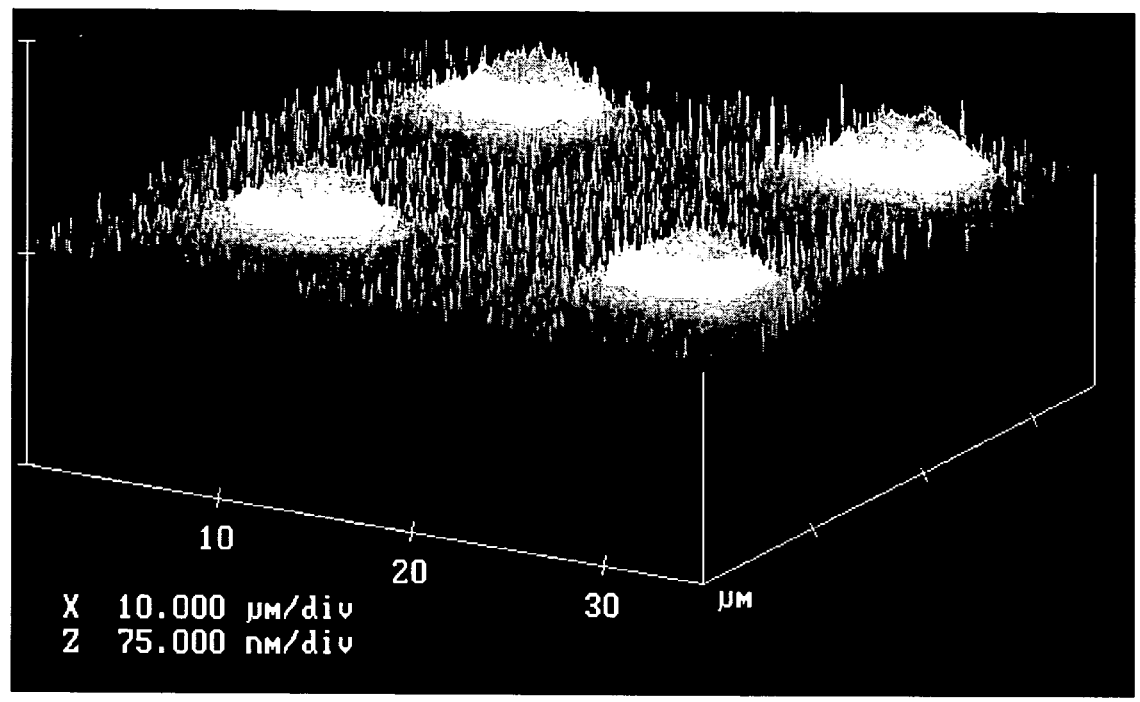
FIGS. 16A and 16B show, respectively, the 3-dimensional AFM image and the cross-sectional profile of PS UV-adhered structures on a gold substrate.
Figure 16B:
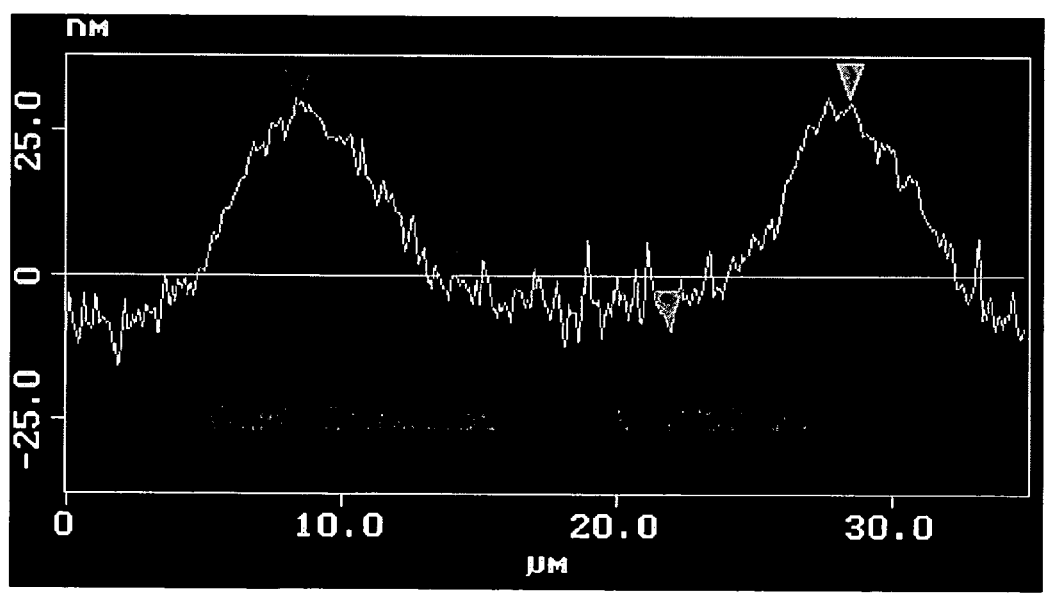

Polystyrene UV-Adhered Structures on Gold Substrates:

A solution of polystyrene with a molecular weight of 1,815,000 in toluene (10 mg/mL) was spin-coated onto a clean gold surface at 2,000 rpm for 60 seconds. A quartz mask containing circles with diameters approximately 5.5 µm was held in place over the wafer via vacuum. Photolysis of the thin film (medium pressure Hg lamp, 390 W, Hanovia) was performed for 10 minutes. The unbound polymer was extracted by toluene for 24-48 hours. FIGS. 16A and 16B show, respectively, the 3-dimensional AFM image and the cross-sectional profile of a portion of the sample. The image and the cross-sectional profile show raised portions ("towers") where the PS adhered.

Figure 17A:
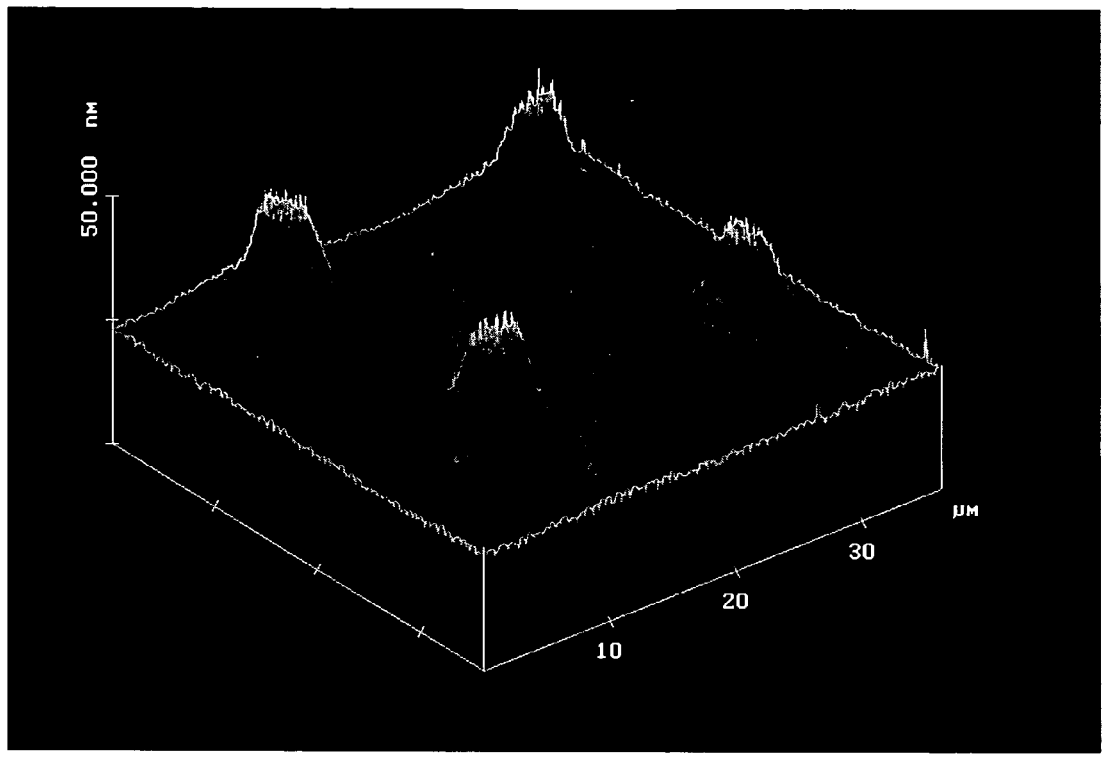
FIGS. 17A and 17B are, respectively, a 3-dimensional AFM image and a cross-sectional profile of a patterned array prepared by UV-immobilization of PS with MW=1.8 MDa followed by UV-immobilization of PS with MW=280 kDa.
Figure 17B:
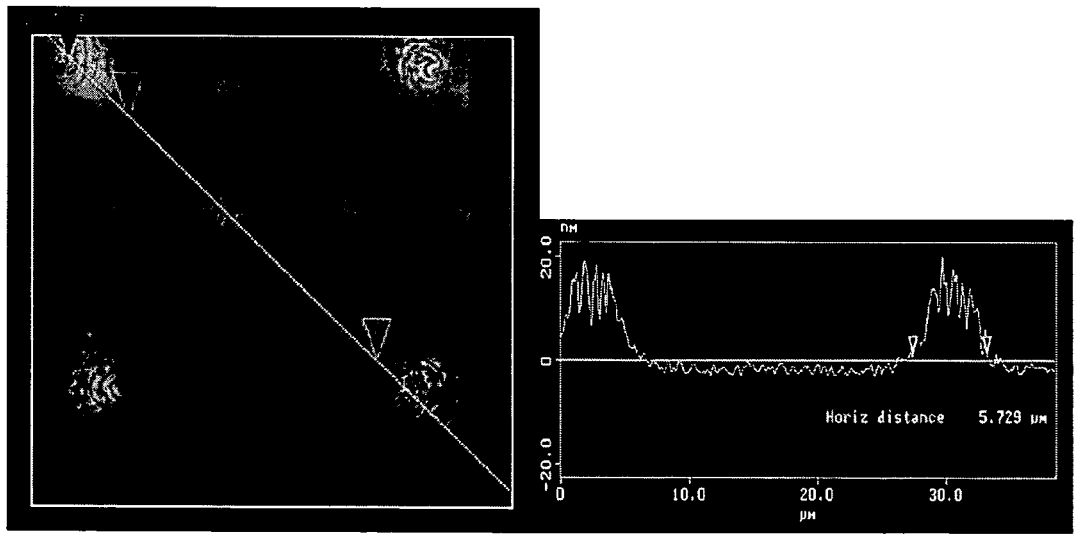

PS/PS UV-Adhered Arrays:

A solution of polystyrene with a molecular weight of 1,815,000 in toluene (10 mg/mL) was spin-coated onto a clean wafer at 2,000 rpm for 60 seconds. A quartz mask containing circles with diameters approximately 5.5 µm was held in place over the wafer via vacuum. Photolysis of the thin film (medium pressure Hg lamp, 390 W, Hanovia) was performed for 15 minutes. The unbound polymer was extracted by toluene for 24-48 hours. The sample was then spin-coated with a solution of polystyrene with a molecular weight of 280,000 in toluene (10 mg/mL) at 2,000 rpm for 60 seconds and irradiated for 15 minutes. The unbound polymer was extracted by toluene for 24-48 hours. FIGS. 17A and 17B show, respectively, the 3-dimensional AFM image and the cross-sectional profile of a portion of the sample. The image and the cross-sectional profile show raised portions ("towers") where the higher MW PS was first adhered, surrounded by PS of the lower MW, the towers being defined by the interface between the two polymeric materials.

Figure 18A:
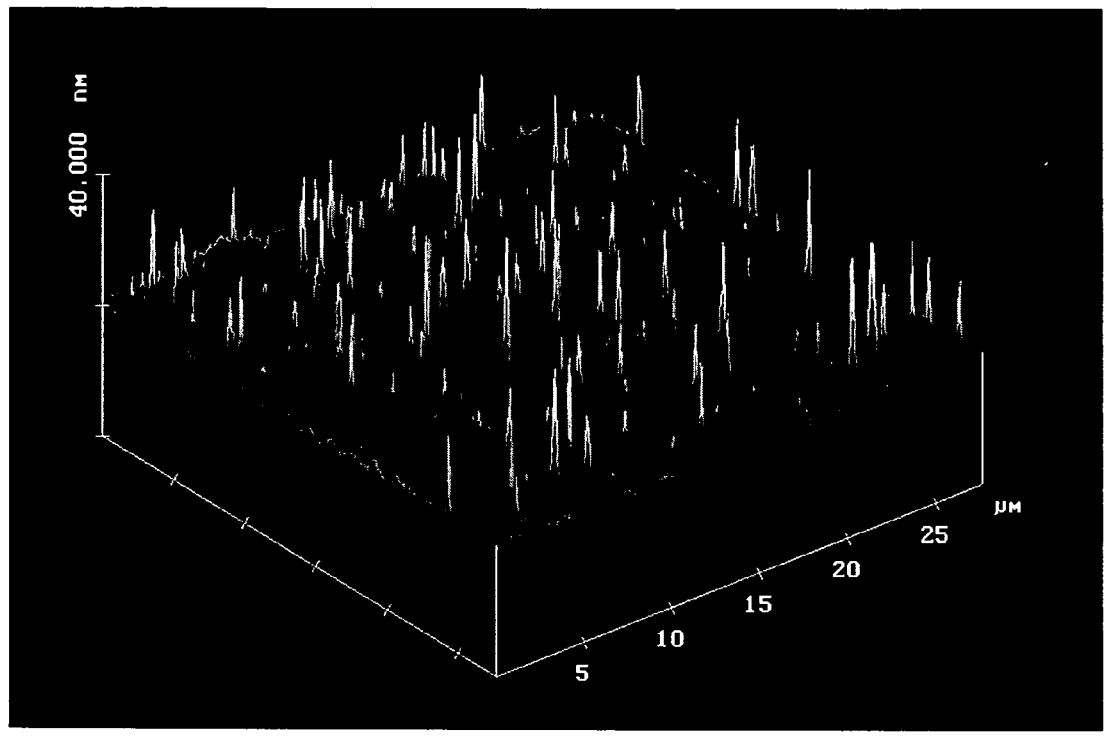
FIGS. 18A and 18B are, respectively, a 3-dimensional AFM image and a cross-sectional profile of a patterned array prepared by UV-immobilization of PS with MW=280 kDa followed by UV-immobilization of PS with MW=1.8 MDa.
Figure 18B:
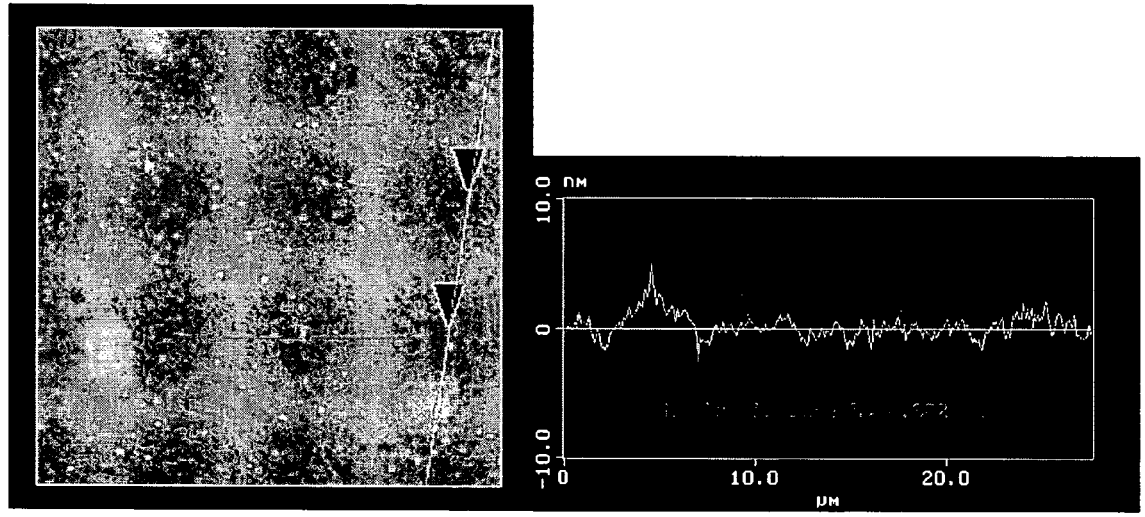

Another patterned array of PS with different molecular weights was prepared as follows. A solution of polystyrene with a molecular weight of 280,000 in toluene (10 mg/mL) was spin-coated onto a clean wafer at 2,000 rpm for 60 seconds. A quartz mask containing circles with diameters approximately 5.5 µm was held in place over the wafer via a vacuum. Photolysis of the thin film (medium pressure Hg lamp, 390 W, Hanovia) was performed for 10 minutes. The unbound polymer was extracted by toluene for 24-48 hours. The sample was then spin-coated with a solution of polystyrene with a molecular weight of 1,815,000 in toluene (10 mg/mL) at 2,000 rpm for 60 seconds and irradiated for 10 minutes. The unbound polymer was extracted by toluene for 24-48 hours. FIGS. 18A and 18B show the 3-dimensional image and the cross-sectional profile of a portion of the sample. The spikes in the 3-dimensional image are believed to be artifacts caused by contamination of the sample. The image and the cross-sectional profile reveal small wells having a bottom comprised of the lower MW PS with the higher MW PS surrounding them, the wells being defined by the interface between the two polymeric materials.

Figure 19A:
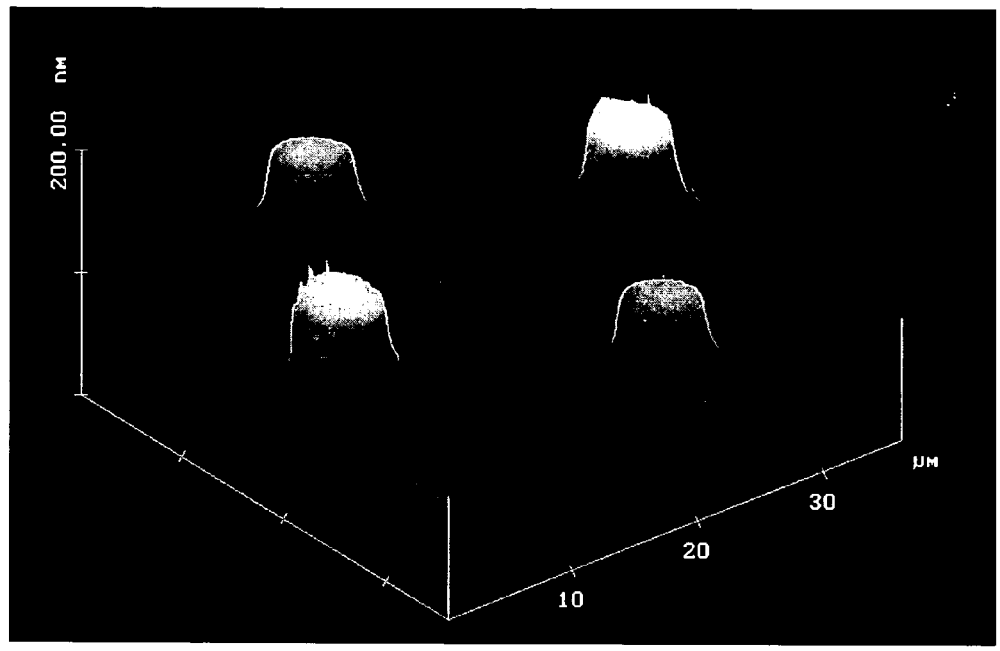
FIGS. 19A and 19B are, respectively, a 3-dimensional AFM image and a cross-sectional profile of a patterned array prepared by UV-immobilization of PVP followed by UV-immobilizaiton of PS.
Figure 19B:
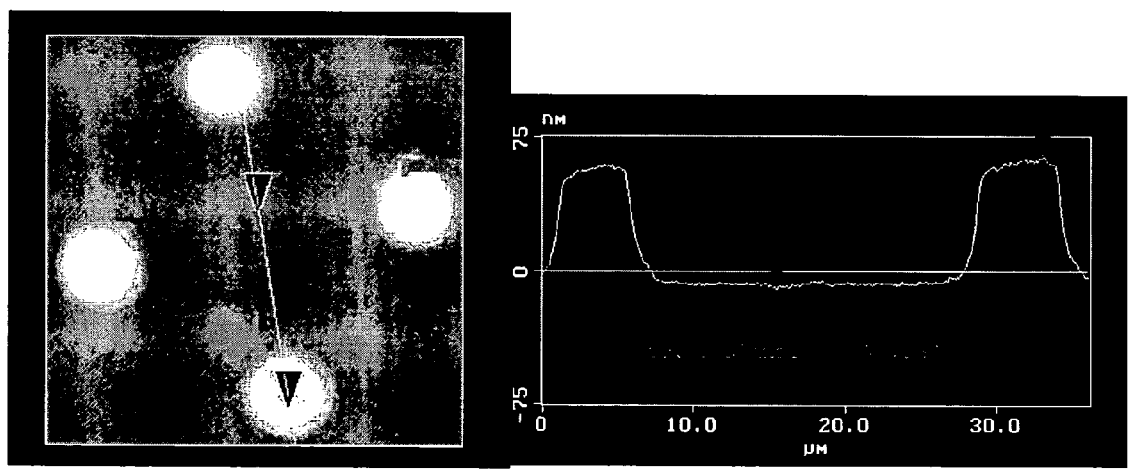

PVP/PS UV-Adhered Arrays:

UV-immobilized poly(vinylpyrrolidone)/polystyrene arrays were prepared as follows. A solution of poly(vinylpyrrolidone) with a molecular weight of 1,300,000 in chloroform (10 mg/mL) was spin-coated onto a clean wafer at 2,000 rpm for 60 seconds. A quartz mask containing circles with diameters approximately 5.5 µm was held in place over the wafer via a vacuum. Photolysis of the thin film (medium pressure Hg lamp, 390 W, Hanovia) was performed for 15 minutes. The unbound polymer was extracted by chloroform for 24-48 hours. The sample was then spin-coated with a solution of polystyrene with a molecular weight of 280,000 in toluene (10 mg/mL) at 2,000 rpm for 60 seconds and irradiated for 15 minutes. The unbound polymer was extracted by toluene for 24-48 hours. FIGS. 19A and 19B show, respectively, the 3-dimensional image and the cross-sectional profile of a portion of the sample. The image and the cross-sectional profile show "towers" of PVP surrounded by PS, the towers being defined by the interface between the two polymeric materials.

Figure 20A:
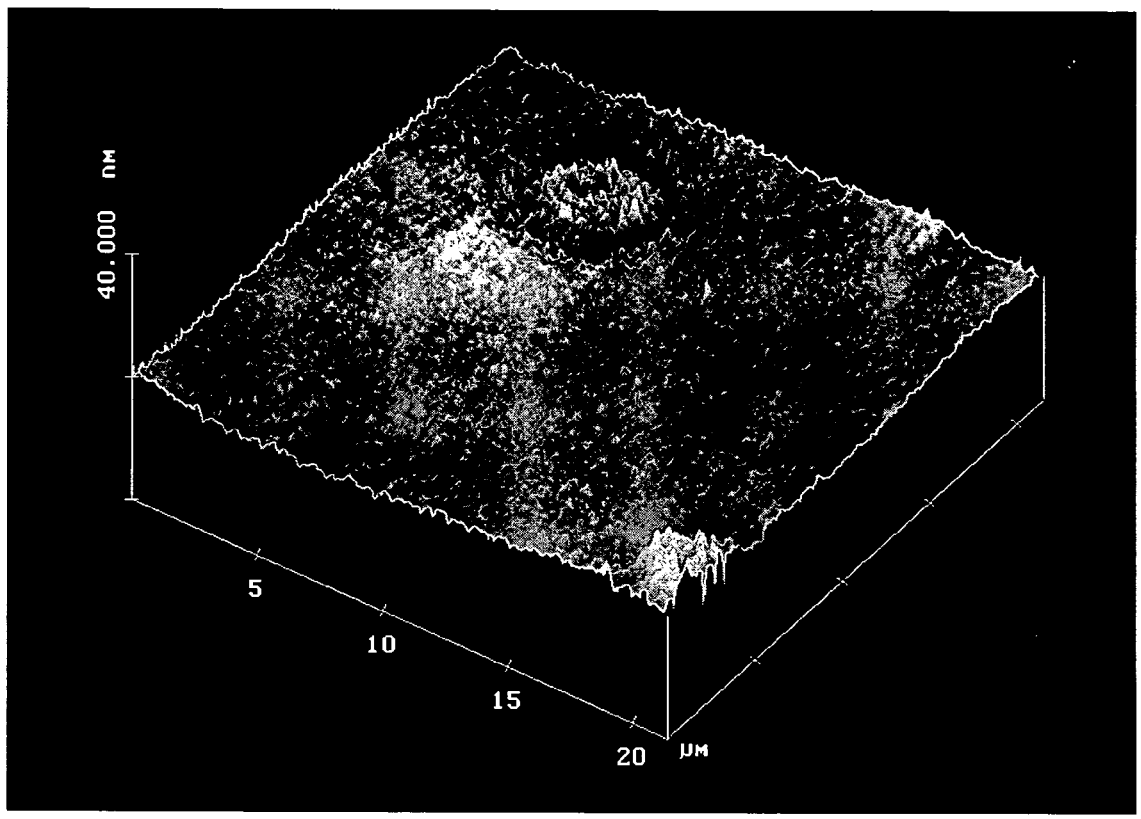
FIGS. 20A and 20B are, respectively, a 3-dimensional AFM image and a cross-sectional profile of a patterned array prepared by UV-immobilization of PS followed by UV-immobilzation of PVP.
Figure 20B:
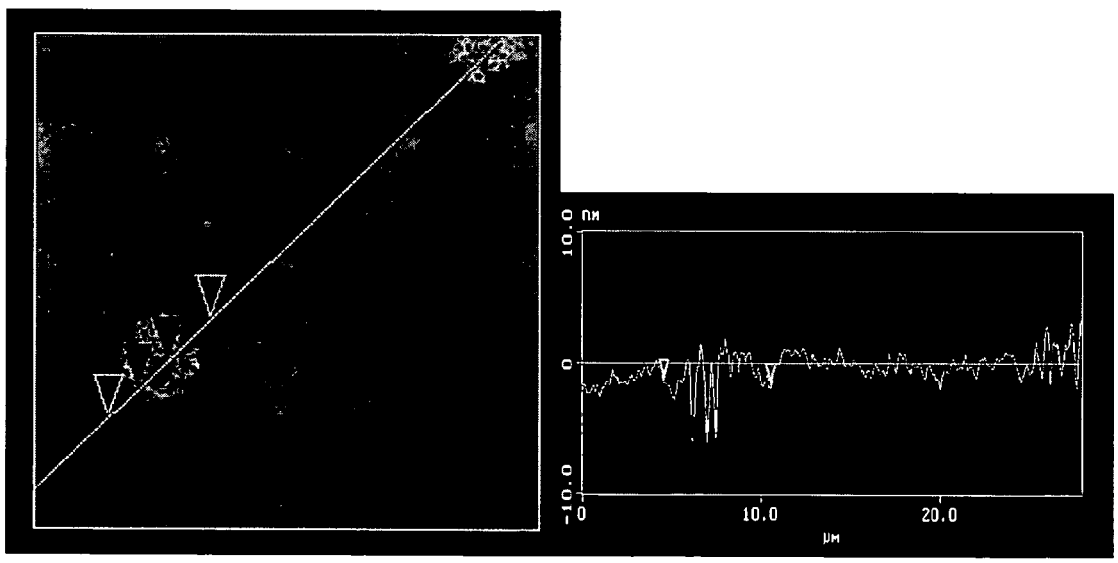

PS/PVP UV-Adhered Array:

To produce wells instead of towers as illustrated above, polystyrene and poly(vinylpyrrolidone) were immobilized in reverse order (The same type of array could be produced with the order used above if a mask that is the reverse of the one described below were used). A solution of polystyrene with a molecular weight of 280,000 in toluene (10 mg/mL) was spin-coated onto a clean wafer at 2,000 rpm for 60 seconds. A quartz mask containing circles with diameters approximately 5.5 µm was held in place over the wafer via a vacuum. Photolysis of the thin film (medium pressure Hg lamp, 390 W, Hanovia) was performed for 10 minutes. The unbound polymer was extracted by toluene for 24-48 hours. The sample was then spin-coated with a solution of poly(vinylpyrrolidone) with a molecular weight of 1,300,000 in chloroform (10 mg/mL) at 2,000 rpm for 60 seconds and irradiated for 10 minutes. The unbound polymer was extracted by chloroform for 24-48 hours. FIGS. 20A and 20B show, respectively, the 3-dimensional AFM image and the cross-sectional profile of a portion of the sample. The image and the cross sectional profile reveal wells having a PS bottom surrounded by PVP, the wells being defined by the interface between the two polymeric materials.

Example 7

Effect of UV-Irradiation on Surface Morphology of PS

Figure 21A:
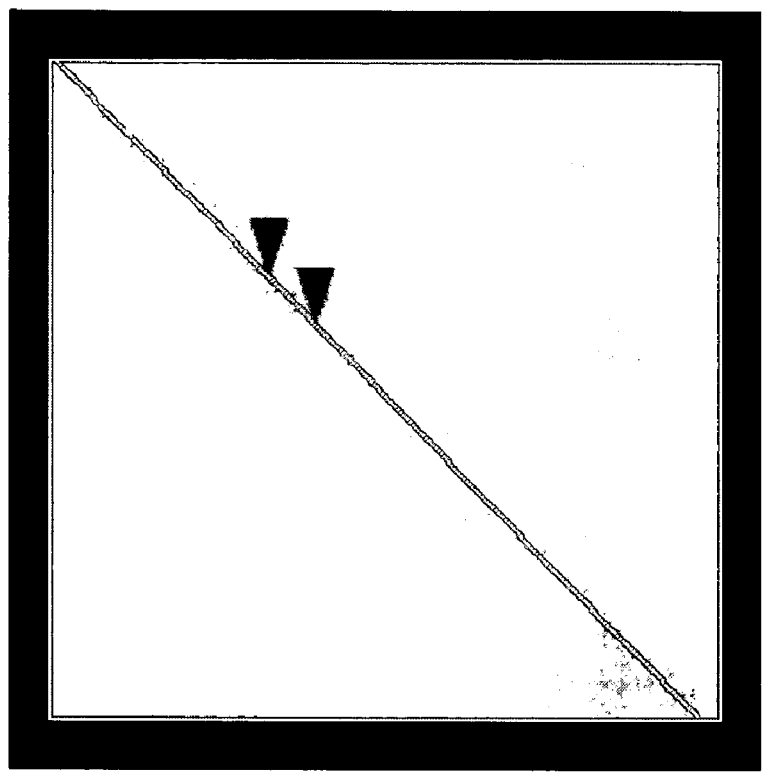
FIGS. 21A and 21B are, respectively, a 3-dimensional AFM image and a cross-sectional profile of a spin-coated PS film before UV illumination.
Figure 21B:
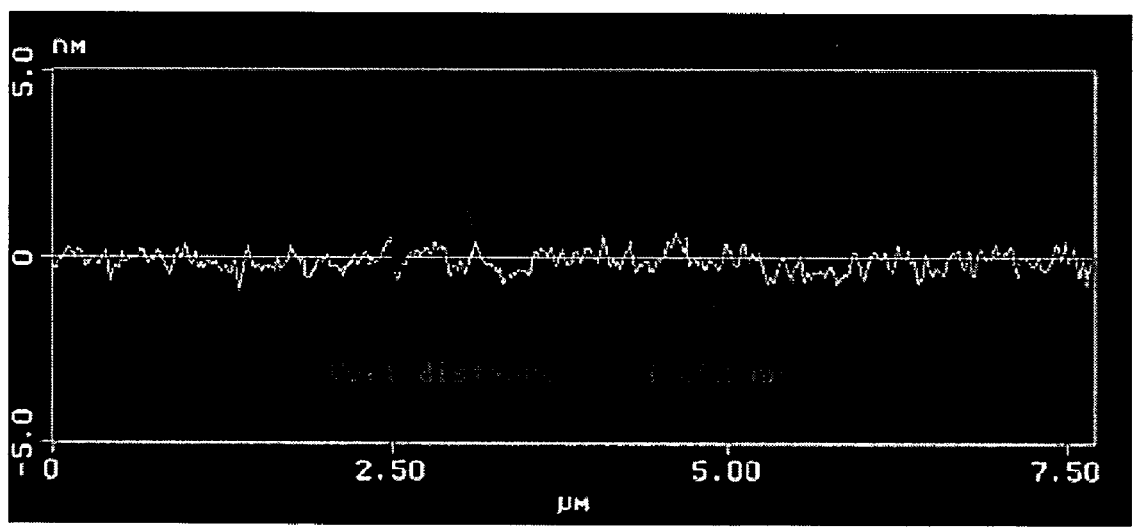
Figure 22A:
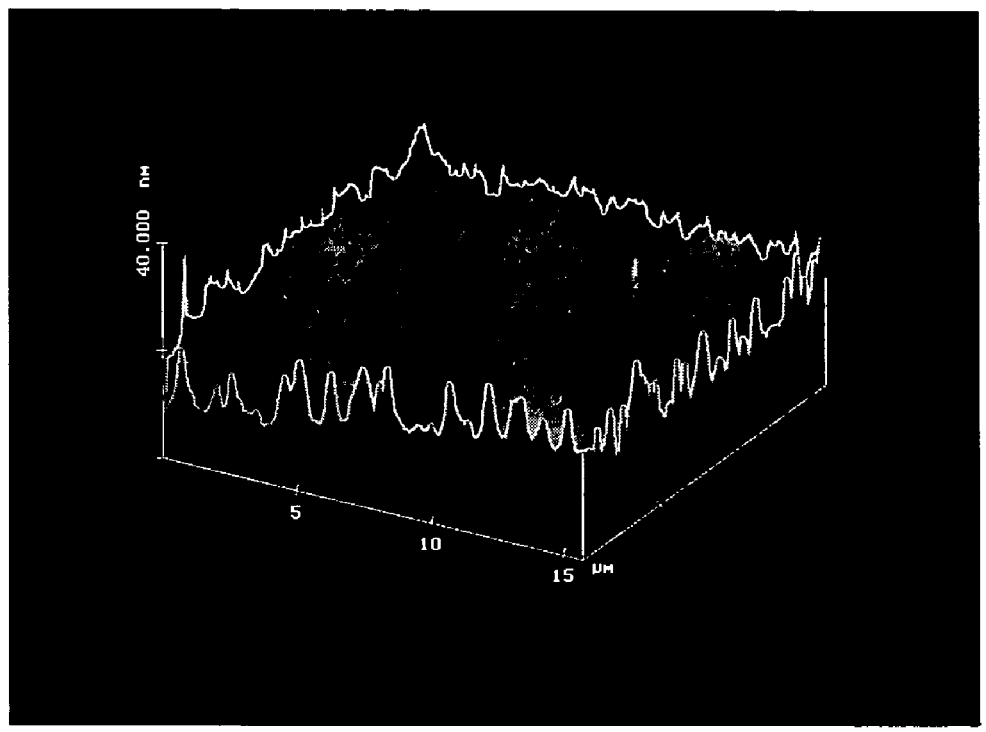
FIGS. 22A and 22B are, respectively, a 3-dimensional AFM image and a cross-sectional profile of a PS film after UV illumination and extraction with toluene.
Figure 22B:
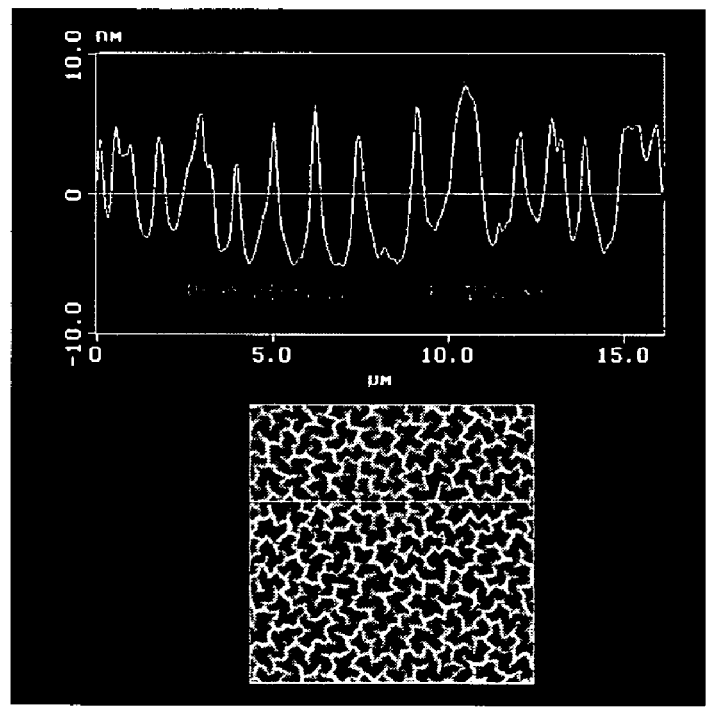

The difference in surface morphology between a thin film of PS before and after irradiation was investigated. Clean wafers were spin-coated with a solution of 280,000 molecular weight polystyrene in toluene (10 mg/mL) at 2,000 rpm for 60 seconds. Photolysis of the thin films (medium pressure Hg lamp, 390 W, Hanovia) was performed for 5 minutes. The unbound polymer was extracted in toluene for 24-48 hours. FIGS. 21A and 21B show, respectively, the 3-dimensional AFM image and cross-sectional profile of the PS thin film prior to UV-irradiation. FIGS. 22A and 22B show, respectively, the 3-dimensional AFM image and cross-sectional profile of the PS thin film following UV irradiation and solvent extraction with toluene. The images and the cross-sectional profile reveal that the thin film following these treatments is somewhat rougher than the spin-coated surface of FIGS. 21A and 21B.

Example 8

Thin Film Immobilization of PS and PEOX by Thermolysis and/or Photolysis

Figure 23A:
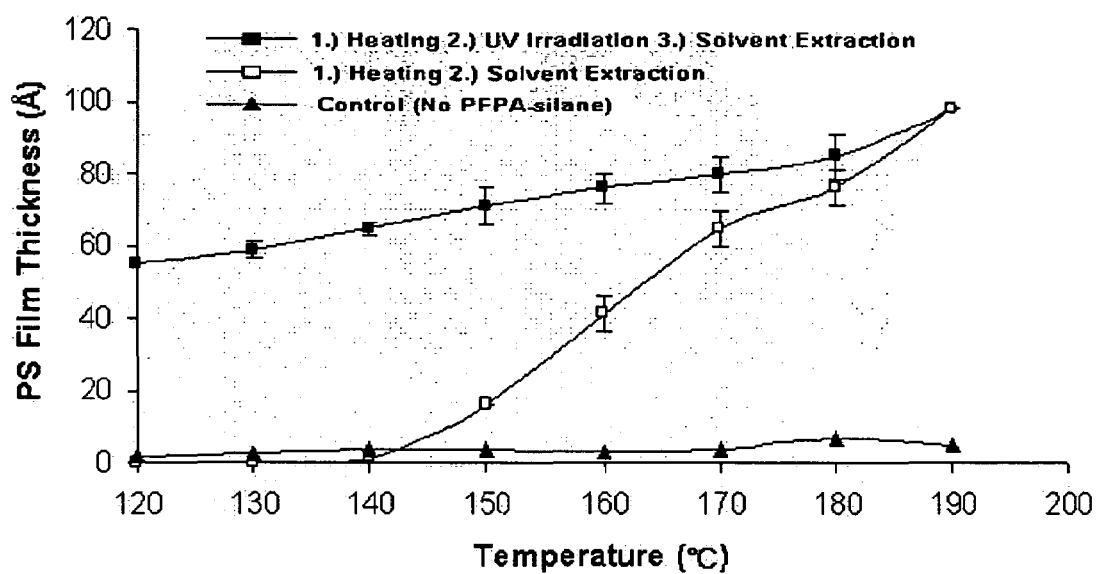
FIGS. 23A and 23B are, respectively, a graph of PS film thickness (Å) versus heating temperature (° C.) for PS films immobilized by thermolysis and a graph of PEOX film thickness (Å) versus heating temperature (° C.) for PEOX films immobilized by thermolysis.
Figure 23B:
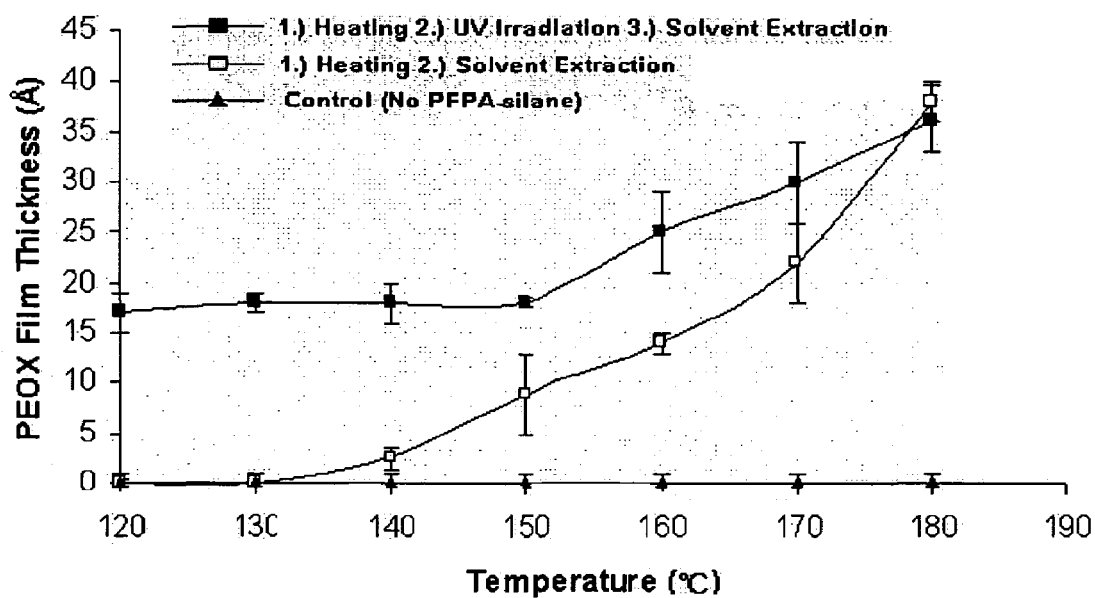

Comprehensive studies were conducted using a hydrophobic polymer (PS, $M_w$ 280,000) and a hydrophilic polymer (PEOX, $M_w$ 200,000). A solution of PS in toluene or PEOX in chloroform was spin coated onto a PFPA-silane treated silicon wafer. The thickness of the polymer film was measured to be about 560 Å for PS and 850 Å for PEOX, assuming the refractive indices are 1.592 and 1.520, respectively. The films were heated for 5 minutes in an oven that had been preheated to temperatures ranging from 120° C. to 190° C. FIGS. 23A and 23B show the thickness of the immobilized films after the unattached polymer was removed by solvent extraction. Under these experimental conditions, film immobilization began at 150° C. for PS (FIG. 23A) and 140° C. for PEOX (FIG. 23B). At below the activation temperature, the azido groups remained un-reacted. This was confirmed by irradiating the thermally-treated samples with a medium pressure Hg lamp for 5 minutes. An increase in film thickness was observed after UV irradiation (solid squares in FIGS. 23A and 23B), which demonstrated that the un-reacted azido groups were activated with UV.

Both PS and PEOX have excellent thermal stabilities as evidenced by the fact that, in one study, their glass transition temperatures remained constant after heat treatment at over 300° C. Keskkula, H.; Paul, D. R. Thermal Behavior of Polyethyloxazoline. *J. Appl. Polym. Sci.* 1986, 31, 941-950. To investigate the possible oxidation of these ultrathin polymer films at elevated temperatures, contact angle measurements were performed. If oxidation occurred, the film surface would become more hydrophilic due to the polar functional groups introduced by oxidation, leading to a lower water contact angle. However, the water contact angles of the heat-treated (91°) and the immobilized PS film after solvent extraction (94°) were comparable to that of the spin-coated PS film (92°), suggesting the absence of oxidation reactions. The immobilization chemistry also was performed in the absence of $O_2$ by heating PS and PEOX films in argon atmosphere. No detectable change in the immobilized film thickness was observed.

To ensure that the film immobilization was indeed due to the thermally-induced reaction of the surface azido groups to the polymer, control experiments were carried out in the absence of PFPA-silane. PS and PEOX films were spin coated directly on piranha-cleaned silicon wafers. After heating the samples at designated temperatures under the same conditions, no film was detected on the wafer surface after solvent extraction (solid triangles in FIGS. 23A and 23B). These results confirmed that the film immobilization was indeed initiated by the azido groups on the wafer surface.

Figure 24A:
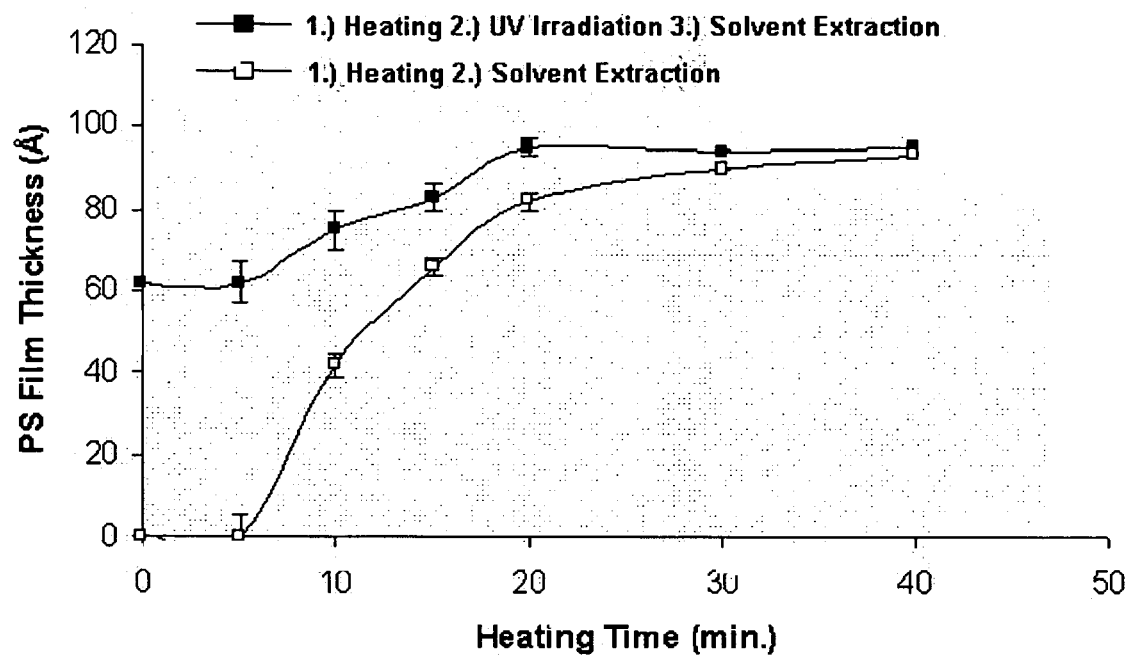
FIGS. 24A and 24B are, respectively, a graph of PS film thickness (Å) versus heating time (min.) for PS films immobilized by thermolysis and a graph of PEOX film thickness (Å) versus heating time (min.) for PEOX films immobilized by thermolysis.
Figure 24B:
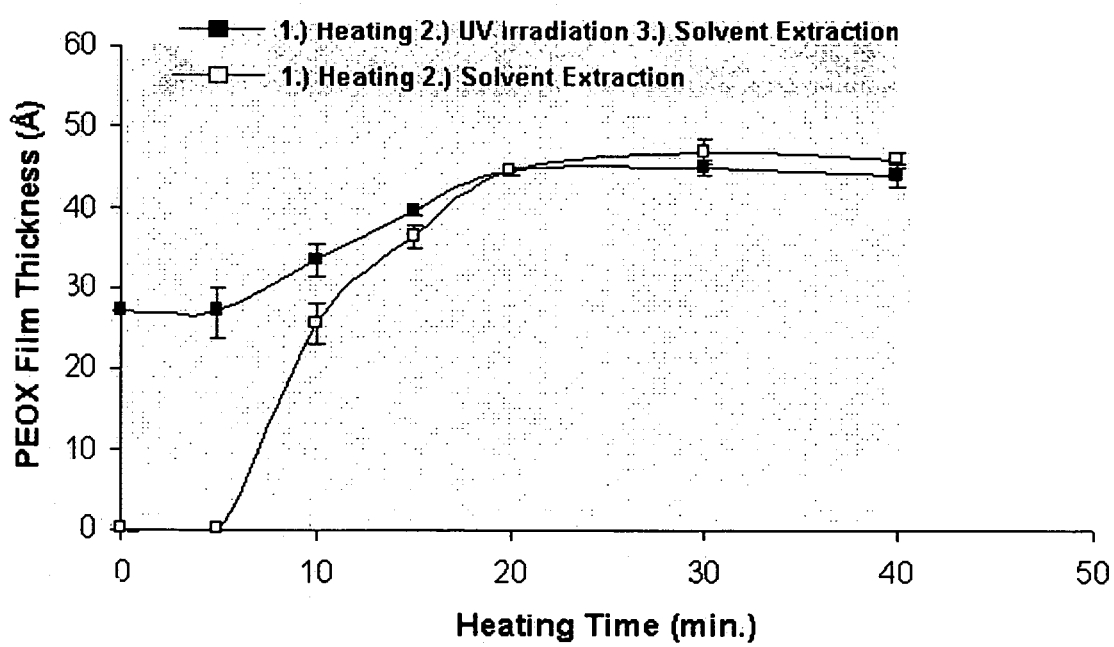
Figure 25A:
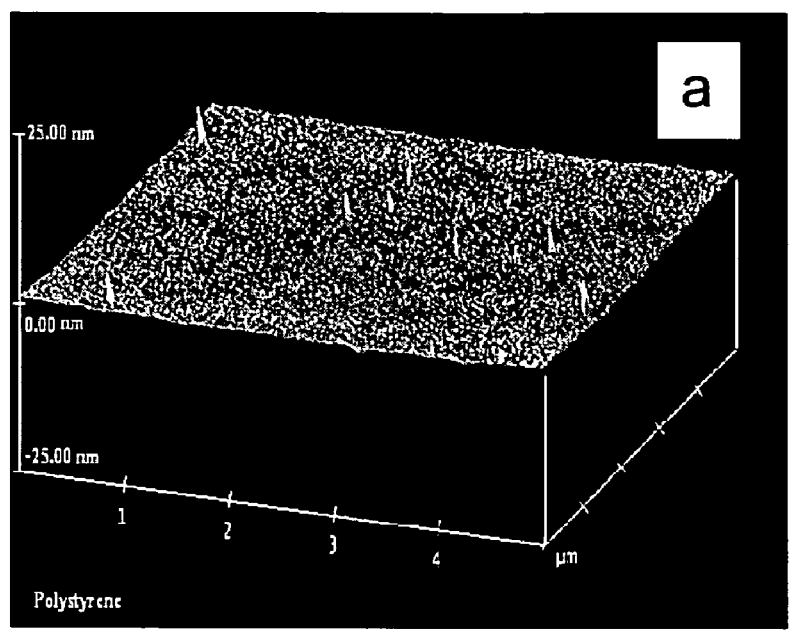
FIGS. 25A and 25B are, respectively, a 3-dimentional AFM image of a PS film immobilized by thermolysis and a 3-dimentional AFM image of a PEOX film immobilized by thermolysis.
Figure 25B:
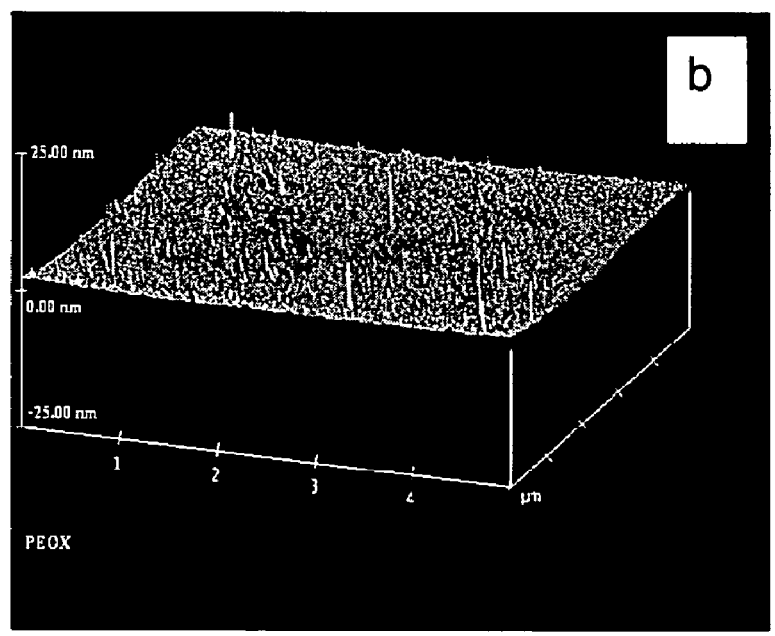

Time-dependent studies of the thermal decomposition of surface azido groups were carried out by heating the spin-coated polymer films at 140° C. for various lengths of time. For these working embodiments, film immobilization was observed at >5 minutes of thermolysis (FIGS. 24A and 24B). The thickness of the immobilized polymer film increased with increased heating time, and reached a constant value after heating for about 30 minutes for PS and 20 minutes for PEOX. This result is consistent with the proposed mechanism that the insertion reactions occur only at the interface where the polymer chains are in contact with the azido groups, and therefore a "monolayer" of polymer is attached to the surface after thermolysis (Scheme 1). The surface of the thermally immobilized thin films was examined by AFM. Smooth surfaces were observed for both PS and PEOX films (FIGS. 25A and 25B). Again, the un-reacted azido groups could be activated by UV irradiation (solid squares in FIGS. 24A and 24B). These samples reached the same maximal film thicknesses as those by heat-treatment alone. These results further supported the immobilization mechanism outlined in Scheme 1.

Using the described materials and conditions, under the thermal activation conditions described above, the immobilized film thickness was ~90 Å for PS and ~45 Å for PEOX. These thicknesses were greater than the thicknesses achieved using UV irradiation. In some circumstances, solid state conditions enhance the yield of C—H/N—H insertion products, apparently by preventing diffusion of nitrenes and limiting the reactions so that they occur only with neighboring molecules. On the other hand, for insertion reactions to occur in the solid state, the azido groups need to be in close proximity to the adjacent molecules. Heat treatment may increase the chain mobility and thereby enhance the contact between the polymer chains and the azido groups on the wafer surface. The increased film thickness under thermal activation conditions is likely due to the increased chain motion when the polymers were heated above their glass transition temperatures ($T_g$, 100° C. and 56° C. for bulk PS and PEOX, respectively, although deviation in $T_g$ was observed for ultrathin films). Upon heating to temperatures greater than their glass transition temperatures, polymers change from a rigid, stiff glassy state where the chains have been effectively frozen, to an amorphous state where the polymer chains are free to rotate and translate, and long-range segmental chain motions are possible.

Figure 26A:
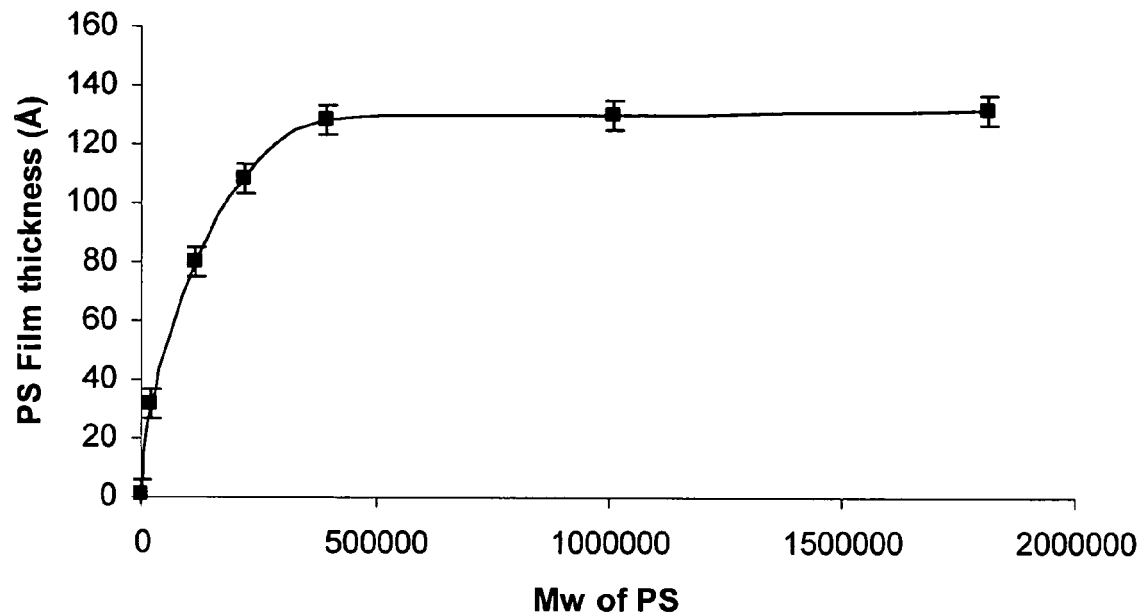
FIGS. 26A and 26B are, respectively, a graph of PS film thickness (Å) versus molecular weight for PS films immobilized by thermolysis and a graph of PEOX film thickness (Å) versus molecular weight for PEOX films immobilized by thermolysis.
Figure 26B:
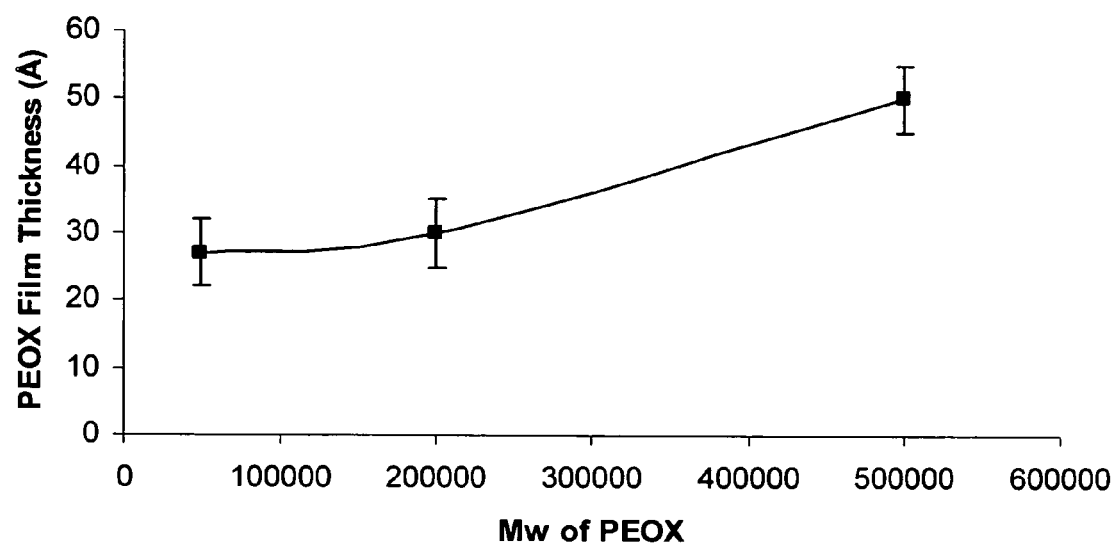
Figure 27:
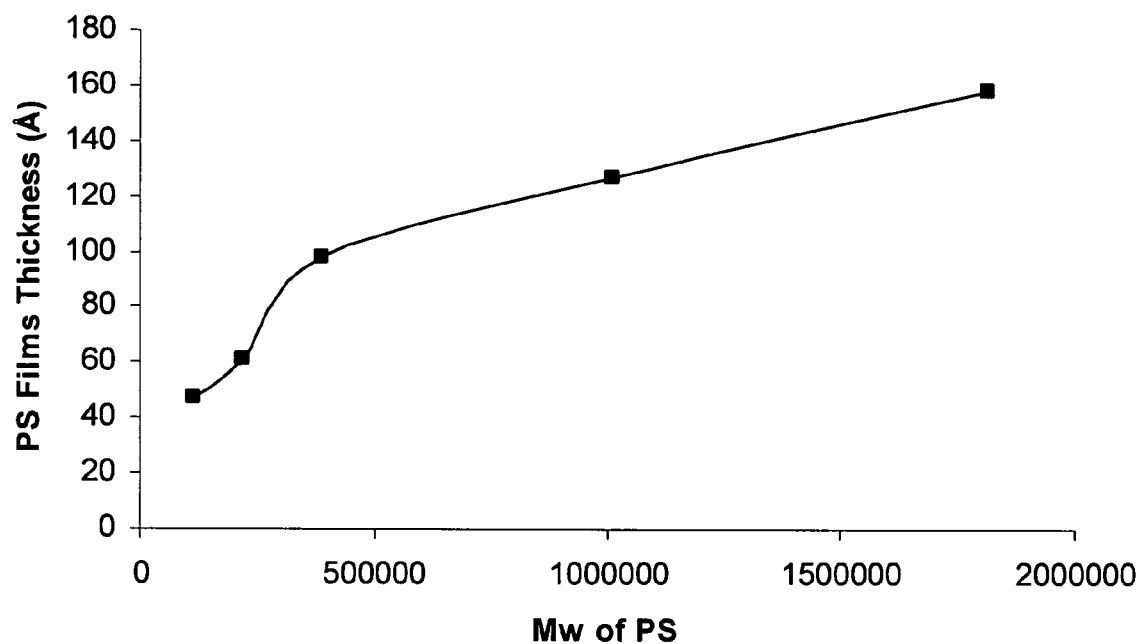
FIG. 27 is a graph of PS film thickness (Å) versus molecular weight for PS films immobilized by UV irradiation.

The effect of molecular weight on the thickness of the immobilized films also was studied. PS and PEOX of various molecular weights were spin coated on PFPA-silane functionalized wafers, heated at ~165° C. for 10 minutes and sonicated in the corresponding extraction solvent for 5 minutes. At a molecular weight below 500,000, the immobilized film thickness increased with the molecular weight of the polymer (FIGS. 26A and 26B). The thickness of the immobilized film appears to be related to the radius of gyration of the polymer coil ($R_g$), which increases with the molecular weight of the polymer. Therefore, the higher the molecular weight of the polymer, the larger the $R_g$ and the thicker the immobilized polymer film. However, unlike the photochemically-initiated immobilization where the film thickness continued to increase with molecular weight (FIG. 27), with thermal activation working embodiments, film thickness plateaus when the molecular weight of PS was greater than 500,000 (FIG. 26A).

As the polymer is heated, its specific volume increases. The rate of this increase accelerates at the onset of the glass transition temperature. A higher specific volume corresponds to a lower polymer density. A reduction in the amount of polymer on the functionalized surface would lead to a decrease in immobilized film thickness, which compensates for the increase in film thickness as a result of increased molecular weight. To further test that the reduction in film thickness was indeed due to the thermal expansion of the polymer, PS of various molecular weights was spin coated on a PFPA-silane treated silicon wafer, heated at 140° C. for 5 minutes and irradiated with UV for 5 minutes. Results obtained were similar to those in FIG. 26A, where the immobilized film thickness plateaus at molecular weights above 500,000.

Figure 28A:
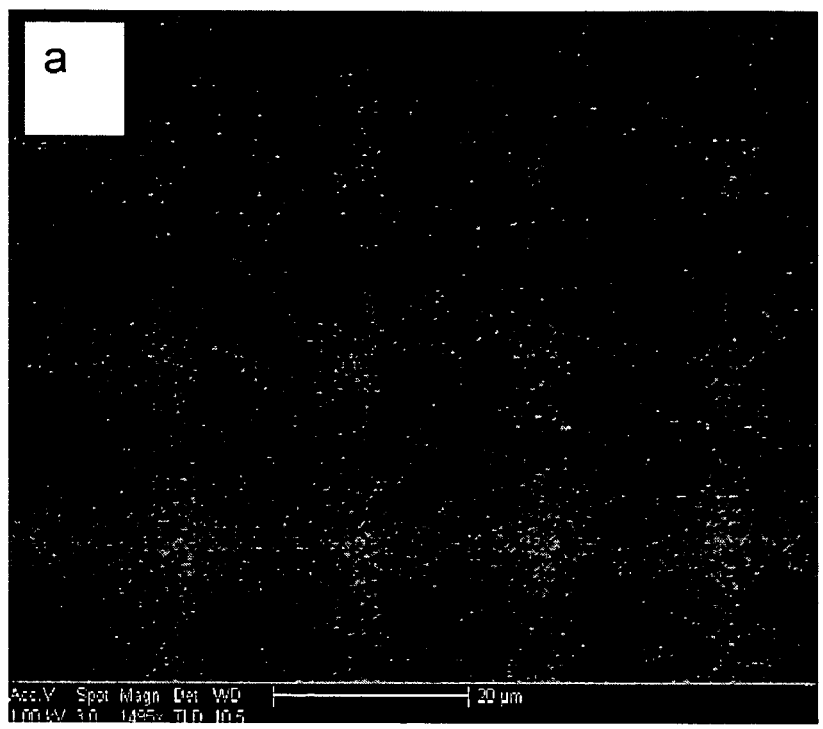
FIGS. 28A and 28B are, respectively, a scanning electron microscope (SEM) image of a patterned PS film and an AFM cross-sectional profile of a patterned PS film.
Figure 28B:
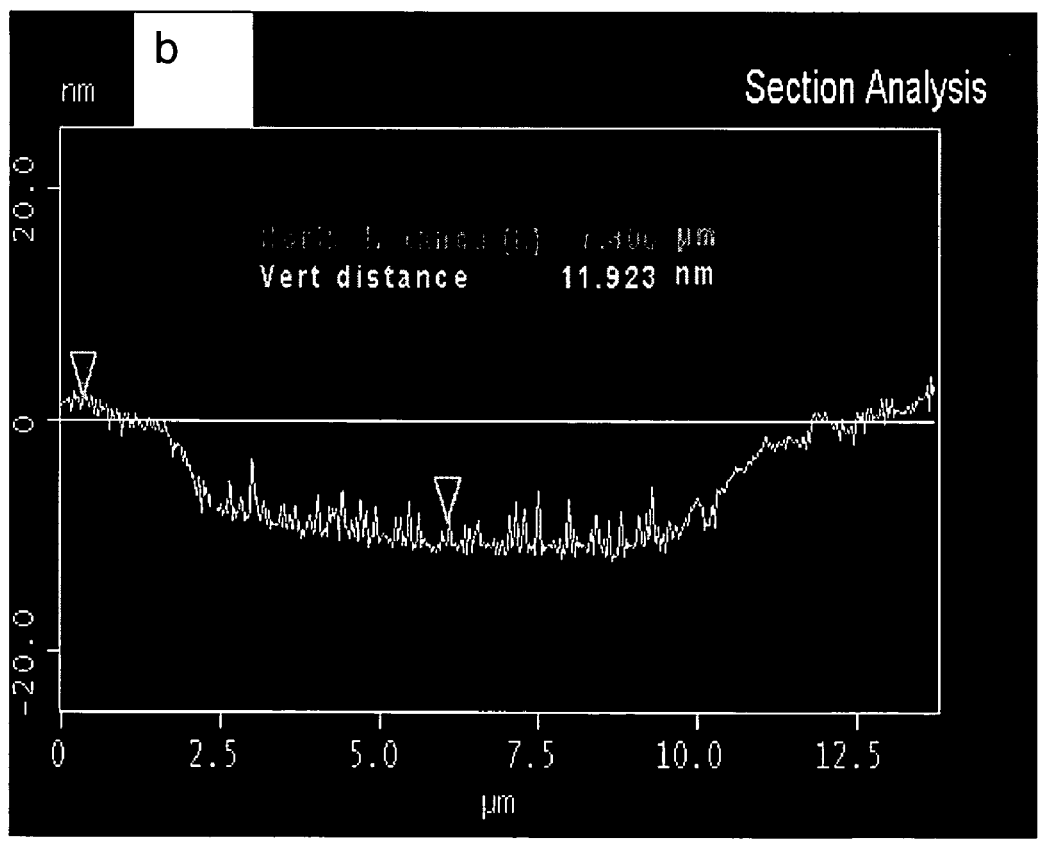

This immobilization chemistry was employed to generate patterned polymer thin films. A silicon wafer functionalized with PFPA-silane was placed in direct contact with a quartz photomask. The sample was then exposed to UV irradiation using a photolithography apparatus. The photomask had an array of 5.5 μm circles that were transparent to UV, and therefore the azido groups in these regions were decomposed by irradiation. After UV exposure, a solution of PS in chloroform was spin coated on the wafer surface and the sample was heated at 150° C. for 10 minutes. The thermolysis initiated polymer film immobilization in the regions where the azido groups were unexposed to UV light. After the un-attached polymer was removed by sonication in chloroform, patterns were observed under SEM (FIG. 28A). An AFM cross-section image revealed that polymer films were indeed immobilized in the un-irradiated regions (FIG. 28B).

In alternative implementations, polymer thin films can be patterned by direct thermal writing, for example using heated AFM tips or near-field optical microscope probes.

Example 9

Thin Film Immobilization of Polypropylene by Thermolysis and/or Photolysis

Polypropylene has many advantageous properties for microstructure applications, including its biocompatibility, non-toxicity, and low cost. Covalent immobilization of polypropylene thin films on a solid substrate is generally difficult to impossible to achieve using conventional immobilization methods, in part, because polypropylene is insoluble, intractable, and chemically inert.

This example describes an approach to the covalent immobilization of polypropylene thin films on silicon wafers. Like the process illustrated in Example 1 and elsewhere in this disclosure, the immobilization chemistry of this example is based on the insertion reactions of perfluorophenyl nitrenes that can be generated from PFPAs either photochemically or thermally. The perfluorophenyl azido groups were introduced to the substrate surface by silanization of wafers with a silane-functionalized PFPA. A polypropylene film was spin coated on the functionalized wafer. This was followed by photolysis and/or thermolysis to covalently affix the polypropylene to the wafer surface. Patterned polypropylene structures were fabricated using a combination of thermal treatment and photolysis.

Figure 29:
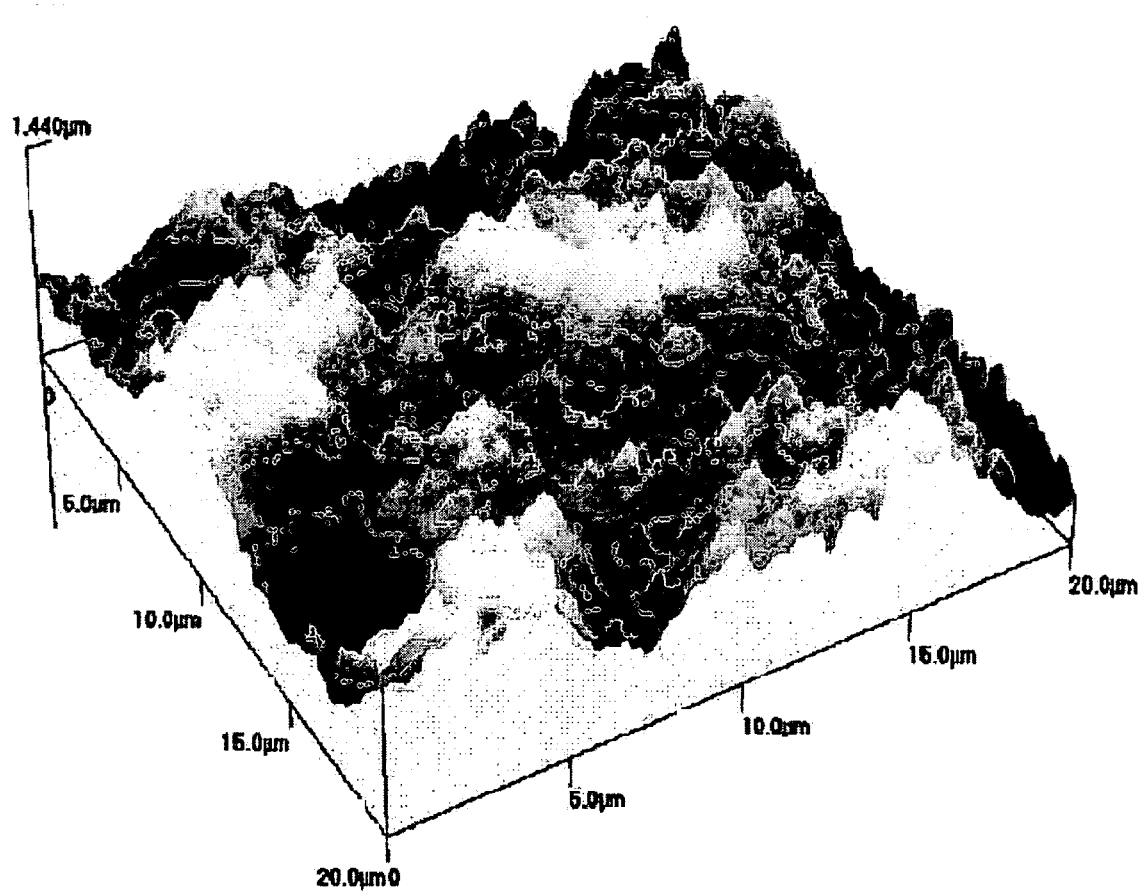
FIG. 29 is an AFM image of the surface of a spin-coated polypropylene film.
Figure 30:
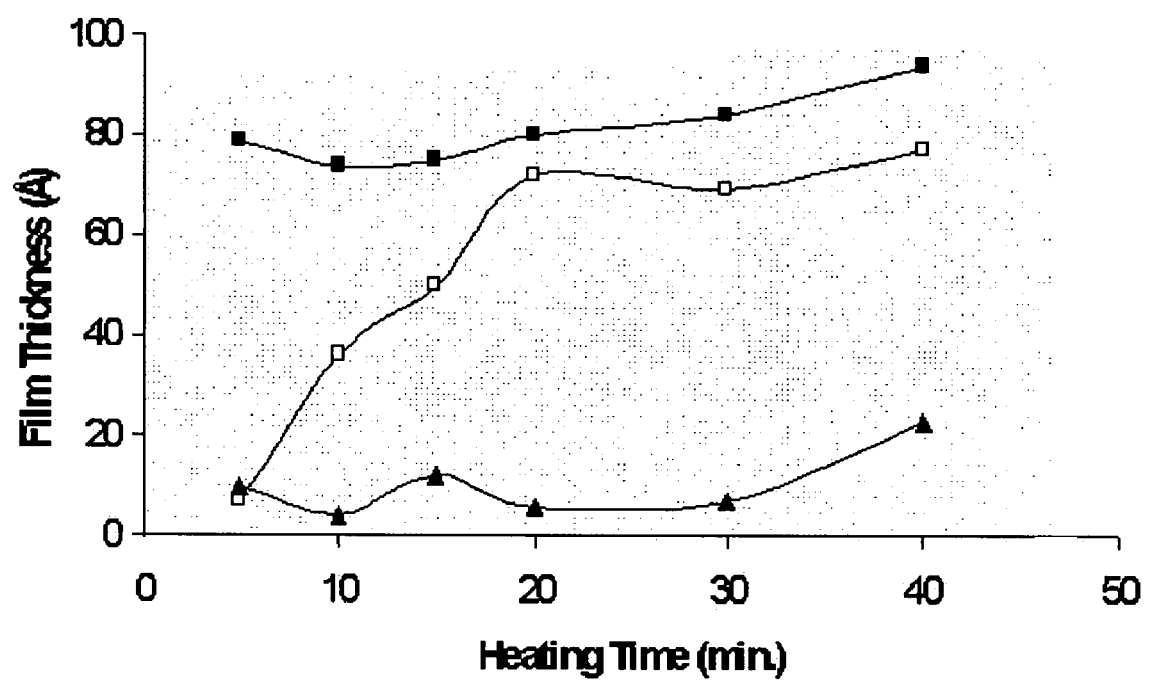
FIG. 30 is a graph of film thickness (Å) versus heating time for polypropylene films adhered to a silicon surface.
Figure 31:
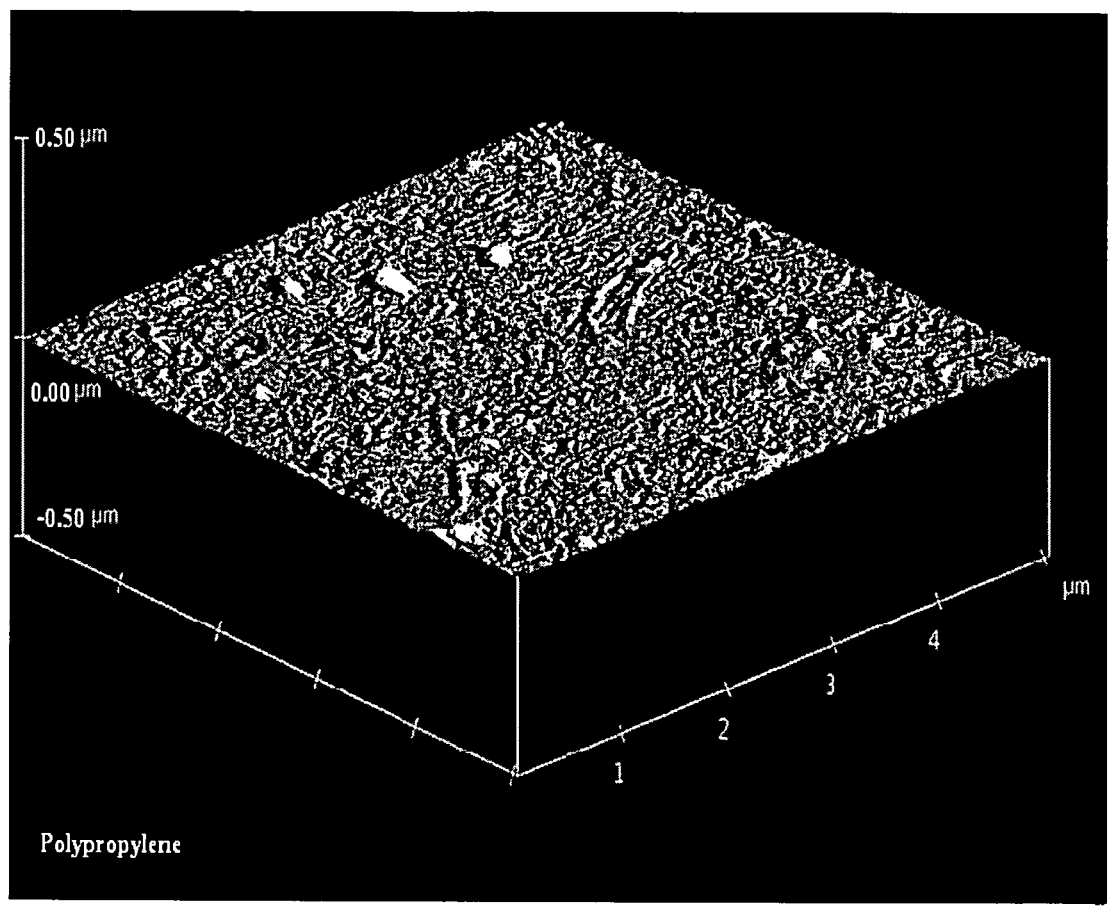
FIG. 31 is an AFM image of a thermally-immobilized polypropylene film.

Polypropylene is insoluble in most solvents at ambient temperature. In order to make uniform films by spin coating, solutions were prepared by refluxing isotactic polypropylene ($M_w$ 580,000, $M_n$ 166,000, Aldrich) in p-xylene for 2 hours. To avoid early phase separation, the chuck on the spin coater was preheated with an infrared lamp to about 85° C. The PFPA-functionalized wafer also was heated briefly with the lamp before the hot polypropylene solution was applied. The sample was then spun immediately at 2,000 rpm for 1 minute. Atomic Force Microscopy showed that the spin-coated polypropylene had a rough surface and a porous morphology (FIG. 29). When the film was irradiated with a medium pressure Hg lamp, no film remained after the sample was extracted in hot p-xylene for 3.5 hours. The immobilization was then carried out by thermal activation. Film immobilization was observed at >5 min heating at 140° C. (open squares in FIG. 30). The thickness of the immobilized films reached a constant value of about 70 Å after heating the sample for 20 minutes. The film showed a smooth surface (FIG. 31) as compared to the spin-coated film (FIG. 29). The water contact angle of the immobilized polypropylene film (99±2°) was similar to that of the spin-coated (104±2°) and heated films (97±2°), indicating that the immobilized film was fairly uniform.

The successful immobilization of polypropylene under thermolysis conditions may be due to the increased chain motion at above its glass transition temperature. For insertion reactions to occur in the solid state, the azido groups need to be in close proximity to the adjacent polymer chains. At elevated temperatures, the change of morphology and the increased chain movement enhanced the contact between the polymer and the substrate. The closer proximity of the polypropylene molecules to the azido groups on the wafer surface may facilitate the insertion reactions.

In a separate trial, spin-coated polypropylene films were heated to 140° C., held at this temperature for a specified time periods, and irradiated immediately with a medium pressure Hg lamp for 5 minutes. Film immobilization was observed after hot p-xylene extraction (solid squares in FIG. 30). If the spin-coated polypropylene film was irradiated without prior heating, no immobilized film was obtained. This result suggests that successful film immobilization can result from enhanced contact between the surface azido groups and polypropylene at above polypropylene's glass transition temperature.

To ensure that the film immobilization was indeed due to the thermally-induced reaction of the surface azido groups and the polymer, control samples were prepared by spin coating polypropylene on cleaned silicon wafers which had not been treated with PFPA-silane. The films were then heated at 140° C. for the specified amount of time and were extracted by refluxing in p-xylene. The minimal residual films observed (solid triangles in FIG. 30) were probably due to the insufficient film removal. At prolonged heating (>40 min), the film became more difficult to remove.

Figure 32:
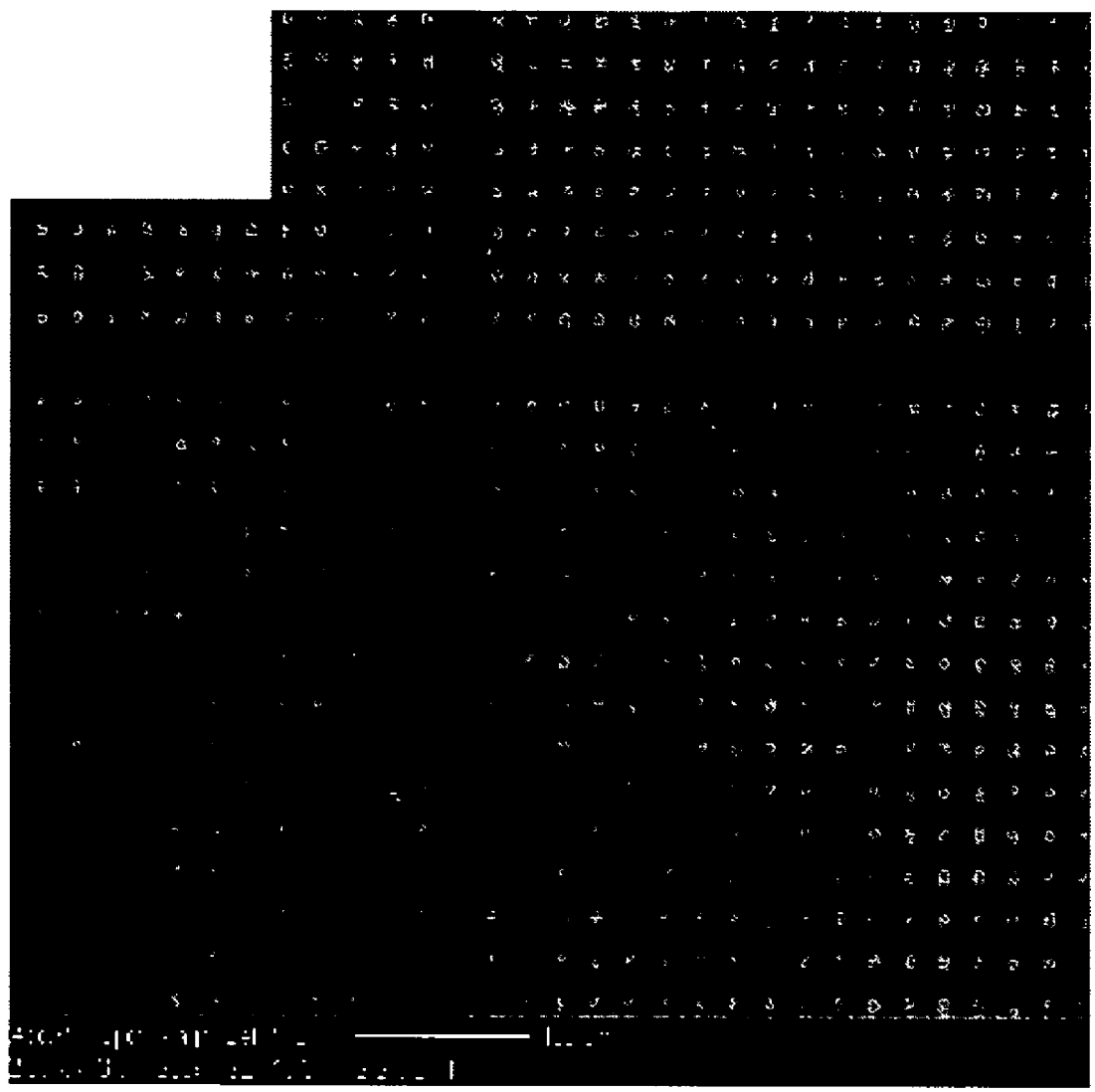
FIG. 32 is a SEM image of a patterned polypropylene film formed by thermal treatment followed by exposure to UV irradiation through a photomask.

In another trial, patterned wafers were produced by using a combination of thermal treatment and UV activation to initiate the immobilization process. To generate the patterns, a polypropylene film was spin-coated on a PFPA-silane-treated wafer and the sample was then heated at 140° C. for 5 minutes. A photomask was then placed on top of the film followed by a 280-nm optical filter. The filter was used to block deep UV light that could cause polypropylene crosslinking. The sample was immediately exposed to UV irradiation using a photolithography apparatus. The quartz photomask had an array of 5.5-mm circles that were transparent to UV light. After the un-attached polymer was removed by hot p-xylene extraction, patterned polypropylene films were observed (FIG. 32).

Figure 33:
FIG. 33 is a SEM image of a patterned polypropylene film formed by irradiating the PFPA-silane treated wafer through a photomask, spin coating polypropylene onto the wafer, and then heating the wafer.

Patterned polypropylene films also were fabricated by first irradiating the PFPA-silane-treated wafer through the photomask, and then spin coating polypropylene and heating the sample at 150° C. for 10 minutes. In this case, the azido groups in the transparent regions of the photomask (circles) were decomposed by UV irradiation, and therefore, no film immobilization occurred in these areas. Indeed, polypropylene films were observed only in regions that the azido groups were un-exposed to UV irradiation (FIG. 33).

Figure 34:
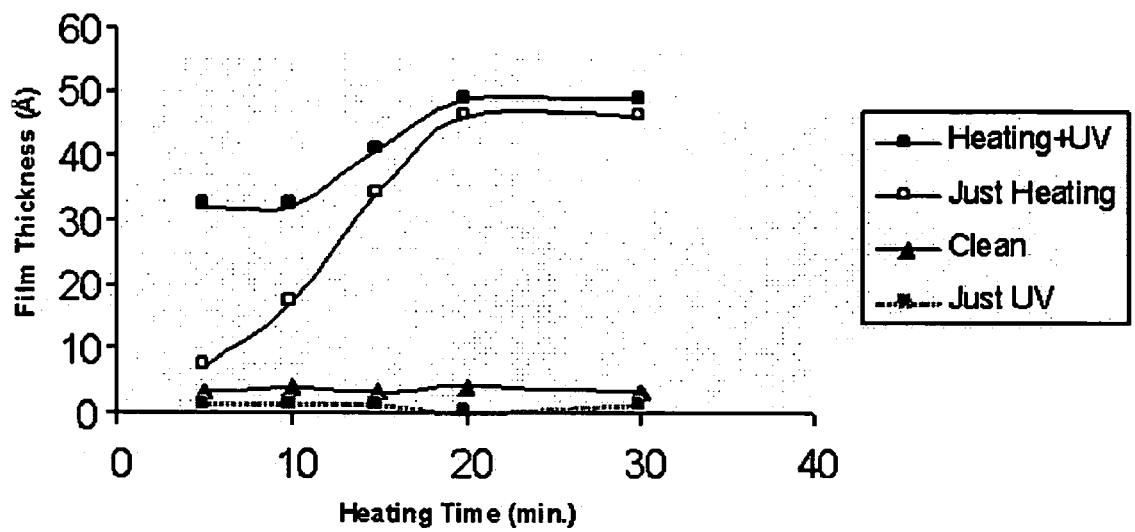
FIG. 34 is a graph of film thickness (Å) versus heating time for polypropylene films ($M_w$=250,000) adhered to a silicon surface.

In a another trial, the relationship between polypropylene thin film adherence and molecular weight was tested. All other trials in this example used polypropylene with $M_w$=580,000. In this trial, polypropylene with $M_w$=250,000 was used. The immobilization procedure was the same as the procedure used in the other trials. The results are provided in FIG. 34.

Figure 35:
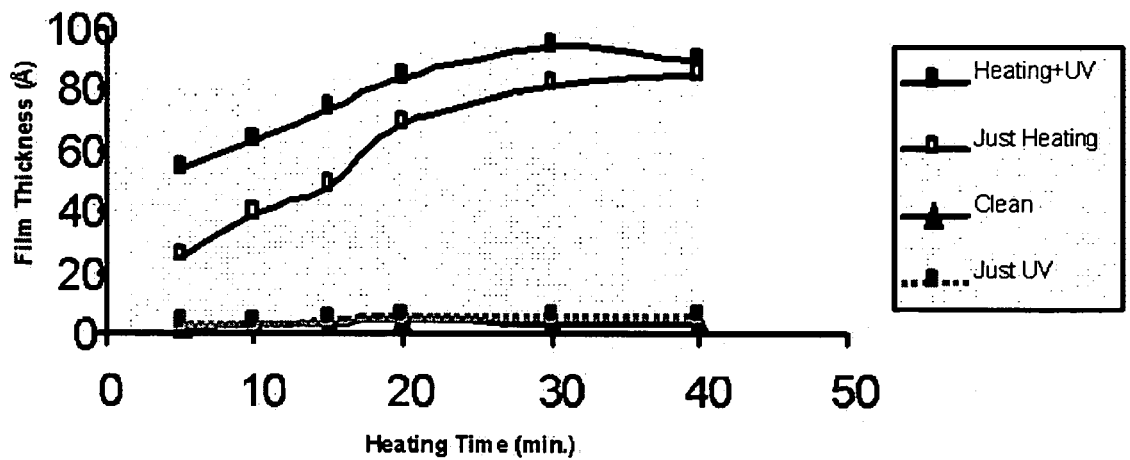
FIG. 35 is a graph of film thickness (Å) versus heating time for poly(ethylene-co-propylene) films adhered to a silicon surface.

In a final trial, the immobilization of a copolymer incorporating an ethylene monomer was studied. The copolymer was poly(ethylene-co-propylene) with $M_w$=170,000. The immobilization procedure was the same as the procedure used in the other trials. The results are provided in FIG. 35.

Example 10

Thin Film Immobilization of PEG by Thermolysis and/or Photolysis

PEG is another polymer with advantageous properties for microstructure applications. PEG is hydrophilic polymer and surfaces coated with PEG are known to resist the adhesion of proteins.

Figure 36:
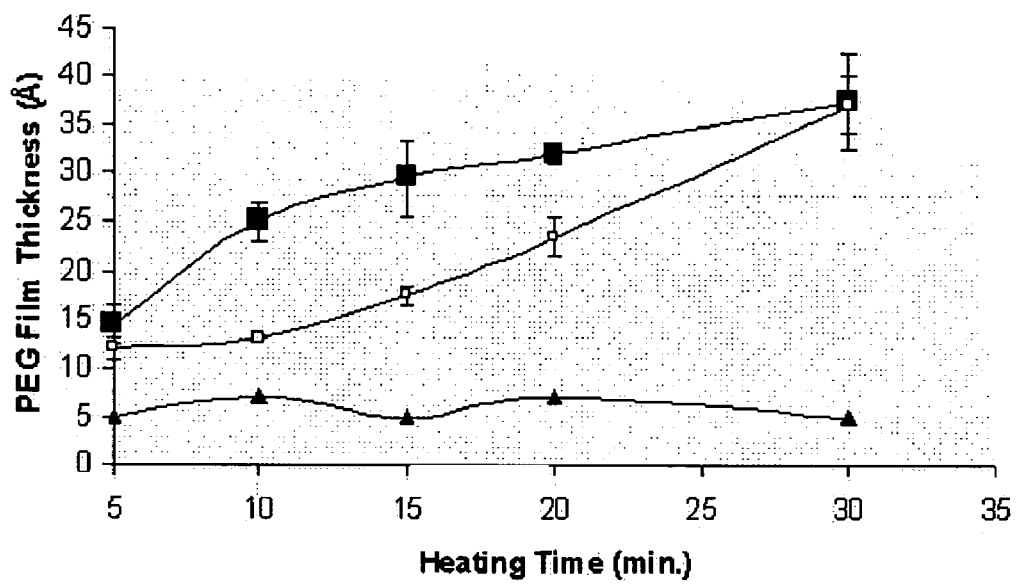
FIG. 36 is a graph of film thickness (Å) versus heating time for PEG films adhered to a silicon surface.

In this experiment, wafers were dipped into melt PEG ($M_w$ 20,000). Some of the wafers were treated with the silane-functionalized PFPA and some were not. The samples were heated at 140° C. for a specified amount of time. Excess polymer was removed by shaking the sample in water for about one minute followed by sonication in water for about five minutes. The results are shown in FIG. 36. The solid squares represent heating at 140° C. for the specified amount of time followed by UV irradiation for 5 minutes. The open squares represent heating at 140° C. for the specified amount of time. The solid triangles represent heating at 140° C. for the specified amount of time, where the substrates were clean wafers that were not treated with PFPA-silane.

Example 11

PS as an Etch Resist

This example describes the use of PS as a resist in the selective etching of the underlying substrate.

Figure 37:
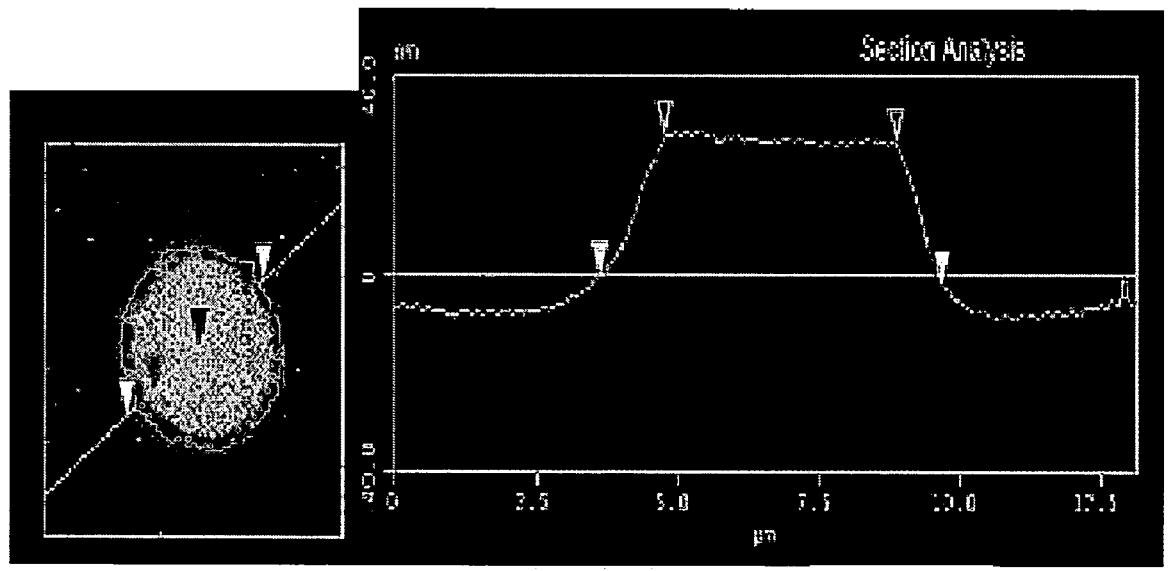
FIG. 37 is a cross-sectional profile of a PS microstructure patterned by photolithography.

A solution of PS in toluene (10 mg/mL) was spin-coated on a silicon wafer at 2000 rpm for 1 minute. The PS film was then irradiated through a photomask using a photolithography apparatus. FIG. 37 shows a cross section of the resulting patterned polymeric structure prior to chemical etching.

Figure 38:
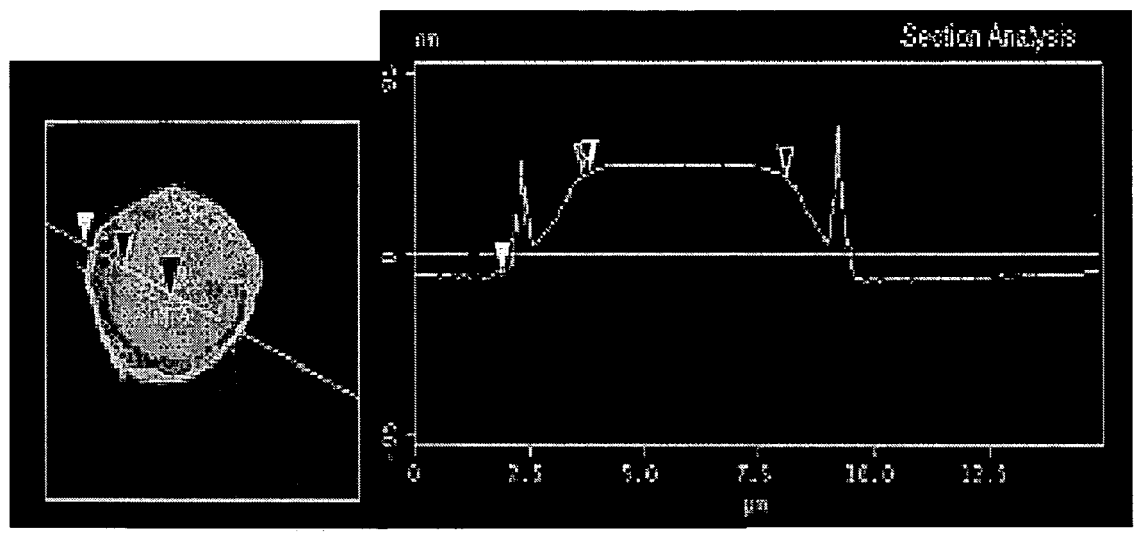
FIG. 38 is a cross-sectional profile of the PS microstructure shown in FIG. 37 after undergoing chemical etching.

To test the ability of the PS film to protect the underlying $SiO_2$/Si layers during chemical etching, the patterned polymeric structure was immersed in an aqueous 6:1 v/v 48%HF/40%$NH_4F$ solution for 30 seconds. The sample was then rinsed with DI water for 5 minutes and air-dried. FIG. 38 shows a cross section of the structure after it underwent chemical etching.

Figure 39:
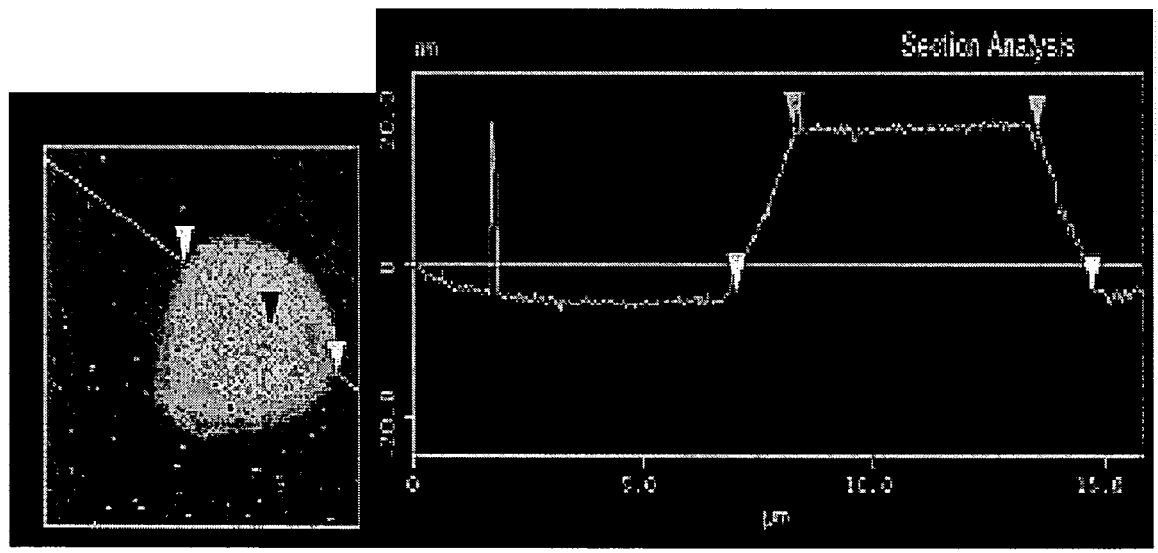
FIG. 39 is a cross-sectional profile of the PS microstructure shown in FIG. 38 after removal of the PS.

The protective PS layer was removed by subjecting the sample to a Piranha solution (7/3 v/v conc. $H_2SO_4$/35wt % $H_2O_2$) for 1 hour followed by rinsing with DI water and air-drying. FIG. 39 shows a cross section of the bare substrate after the PS was removed. The surface of the substrate was smooth, indicating that the PS film protected the $SiO_2$/Si and prevented them from being dissolved or damaged during the etching process.

EXAMPLE 12

Synthesis of PFPA-based Crosslinkers

Two heterobifunctional and cleavable PFPA-based crosslinkers were synthesized, as shown generally by the formula:

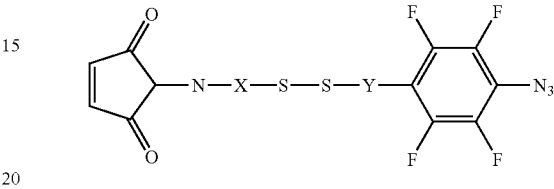

For example, the following compound was synthesized:

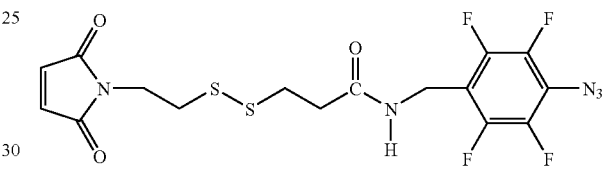

In general, the PFPA portion of the molecule can be used to functionalize a substrate, allowing the maleimide portion to be used for attaching another functional group (via reaction with an SH-containing molecule or a 1,3-diene-containing molecule in a Diels-Alder type reaction). Then, at a later time, the maleimide side can be cleaved from the surface under mild conditions. Another cleavable group can be a 1,2-diol linkage cleavable using periodic acid.

The disclosed embodiments have been described with reference to particular embodiments to exemplify the scope of the invention. It will be apparent to a person of ordinary skill in the art that the invention is not limited to the particular embodiments described, and instead the scope of the disclosed embodiments should be determined with reference to the following claims.

We claim:

1. A method for making a polymeric structure on a substrate, comprising:
   providing a substrate;
   functionalizing at least a portion of the substrate in a one-step process with a silane perfluorophenylazide or a disulfide perfluorophenylazide to provide a silane-perfluorophenylazide or disulfide-perfluorophenylazide functionalized surface substantially devoid of unreacted amino groups;
   applying a first polymeric material to the silane-perfluorophenylazide or disulfide-perfluorophenylazide functionalized surface of the substrate;
   exposing the first polymeric material to a reaction energy source in a pre-determined pattern to covalently bond a layer of the first polymeric material to the substrate in the pre-determined pattern;
   removing unbound first polymeric material from unexposed areas of the substrate surface;

applying a second polymeric material to the surface of the substrate so the second polymeric material occupies at least a portion of the surface of the substrate not occupied by the first polymeric material, wherein the second polymeric material is not formed by a reaction of the first polymeric material; and exposing the second polymeric material to a reaction energy source to covalently bond a layer of the second polymeric material to the substrate, the first and second polymeric materials forming a microstructure defined by the first and second polymeric materials.

2. The method of claim 1, where the first and second polymeric materials form layers having different thicknesses.

3. The method of claim 1, where the first and second polymeric materials comprise the same monomer but have different average molecular weights.

4. The method of claim 1, where the first and second polymeric materials are different.

5. The method of claim 1, where the first and second polymeric materials define a well.

6. The method of claim 5, where the well has a bottom comprising the first polymeric material and a wall comprising the second polymeric material.

7. The method of claim 6, where the first polymeric material comprises a hydrophilic polymeric material and the second polymeric material comprises a hydrophobic polymeric material.

8. The method of claim 6, where the first polymeric material comprises a hydrophobic polymeric material and the second polymeric material comprises a hydrophilic polymeric material.

9. The method of claim 6, where the first polymeric material comprises poly(2-ethyl-2-oxazoline) and the second polymeric material comprises polystyrene.

10. The method of claim 6, where the first polymeric material comprises a polystyrene and the second polymeric material comprises poly(2-ethyl-2-oxazoline).

11. The method of claim 1, where the substrate is a siliceous or gold substrate.

12. The method of claim 1, where the substrate is selected from the group consisting of metals and semiconductors.

13. The method of claim 12, where the metal is gold.

14. The method of claim 1, where exposing comprises illuminating with photons of a wavelength between about 200 nm and about 350 nm.

15. The method of claim 1, where applying comprises spin-coating.

16. The method of claim 1, further comprising heating the first polymeric material after applying the first polymeric material to the surface of a substrate.

17. The method of claim 16, where the first polymeric material is heated to a temperature greater than the first polymeric material's glass transition temperature.

18. The method of claim 1, further comprising heating the second polymeric material after applying the second polymeric material to the surface of the substrate.

19. The method of claim 18, where the second polymeric material is heated to a temperature greater than the second polymeric material's glass transition temperature.

20. The method of claim 1 where the first polymeric material is selected from the groups consisting of saturated polyolefins, unsaturated polyolefins, polystyrene and its analogues, polymers of nucleic acids, polysilanes, and polycarbosilanes.

21. The method of claim 1 where the second polymeric material is selected from the groups consisting of saturated polyolefins, unsaturated polyolefins, polystyrene and its analogues, polymers of nucleic acids, polysilanes, and polycarbosilanes.

22. A method for adhering polymeric material to a functionalized substrate, comprising:

exposing at least a portion of a functionalized substrate to a first reaction energy source such that some or all of the functional groups on the portion of the functionalized substrate are deactivated;

applying a polymeric material to the functionalized substrate; and exposing the polymeric material to a second reaction energy source.

23. The method of claim 22, where all of the functional groups on the portion of the substrate exposed to the first reaction energy source are deactivated.

24. The method of claim 22, where the reaction energy source comprises electromagnetic irradiation.

25. The method of claim 22, where the polymeric material comprises polypropylene or a copolymer incorporating an ethylene monomer.

26. The method of claim 22, where the first reaction energy source is applied in a pre-determined pattern.

27. The method of claim 22, where the substrate is functionalized using a perfluorophenylazide disulfide.

28. A polymeric structure, comprising:

a first polymeric material defining a well-bottom covalently attached to regions of an azide-functionalized substrate; and a second polymeric material defining a well wall covalently attached to regions of the azide-functionalized substrate not occupied by the first polymeric material, wherein the second polymeric material is not a reaction product of the first polymeric material, the first and second polymeric materials collectively defining a microwell.

29. The polymeric structure of claim 28, comprising an array of microwells.

30. The microwell of claim 28, where the first and second polymeric materials are the same polymeric material.

31. The microwell of claim 28, where the first and second polymeric materials are different polymeric materials.

32. The polymeric structure according to claim 28 where at least two polymeric materials define layers having different thicknesses.

33. The microstructure of claim 32, where the thickness of the at least two polymeric materials is determined by the molecular weight of the polymeric materials.

34. The microstructure of claim 32, where the at least two polymeric materials define one or more wells.

35. The microstructure of claim 34, where the well bottom comprises a polymer known to adsorb proteins and the well sides and top comprise a polymer known to resist proteins.

36. The microstructure of claim 34, where the at least two polymeric materials define one or more wells having a hydrophobic bottom and hydrophilic sides.

37. The microstructure of claim 34, where the at least two polymeric materials define one or more wells having a hydrophilic bottom and hydrophobic sides.

38. The microstructure of claim 37, further comprising a reagent molecule adhered, covalently or non-covalently, to the bottom of the well.

39. The microstructure of claim 38, where the reagent molecule is a DNA, RNA, protein, or drug molecule.

40. The microstructure of claim 32, where the substrate is either silicon or gold.

41. The polymeric structure according to claim 28 defining a chromatographic support.

42. The polymeric structure according to claim 41 where the chromatographic support comprises at least two polymeric materials covalently bonded in geometric patterns to the substrate through a functionalized azide, the polymeric materials forming layers having different thicknesses.

43. A method for making a polymeric structure on a substrate, comprising:
providing a substrate;
performing a one-step functionalization process consisting essentially of functionalizing at least a portion of the substrate with a silane perfluorophenylazide or a disulfide perfluorophenylazide to provide a silane-perfluorophenylazide or disulfide-perfluorophenylazide functionalized surface;
applying a first polymeric material to the silane-perfluorophenylazide or disulfide-perfluorophenylazide functionalized surface of the substrate;
exposing the first polymeric material to a reaction energy source in a pre-determined pattern to covalently bond a layer of the first polymeric material to the substrate in the pre-determined pattern;
removing unbound first polymeric material from unexposed areas of the substrate surface;
applying a second polymeric material to the surface of the substrate so the second polymeric material occupies at least a portion of the surface of the substrate not occupied by the first polymeric material, wherein the second polymeric material is not formed by a reaction of the first polymeric material; and
exposing the second polymeric material to a reaction energy source to covalently bond a layer of the second polymeric material to the substrate, the first and second polymeric materials forming a microstructure defined by the first and second polymeric materials.

44. A method for making a polymeric structure on a substrate, comprising:
providing a silicon wafer;
functionalizing the silicon wafer by applying a solution of silane perfluorophenylazide or disulfide perfluorophenylazide to the silicon wafer for a time period effective to provide a silane-perfluorophenylazide or disulfide-perfluorophenylazide functionalized surface, wherein the functionalized surface has unreacted azido groups;
rinsing the functionalized silicon wafer with a solvent to remove unbound silane perfluorophenylazide or disulfide perfluorophenylazide;
drying the functionalized silicon wafer;
applying a first polymeric material to the silane-perfluorophenylazide or disulfide-perfluorophenylazide functionalized surface of the silicon wafer;
exposing the first polymeric material to a reaction energy source in a pre-determined pattern through a photomask to covalently bond a layer of the first polymeric material to the unreacted azido groups on the substrate in the pre-determined pattern, where the reaction energy source comprises ultraviolet light, an electron beam, or heat;
removing unbound first polymeric material from unexposed areas of the substrate surface using a solvent, wherein the unbound first polymeric material is soluble in the solvent;
applying a second polymeric material to the surface of the substrate so the second polymeric material occupies at least a portion of the surface of the substrate not occupied by the first polymeric material; and
exposing the second polymeric material to a reaction energy source to covalently bond a layer of the second polymeric material to the unreacted azido groups on the portion of the surface of the substrate not occupied by the first polymeric material, where the reaction energy source comprises ultraviolet light, an electron beam, or heat, the first and second polymeric materials forming a microstructure defined by the first and second polymeric materials.

45. The method of claim 44 where the functionalized surface is substantially devoid of unreacted amino groups.

46. The method of claim 44 where the second polymeric material is not formed by a reaction of the first polymeric material.

47. A method for making a polymeric structure on a substrate, comprising:
providing a silicon wafer;
functionalizing the silicon wafer by applying a solution of silane perfluorophenylazide or disulfide perfluorophenylazide to the silicon wafer for a time period effective to provide a silane-perfluorophenylazide or disulfide-perfluorophenylazide functionalized surface, wherein the functionalized surface has unreacted azido groups and wherein the functionalized surface is substantially devoid of unreacted amino groups;
rinsing the functionalized silicon wafer with a solvent to remove unbound silane perfluorophenylazide or disulfide perfluorophenylazide;
drying the functionalized silicon wafer;
applying a first polymeric material to the silane-perfluorophenylazide or disulfide-perfluorophenylazide functionalized surface of the silicon wafer, where the first polymeric material is selected from saturated polyolefins, unsaturated polyolefins, polystyrene and its analogues, polymers of nucleic acids, polysilanes, and polycarbosilanes;
exposing the first polymeric material to a reaction energy source in a pre-determined pattern through a photomask to covalently bond a layer of the first polymeric material to the unreacted azido groups on the substrate in the pre-determined pattern, where the reaction energy source comprises ultraviolet light, an electron beam, or heat;
removing unbound first polymeric material from unexposed areas of the substrate surface using a solvent, wherein the unbound first polymeric material is soluble in the solvent;
applying a second polymeric material to the surface of the substrate so the second polymeric material occupies at least a portion of the surface of the substrate not occupied by the first polymeric material, where the second polymeric material is selected from saturated polyolefins, unsaturated polyolefins, polystyrene and its analogues, polymers of nucleic acids, polysilanes, and polycarbosilanes; and
exposing the second polymeric material to a reaction energy source to covalently bond a layer of the second polymeric material to the unreacted azido groups on the portion of the surface of the substrate not occupied by the first polymeric material, where the reaction energy source comprises ultraviolet light, an electron beam, or heat, the first and second polymeric materials forming a microstructure defined by the first and second polymeric materials.

48. A method for making a polymeric structure on a substrate, comprising:

providing a substrate;

functionalizing at least a portion of the substrate in a one-step process with a silane perfluorophenylazide or a disulfide perfluorophenylazide to provide a silane-perfluorophenylazide or disulfide-perfluorophenylazide functionalized surface substantially devoid of unreacted amino groups;

applying a first polymeric material to the silane-perfluorophenylazide or disulfide-perfluorophenylazide functionalized surface of the substrate;

exposing the first polymeric material to a reaction energy source in a pre-determined pattern to covalently bond a layer of the first polymeric material to the substrate in the pre-determined pattern;

removing unbound first polymeric material from unexposed areas of the substrate surface;

applying a second polymeric material to the surface of the substrate so the second polymeric material occupies at least a portion of the surface of the substrate not occupied by the first polymeric material, wherein the second polymeric material is not formed by a reaction of the first polymeric material; and exposing the second polymeric material to a reaction energy source to covalently bond a layer of the second polymeric material to the substrate, the first and second polymeric materials forming a microstructure defined by the first and second polymeric materials, wherein the first and/or the second polymeric material is a carbohydrate.

* * * * *